United States Patent
Tamura et al.

[11] Patent Number: 6,166,971
[45] Date of Patent: Dec. 26, 2000

[54] METHOD OF AND APPARATUS FOR CORRECTLY TRANSMITTING SIGNALS AT HIGH SPEED WITHOUT WAVEFORM DISTORTION

[75] Inventors: Hirotaka Tamura; Hideki Takauchi; Tsz-shing Cheung; Kohtaroh Gotoh, all of Kawasaki, Japan

[73] Assignee: Fujitsu Limited, Kawasaki, Japan

[21] Appl. No.: 09/323,203

[22] Filed: Jun. 1, 1999

[30] Foreign Application Priority Data

| Jun. 2, 1998 | [JP] | Japan | 10-152897 |
| Dec. 25, 1998 | [JP] | Japan | 10-369742 |
| Dec. 25, 1998 | [JP] | Japan | 10-369789 |
| Dec. 25, 1998 | [JP] | Japan | 10-370670 |

[51] Int. Cl.$^7$ .................................................. G11C 7/00
[52] U.S. Cl. ............................................ 365/198; 365/191
[58] Field of Search ........................ 365/230.06, 189.11, 365/198, 194, 196, 207, 191

[56] References Cited

U.S. PATENT DOCUMENTS

| 4,431,969 | 2/1984 | Summers et al. |
| 5,157,276 | 10/1992 | Metz. |
| 5,485,490 | 1/1996 | Leung et al. |
| 5,554,945 | 9/1996 | Lee et al. |
| 5,801,352 | 9/1998 | Taneda et al. ..................... 219/69.18 |
| 5,910,751 | 6/1999 | Winn et al. ........................... 327/560 |

*Primary Examiner*—David Nelms
*Assistant Examiner*—Thong Le
*Attorney, Agent, or Firm*—Arent Fox Kintner Plotkin & Kahn, PLLC

[57] ABSTRACT

A driver circuit transmits a signal to a receiver circuit through a signal transmission line. The driver circuit has an output driver, a front driver, and a level adjuster. The front driver drives the output driver, and the level adjuster adjusts the output level of the front driver. The output driver generates a signal whose level is variable in response to an output level of the front driver.

24 Claims, 77 Drawing Sheets

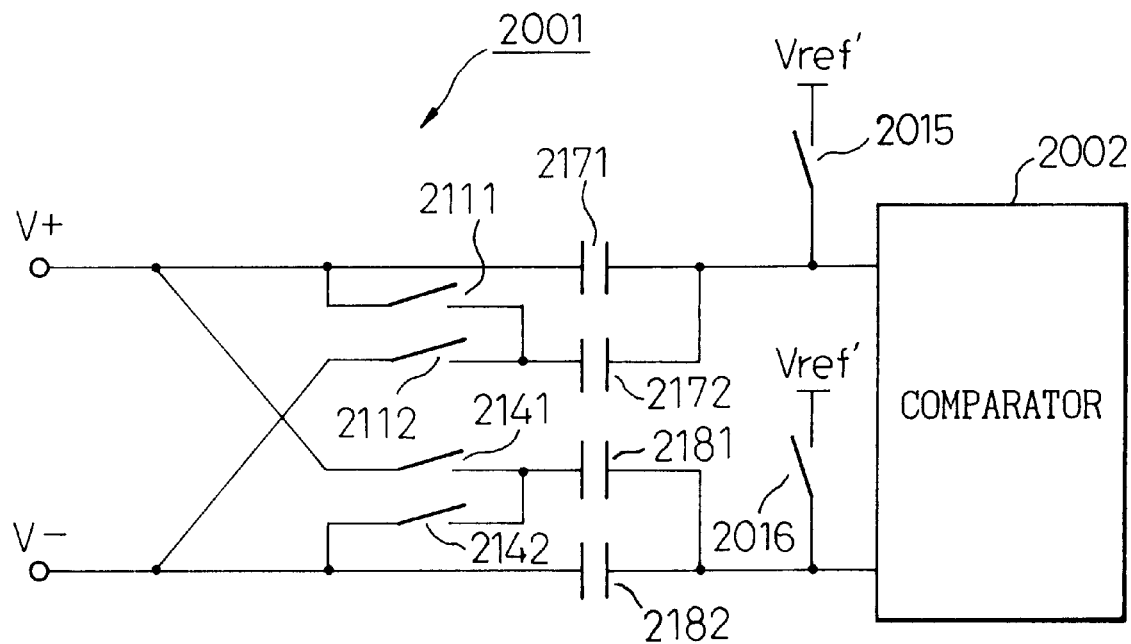

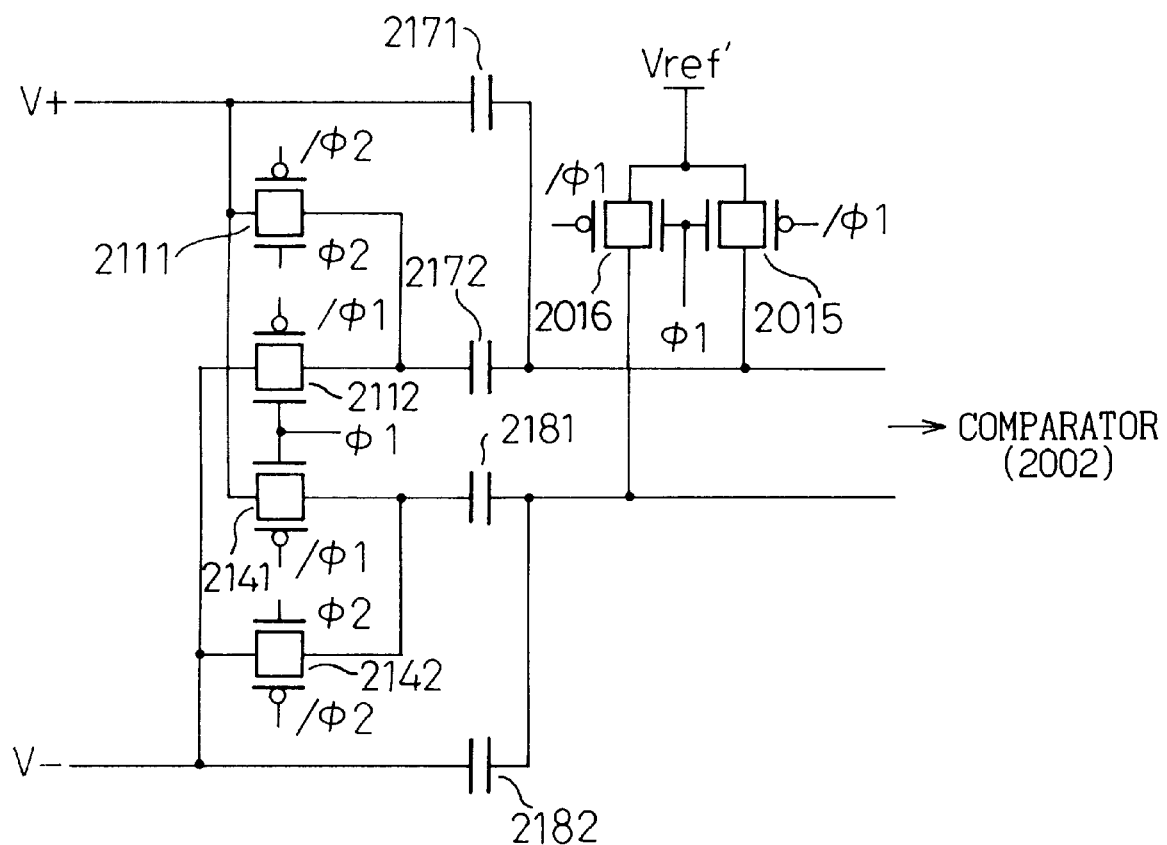

Fig.35 { CLK, φ1, φ2 }

INTER-CODE INTERFERENCE ESTIMATION

SIGNAL DETERMINATION

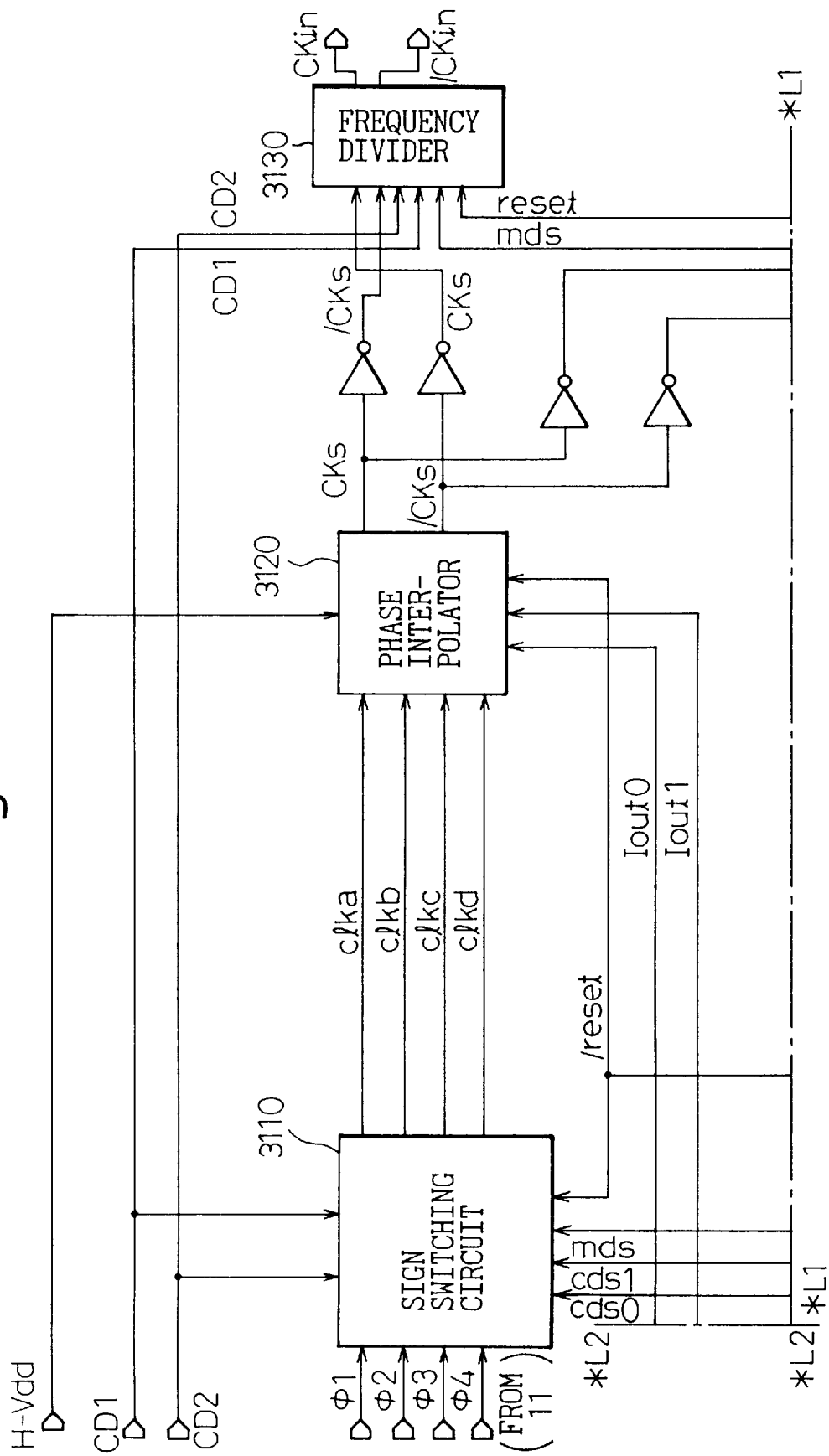

$$S(t) = \Sigma c_i u(t - iT)$$

[CK']  LP1  LP2

[CK]  DP1  DP2

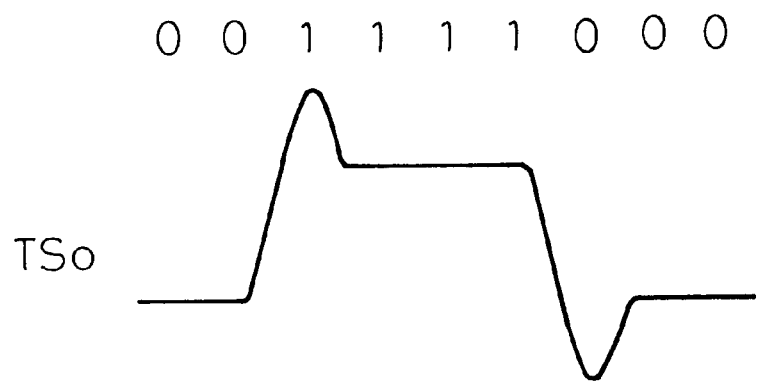
Fig.76A  TSo
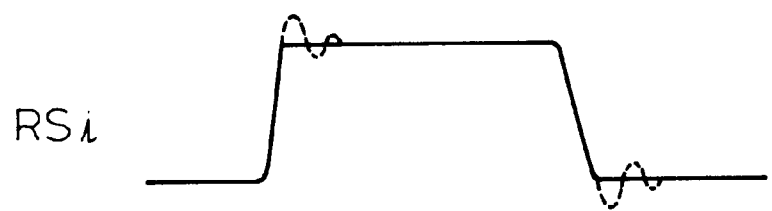
Fig.76B  RSi

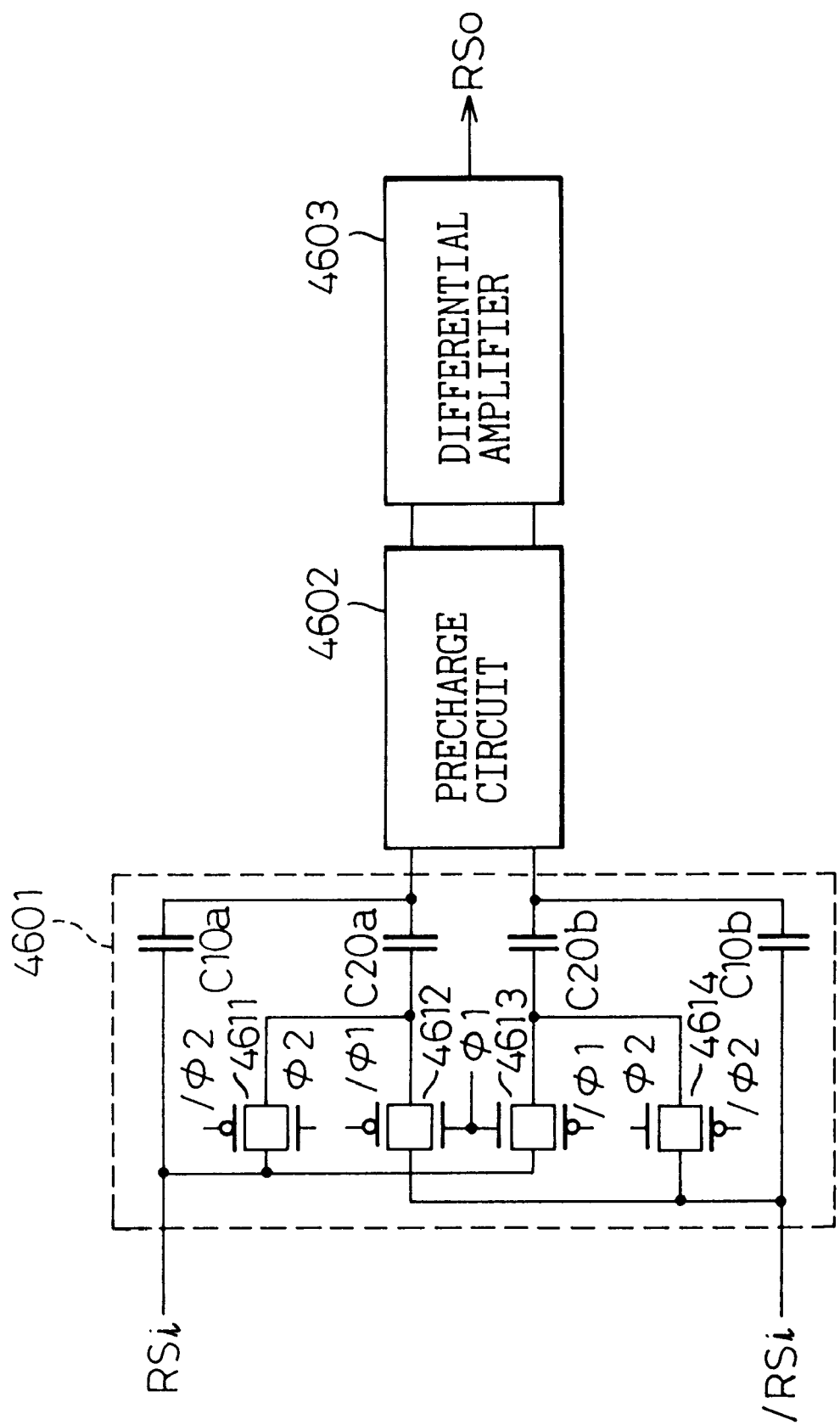

[INTER-CODE INTERFERENCE ESTIMATION]

[SIGNAL DETERMINATION]

METHOD OF AND APPARATUS FOR CORRECTLY TRANSMITTING SIGNALS AT HIGH SPEED WITHOUT WAVEFORM DISTORTION

BACKGROUND OF THE INVENTION

1. Field of the Invention

The present invention relates to a signal transmission technique. More particularly, a first aspect of the present invention relates to a driver circuit used for transmitting signals between LSI chips or between elements or circuit blocks in an LSI chip, and a second aspect of the present invention relates to a receiver circuit and signal transmission system capable of transmitting signals at high speed. Farther, a third aspect of the present invention relates to a timing signal generator circuit of a wide range of operation frequencies, and a fourth aspect of the present invention relates to a signal transmission technique involving the driver circuit, receiver circuit, and signal transmission system, capable of transmitting signals at high speed.

2. Description of the Related Art

Recently, the performance of information processing equipment such as computers has improved greatly. In particular, an improvement in the performance of DRAMs (dynamic random access memories) and processors is drastic. To keep pace with such improvement, signal transmission speeds must be increased.

For example, a speed gap between a DRAM and a processor in a computer hinders the performance of the computer. As the size of each chip increases, not only signal transmission between chips but also signal transmission between elements or circuit blocks in each chip becomes critical to the performance of the chip. Also critical is signal transmission between devices that form a multiprocessor server or between a server and peripheral circuits. To realize high-speed signal transmission, it is required to provide a driver circuit capable of transmitting signals at high speed.

High-speed signal transmission is needed not only between discrete units such as between a server and a main storage device, between servers connected to each other through a network, and between printed boards but also between chips and between elements or circuit blocks in a chip due to an improvement in integration of LSIs and a decrease in power source voltage and signal amplitude. To improve the transmission speed, it is necessary to provide a receiver circuit and signal transmission system capable of correctly transmitting and receiving signals at high speed.

The receiver circuit must operate at a correct timing to receive signals transmitted at high speed between LSIs. To realize the correct reception timing, it is necessary to generate a correct timing signal. For this purpose, there are a DLL (delay locked loop) technique and a PLL (phase locked loop) technique. If a cable connecting a server to a main storage device is long or has poor transmission characteristics, an operation frequency must be dropped to correctly transmit signals through the cable. This requires a timing signal generator capable of generating a correct timing signal at high speed and operating in a wide frequency range. It also requires a signal transmission technique capable of preventing waveform disturbance due to high-frequency signal components and line-to-line interference.

Prior arts and the problems thereof will be explained later, and in detail, with reference to drawings.

SUMMARY OF THE INVENTION

An object of a first aspect of the present invention is to provide a driver circuit capable of correctly transmitting signals without waveform distortion or inter-code interference.

An object of a second aspect of the present invention is to provide a receiver circuit and a signal transmission system capable of correctly transmitting and receiving signals at high speed.

An object of a third aspect of the present invention is to provide a timing signal generator circuit having a simple structure capable of operating in a wide frequency range to generate a correct, high-speed timing signal without jitter.

An object of a fourth aspect of the present invention is to provide a signal transmission technique capable of correctly transmitting signals at high speed without waveform distortion due to high-frequency signal components or line-to-line interference.

According to a first aspect of the present invention, there is provided a driver circuit for transmitting signals, comprising an output driver; a front driver for driving the output driver; and a level adjuster for adjusting the output level of the front driver, so that the output driver outputs a signal having a specific level varied in response to an output level of the front driver.

The output driver may include a drain-grounded push-pull structure employing p-channel and n-channel MOS transistors. The output driver may be a voltage amplifier circuit whose output level is varied by adjusting an output voltage level of the front driver. The output driver may be a current-voltage converter circuit whose output voltage level is varied by adjusting an output current level of the front driver. The output driver may include a feedback circuit for dropping output impedance.

The front driver may include a variable gain unit cooperating with the level adjuster, to adjust a level of an input signal level; and an amplifier for amplifying the level-adjusted input signal. The front driver may be a current limiting inverter for receiving an input signal, an output level of the current limiting inverter being adjusted by controlling a current passing thereto by the level adjuster. An output of the output driver may be changed in response to a sequence of past digital values, to equalize characteristics of a transmission line.

The front driver may comprise a plurality of drivers that are commonly connected to the output driver, the drivers of the front driver receiving data generated from a sequence of past digital data provided by the output driver and equalizing characteristics of a transmission line. The drivers of the front driver may have respective coefficients, multiply received data by the coefficients, and supply the products to the output driver.

The front driver may comprise first and second drivers, a digital input signal to the driver circuit being directly supplied to the first driver of the front driver, and at the same time, being delayed by a bit time, inverted, and supplied to the second driver of the front driver, thereby equalizing characteristics of a transmission line. The first and second drivers of the front driver may be arranged in parallel with each other; the second driver of the front driver may multiply the delayed and inverted signal by a coefficient; and the outputs of the first and second drivers of the front driver may be added to each other to drive the output driver. The characteristics of the transmission line may be equalized by compensating for attenuation in high-frequency components in signals that are provided by the output driver and are transmitted through the transmission line. The front driver may comprise a plurality of driver pairs, the driver pairs of the front driver being interleaved to carry out parallel-to-serial conversion.

The output driver may include a source-grounded push-pull structure employing p-channel and n-channel MOS transistors. A gate voltage of the p-channel MOS transistor of the output driver may be set above an intermediate voltage, which is between a high source voltage and a low source voltage, and a gate voltage of the n-channel MOS transistor of the output: driver may be set below the intermediate voltage when the output driver provides the intermediate voltage. The gate of the n-channel MOS transistor may be driven by a drain-grounded n-channel MOS circuit and the gate of the p-channel MOS transistor may be driven by a drain-grounded p-channel MOS circuit.

The output driver may be driven by a voltage that is lower than the high source voltage by a predetermined value and a voltage that is higher than the low source voltage by a predetermined value. The output driver may include a replica driver that equalizes an intermediate voltage between voltages for driving the output driver to an intermediate voltage between the high source voltage and the low source voltage.

According to a second aspect of the present invention, there is provided a receiver circuit comprising a capacitor network for receiving differential input signals, having a capacitor for accumulating charge and a switch for switching the supply of the differential input signals to the a capacitor; and a comparator having inverters for amplifying the outputs of the capacitor network and a common-mode feedback circuit for receiving the outputs of the inverters and maintaining a common-mode voltage substantially at a fixed value.

Further, according to a second aspect of the present invention, there is also provided a signal transmission system having a differential driver circuit; a cable connected to the differential driver circuit, for transmitting differential signals provided by the differential driver circuit; and a receiver circuit connected to the cable, for detecting the differential signals, wherein the receiver circuit comprises a capacitor network for receiving differential input signals, having a capacitor for accumulating charge and a switch for switching the supply of the differential input signals to the capacitor; and a comparator having inverters for amplifying the outputs of the capacitor network and a common-mode feedback circuit for receiving the outputs of the inverters and maintaining a common-mode voltage substantially at a fixed value.

The capacitor network may reduce a common-mode voltage in a low-frequency region of the differential input signals, and the comparator may reduce a common-mode voltage in a high-frequency region of the differential input signals. The capacitor network may form a partial response detector circuit. The receiver circuit may further comprise a precharge circuit arranged at input terminals of the comparator. The precharge circuit may precharge the comparator by applying a predetermined source voltage to the input terminals of the comparator. The precharge circuit may precharge the comparator by feeding the outputs of the inverters installed at the input terminals of the comparator back to the input terminals of the comparator.

The inverters installed in the comparator may be each a constant-current-load inverter. The inverters installed in the comparator may be each a complementary MOS inverter. The common-mode feedback circuit may include a detector having a differential amplifier having two pairs of input transistors; and a current-mirror-connected feedback circuit. The common-mode feedback circuit may include a detector for detecting a common mode voltage by combining the outputs of two complementary MOS inverters that amplify a pair of signal lines. Each amplifying stage of the comparator may be a complementary MOS inverter.

The comparator may include clamp circuits for suppressing an amplitude of each output signal of the comparator below a predetermined range of levels. The predetermined range of levels may be a range of source voltages. The comparator may include a control circuit for changing, under a differential mode of the common-mode feedback circuit, an amplification degree for amplifying signals provided by the capacitor network, the amplification degree being increased under the differential mode after amplifying the signals provided by the capacitor network so that the common-mode feedback circuit may operate as a latch circuit.

According to a third aspect of the present invention, there is provided a timing signal generator circuit comprising a first timing signal generator for receiving a clock signal, giving the clock signal a variable effective delay, and generating a first timing signal; a phase controller for controlling a phase of the first timing signal; and a second timing signal generator for dividing a frequency of the first timing signal by an integer and generating a second timing signal whose frequency is a quotient of the frequency of the first timing signal divided by the integer.

The phase controller may move forward or back the phase of the first timing signal step by step so that the phase of the first timing signal may change in a range of substantially 360 degrees with respect to the clock signal serving as a reference. The second timing signal generator may be a frequency dividing circuit. The frequency dividing circuit may employ a variable frequency dividing ratio. An operation frequency of the first timing signal generator and the frequency dividing ratio of the frequency dividing circuit may be changed so that the first timing signal may have an optional frequency that is lower than a maximum clock frequency of the first timing signal generator. The first timing signal generator may be a variable delay circuit; the second timing signal generator may be a delay generator circuit for generating an effective delay by counting the clock signal; and the output of the delay generator circuit may be supplied to the variable delay circuit.

The first timing signal generator may be a variable delay circuit; and the second timing signal generator may be a circuit for gating the first timing signal in response to an output of a sequential circuit that receives the clock signal or the first timing signal. The variable delay circuit may include a multiphase clock generator circuit that receives the clock signal; and a phase interpolator that receives output signals of the multiphase clock generator circuit.

The first timing signal generator may include a tapped delay stage; and a selector for selecting one of the output signals of the tapped delay stage. The timing signal generator circuit may further comprise a phase locked loop circuit that multiplies the clock signal by an integer and providing the first timing signal generator with a product signal whose frequency is higher than the frequency of the clock signal that is used for signal transmission. The phase controller may include a phase comparison circuit for comparing the phase of the second timing signal with the phase of an external clock signal and providing an output signal to control the phase of the first timing signal.

According to a fourth aspect of the present invention, there is provided a method of transmitting a signal from a driver to a receiver, comprising the step of making a sum of a rise time and a fall time of each code contained in the signal transmitted from the driver equal to or longer than a bit time.

The method may further comprise the step of determining a value in a bit time in a signal received at the receiver according to a latter half of the bit time where the received signal reaches a peak. The method may further comprise the steps of transmitting, from the driver, a sequence of reference codes alternating between 0 and 1; detecting, at the receiver, the reference codes and determining reception timing used as a threshold to detect 0s and 1s in a received signal; and shifting, at the receiver, a phase of the determined reception timing by a predetermined value, to provide optimum reception timing. The method may further comprise the step of carrying out, at the receiver, an equalizing process to remove inter-code interference from a received signal. The removal of inter-code interference may include the steps of adjusting, at the driver, a rise time of a signal to be transmitted from the driver; and carrying out, at the receiver, the equalizing process.

Further, according to a fourth aspect of the present invention, there is provided a signal transmission system for transmitting a signal from a driver circuit to a receiver circuit through a transmission line, comprising a code length controller provided for the driver circuit, for making a sum of a rise time and a fall time of each code contained in a signal to be transmitted from the driver equal to or longer than a bit time.

The signal transmission system may further comprise a reception signal determination circuit, provided for the receiver circuit, for determining a value in a bit time in a signal received at the receiver according to a latter half of the-bit time where the signal reaches a peak. The code length controller may include a multiphase clock generator for generating multiphase clock signals that are synchronized with a transmission clock signal; and a plurality of unit drivers sequentially driven in response to multiphase clock signals.

The code length controller may include a plurality of constant-current output drivers driven by a first binary signal to be transmitted and a second binary signal formed by delaying the first binary signal by a bit time or an integer multiple of the bit time; a current sum generator for combining outputs of the constant-current drivers to provide a current sum of the constant-current drivers; and an integration circuit for integrating the current sum to provide a voltage. The reception signal determination circuit may include a reception timing detector for receiving a sequence of reference codes alternating between 0 and 1 from the driver circuit, detecting the reference codes, and determining reception timing used as a threshold to detect 0s and 1s in a received signal; and an optimum reception timing generator for shifting the phase of the determined reception timing by a predetermined value to provide optimum reception timing.

The receiver circuit may include an equalizing circuit for removing inter-code interference from a received signal. The driver circuit may include an adjuster for adjusting a rise time of a signal to be transmitted from the driver circuit as well as adjusting an equalizing process to be carried out by the receiver circuit, so that inter-code interference may be removed at the receiver side.

Further, according to a fourth aspect of the present invention, there is also provided a driver circuit for transmitting a signal, comprising a code length controller for making a sum of a rise time and a fall time of each code contained in a signal to be transmitted equal to or longer than a bit time.

The code length controller may include a multiphase clock generator for generating multiphase clock signals that are synchronized with a transmission clock signal; and a plurality of unit drivers sequentially driven in response to the multiphase clock signals. The code length controller may include a plurality of constant-current output drivers driven by a first binary signal to be transmitted and a second binary signal formed by delaying the first binary signal by a bit time or an integer multiple of the bit time; a current sum generator for combining outputs of the constant-current drivers to provide a current sum of the constant-current drivers; and an integration circuit for integrating the current sum to provide a voltage.

In addition, according to a fourth aspect of the present invention, there is also provided a receiver circuit for receiving a signal in which a sum of a rise time and a fall time of each code is equal to or longer than a bit time, comprising a reception signal determination circuit for determining a value in a bit time in a signal received at the receiver according to a latter half of the bit time where the received signal reaches a peak.

The reception signal determination circuit may include a reception timing detector for receiving a sequence of reference codes alternating between 0 and 1, detecting the reference codes, and determining reception timing used as a threshold to detect 0s and 1s in a received signal; and an optimum reception timing generator for shifting a phase of the determined reception timing by a predetermined value to provide optimum reception timing. The receiver circuit may include an equalizing circuit for removing inter-code interference from a received signal.

BRIEF DESCRIPTION OF THE DRAWINGS

The present invention will be more clearly understood from the description of preferred embodiments set forth below with reference to the accompanying drawings, wherein:

FIG. 33 shows a receiver circuit according to a second embodiment of the second aspect of the present invention;

FIG. 34 shows a capacitor network of the receiver circuit of FIG. 33;

FIG. 35 shows the timing of control signals used by the capacitor n work of FIG. 34;

FIGS. 56A, 56B, and 56C show a concrete example of a timing signal generator circuit according to the third aspect of the present invention;

FIGS. 76A and 76B show the operation of a driver circuit of the system of FIG. 75;

FIG. 77 shows a receiver circuit of the system of FIG. 75;

DESCRIPTION OF THE PREFERRED EMBODIMENTS

For a better understanding of driver circuits according to the first aspect of the present invention, a driver circuit according to a prior art and the problem thereof will be explained.

Figure 1:
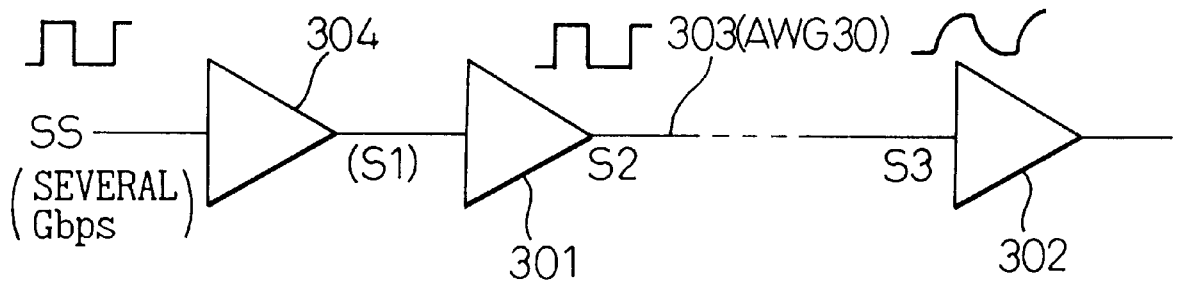
FIG. 1 shows a driver circuit for transmitting signals according to a prior art.

FIG. 1 shows the driver circuit for transmitting signals according to the prior art. The driver circuit has an output driver 301 and a front driver 304 and is connected to a receiver 302 through a signal transmission line 303.

The front driver 304 and output driver 301 amplify a high-speed signal SS of, for example, several Gbps and transmit the amplified signal to the receiver 302 through the transmission line 303. The transmission line 303 may be a cable of several meters to several tens of meters generally used to connect components of a multiprocessor server system to each other, or a server and a peripheral circuit to each other. The transmission line 303 may be a copper wire of AWG (American Wire Gauge) 30.

The high-speed signal SS of several Gbps is amplified by the front driver 304 and output driver 301 into an output signal S2, which is transmitted through the transmission line 303. The skin effect of the transmission line 303 attenuates the high-frequency components of the signal S2, and therefore, a signal S3 received by the receiver 302 has a distorted waveform. In addition, the signal S3 usually involves inter-code interference, and therefore, is difficult for a standard receiver to correctly receive it.

The principle of the first aspect of the present invention will be explained with reference to FIG. 2.

Figure 2:
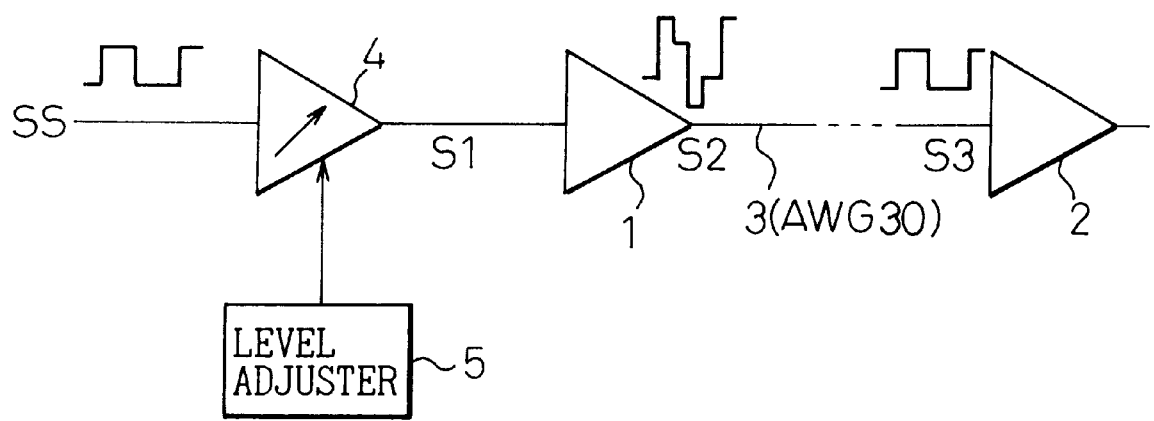
FIG. 2 shows the principle of a driver circuit for transmitting signals according to the first aspect of the present invention.

A driver circuit shown in FIG. 2 has an output driver 1, a front driver 4, and a level adjuster 5 and is connected to a receiver 2 through a signal transmission line 3. The transmission line 3 may be a thin copper wire of AWG 30 of several meters.

The driver circuit of the first aspect is characterized by a combination of the level adjuster 5 and front driver 4 for compensating attenuation of high-requency components in the transmission line 3.

The level adjuster 5 and front driver 4 emphasize the high-frequency components of an input signal SS and generate a signal S1 The emphasized signal S1 is amplified by the output driver 1, and the amplified signal S2 is transmitted to the transmission line 3. The signal S2 is received by the receiver 2 as a signal S3. The signal S3 has a proper waveform with compensated high-frequency components and is free from distortion or inter-code interference. The same effect is obtainable by providing the receiver 2 with the circuit for compensating the frequency characteristics of the transmission line 3.

Generally, the attenuation of high-frequency components in a signal transmitted through a transmission line is dependent on the length and structure of the transmission line. It is necessary, therefore, to vary the level of a signal to be transmitted from a driver, irrespective of the location where the characteristics of the transmission line are compensated, the driver or a receiver. To achieve this, the driver may have a discrete-time filter to provide required frequency characteristics. In this case, the driver provides an analog-like output signal.

The first aspect of the present invention employs the level adjuster 5 to vary the output level of the front driver 4 and drives the output driver 1 by the front driver 4 so that the output driver 1 may provide an analog-level output signal.

Figure 3A:
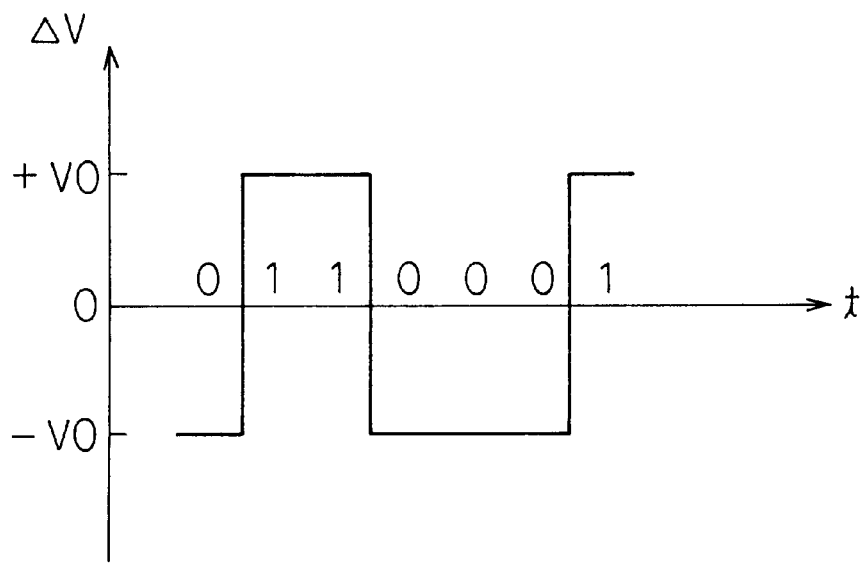
FIG. 3A shows the operation of the prior art of FIG. 1.
Figure 3B:
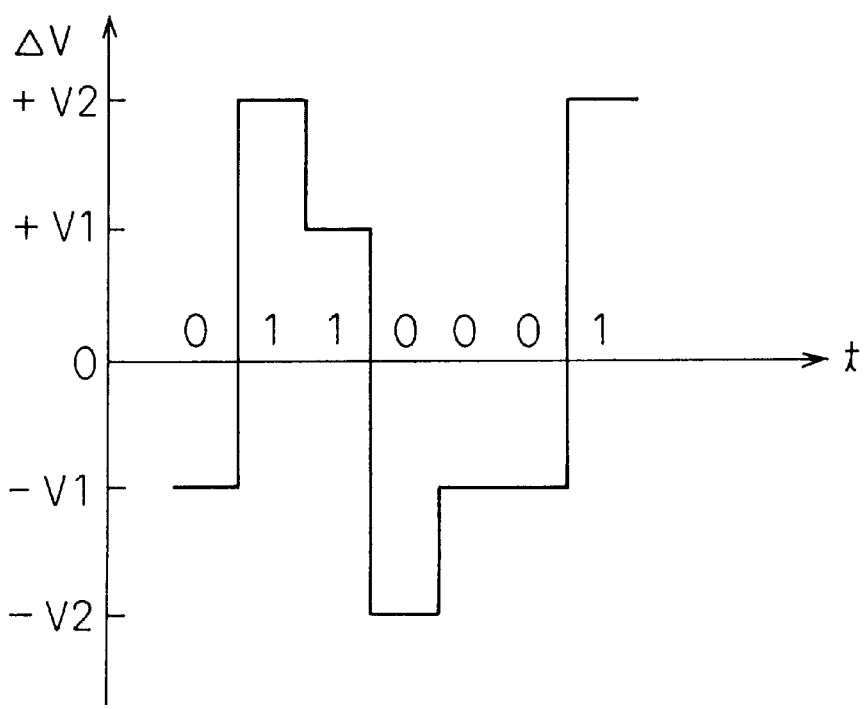
FIG. 3B shows the operation of the driver circuit of FIG. 2.

FIG. 3A shows the operation of the driver circuit of the prior art of FIG. 1, and FIG. 3B shows the operation of the driver circuit of the first: aspect of the present invention of FIG. 2. Namely, the waveform of FIG. 3A is provided by the output driver 301 of FIG. 1, and the waveform of FIG. 3B is provided by the output driver 1 of FIG. 2. The waveforms of FIGS. 3A and 3B each represent a potential difference $\Delta V$ between complementary signals with respect to time t when data carried by the signals changes in the sequence of 0, 1, 1, 0, 0, 0, and 1.

In FIG. 3A, the potential difference of the output driver 301 of the prior art changes between $+V0$ and $-V0$ as data changes between 1 and 0.

In FIG. 3B, the output driver 1 of the present invention shows a large potential difference of $+V2$ when data changes from 0 to 1, a large potential difference of $-V2$ when data changes from 1 to 0, and a small potential difference of $+V1$ or $-V1$ when data is unchanged at 1 or 0.

Data levels are not limited to 1 and 0. They may take many values. The voltage level $+V0$ of FIG. 3A corresponds to the voltage level $+V1$ of FIG. 3B.

In this way, the output of the driver circuit of the first aspect of the present invention provides one analog level (four analog levels are shown in FIG. 3B) instead of digital binary levels. Namely, the driver circuit of the first aspect carries out an equalization process to compensate for the frequency characteristic; of the transmission line 3, thereby realizing high-speed signal transmission.

Signal transmission driver circuits according to the first aspect of the present invention will be explained in detail.

Figure 4:
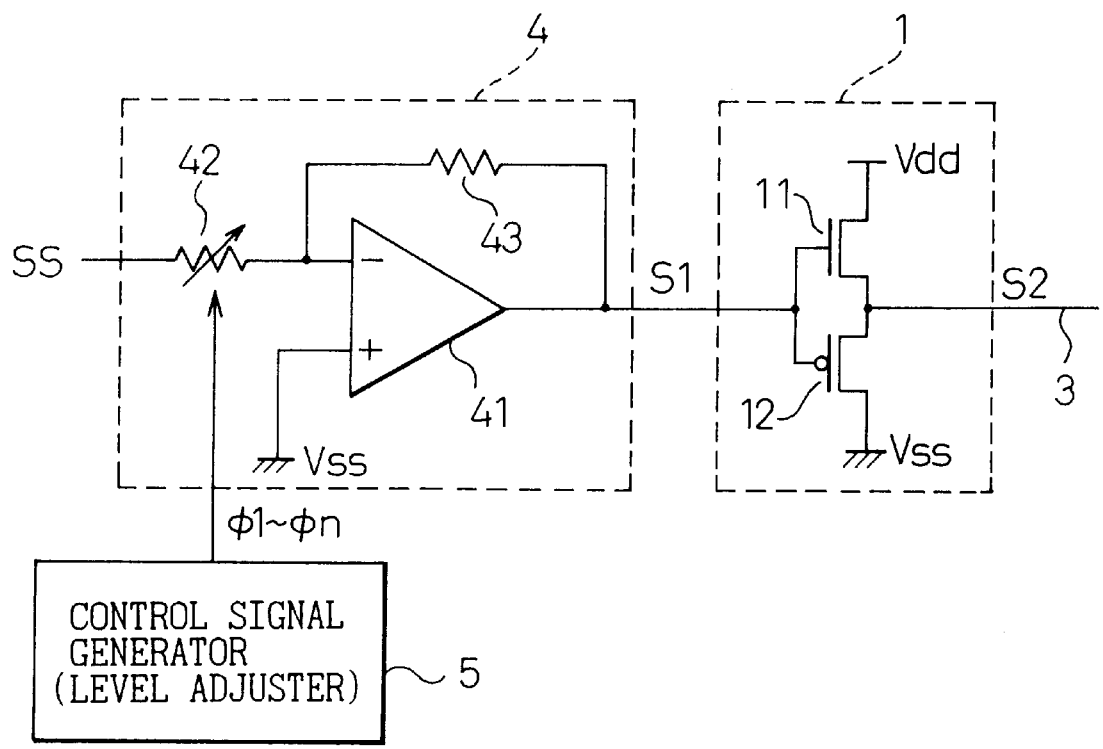
FIG. 4 shows a driver circuit for transmitting signals according to a first embodiment of the first aspect of the present invention.
Figure 5:
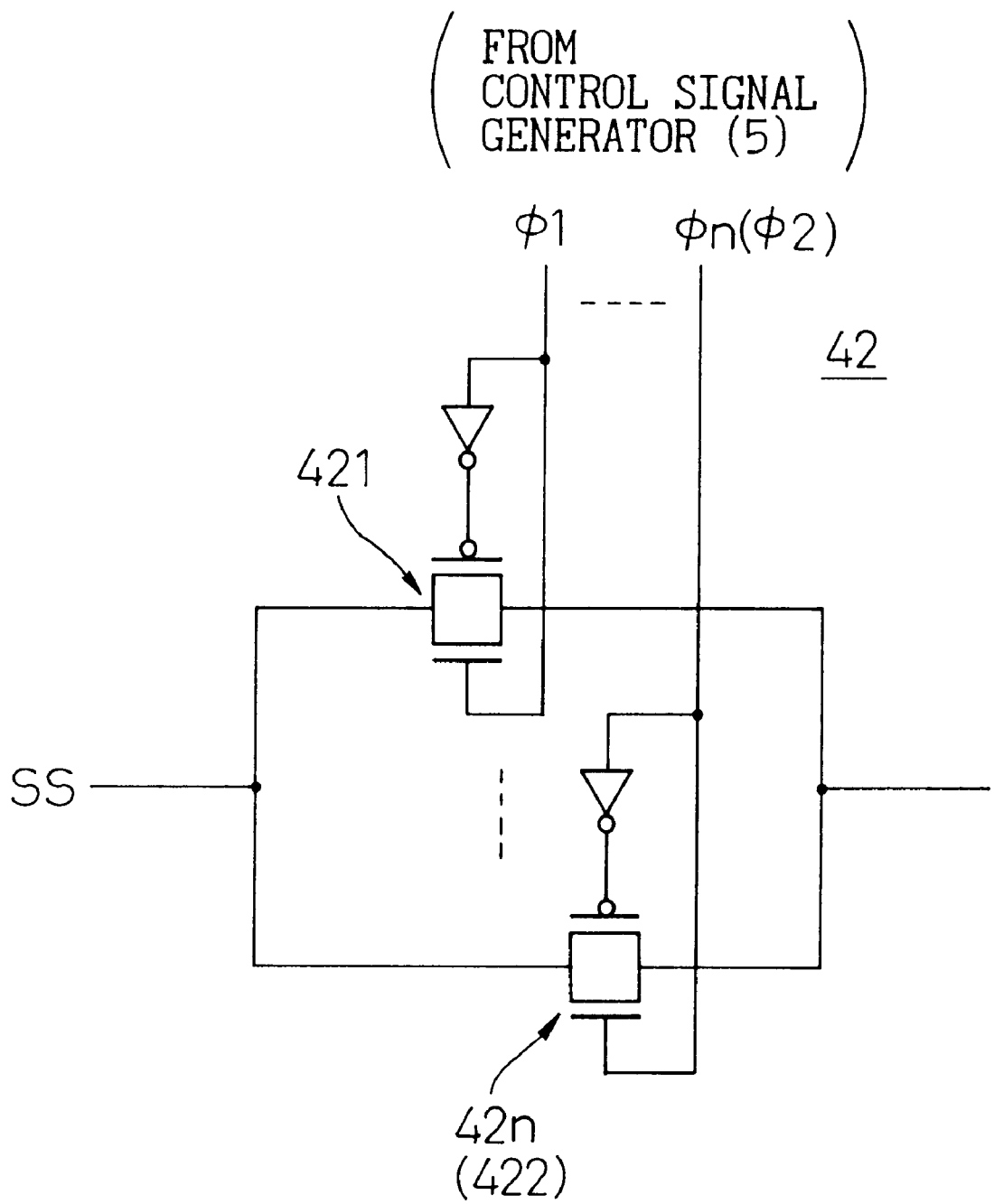
FIG. 5 shows a variable gain unit of the driver circuit of FIG. 4.
Figure 6:
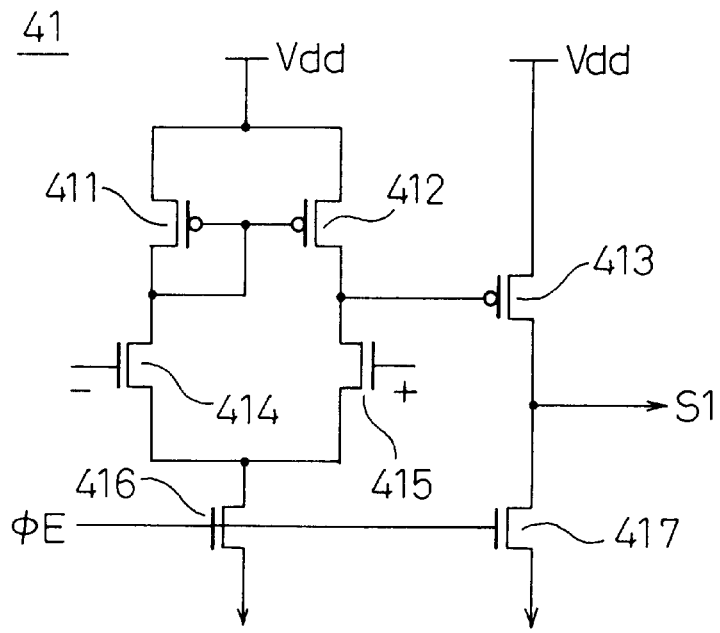
FIG. 6 shows an amplifier circuit of the driver circuit of FIG. 4.

FIG. 4 shows a driver circuit for transmitting signals according to the first embodiment of the first aspect of the present invention, FIG. 5 shows a variable gain unit of the driver circuit, and FIG. 6 shows an amplifier of the driver circuit.

The driver circuit has a front driver 4 that consists of an amplifier 41, a variable gain unit 42, and a feedback resistor 43. The driver circuit also has an output driver 1 that consists of an n-channel MOS transistor (NMOS transistor) 11 and a p-channel MOS transistor (PMOS transistor) 12.

To drive a load resistor of, for example, several tens of ohms, the output driver 1 is a source follower employing the large NMOS transistor 11 and PMOS transistor 12 to realize a gain of about 1.

In FIG. 5, the variable gain unit 42 consists of transfer gates 421 to 42n that are switched in response to control signals (control codes) $\phi1$ to $\phi n$ provided by a level adjuster serving as a control signal generator. When one (for example, φ1) of the control signals becomes high, a corresponding transfer gate (421) is turned on to vary the input voltage gain of an input signal SS. The gates of NMOS transistors of the transfer gates 421 to 42n directly receive the control signals φ1 to φn, respectively, and the gates of PMOS transistors thereof receive inversions of the control signals φ1 to φn, respectively, through inverters. The numbers of the control signals φ1 to φn and transfer gates 421 t 42n may be 16 or 32 each. At a minimum, they may be two each (Q1 and φ2, and 421 and 422).

In FIG. 6, the amplifier 41 is a differential amplifier consisting of PMOS transistors 411 to 413 and NMOS transistors 414 to 417. A signal φE supplied to the gates of the transistors 416 and 417 controls the active state of the amplifier 41.

The first embodiment is capable of varying the level of each of 0 and 1 carried by an output signal S2 (S1) depending on attenuation in a transmission line 3, to realize high-speed transmission and low power consumption.

Figure 7:
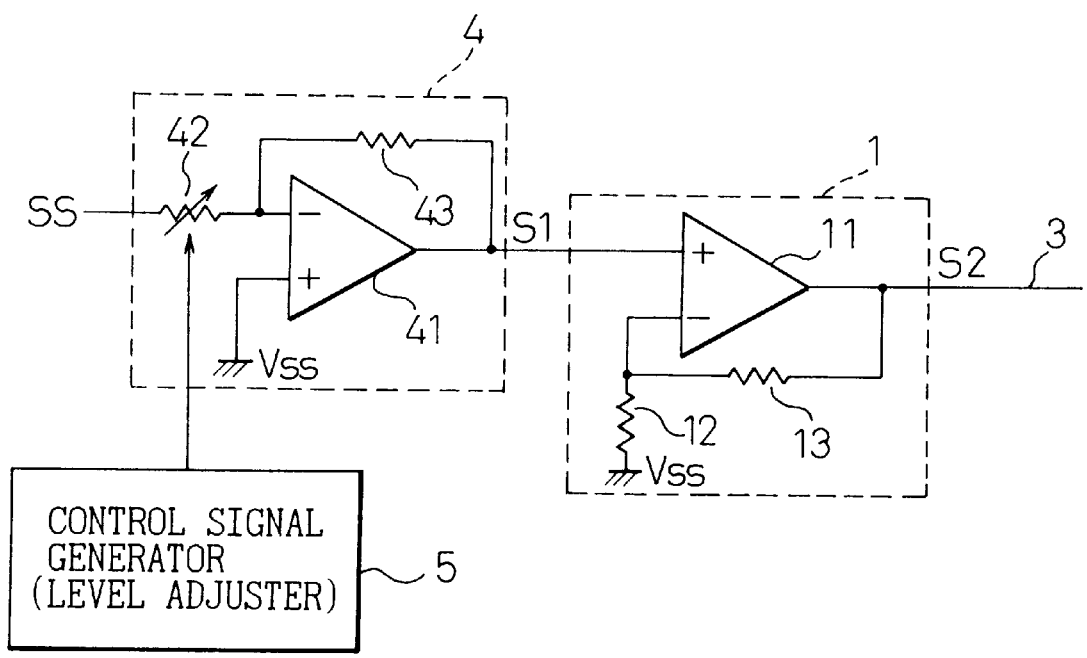
FIG. 7 shows a driver circuit for transmitting signals according to a second embodiment of the first aspect of the present invention.

FIG. 7 shows a driver circuit for transmitting signals according to the second embodiment of the first aspect of the present invention.

As is apparent from comparison between FIGS. 7 and 4, a front driver 4 with a level adjuster (control signal generator) 5 of FIG. 7 is the same as that of FIG. 4, and an output driver 1 of FIG. 7 differs from that of FIG. 4.

The output driver 1 of FIG. 7 has a feedback amplifier 11. The resistance of a feedback resistor 13 is two to four times as large as that of a resistor 12 connected to an inverting input terminal of the amplifier 11, thereby providing a gain of two to four times as large as a usual value. For example, the resistor 12 has a resistance of 1 KΩ and the feedback resistor 13 has a resistance of 3 KΩ so that the amplifier 11 may provide a gain of about 3.

The output driver 1 amplifies a variable output signal S1 from the front driver 4 and provides an amplified output signal S2. Since the loop gain of the output driver 1 is low, the second embodiment is advantageous in preventing instability such as oscillation when driving capacitive load. Since the gain of each of the front driver 4 and output driver 1 is variable, the gain of the output signal S2 from the output driver 1 has a wide variable range.

Figure 8:
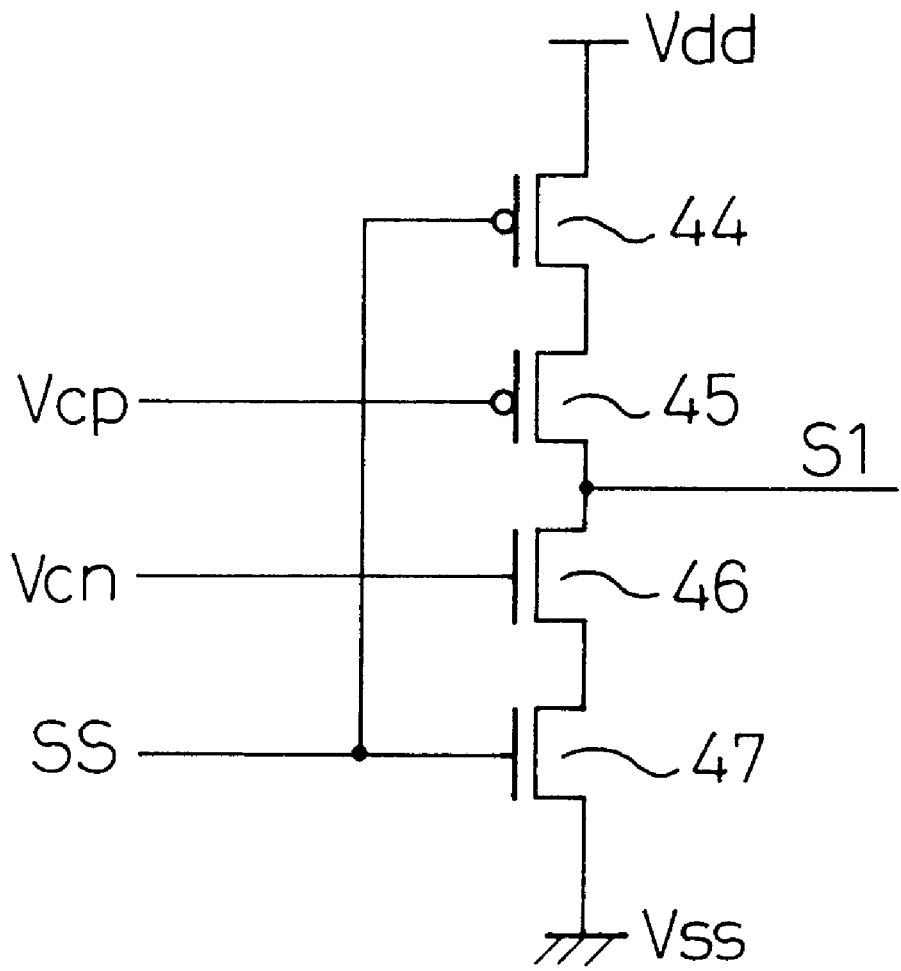
FIG. 8 shows a front driver of a driver circuit for transmitting signals according to a third embodiment of the first as ect of the present invention.
Figure 9:
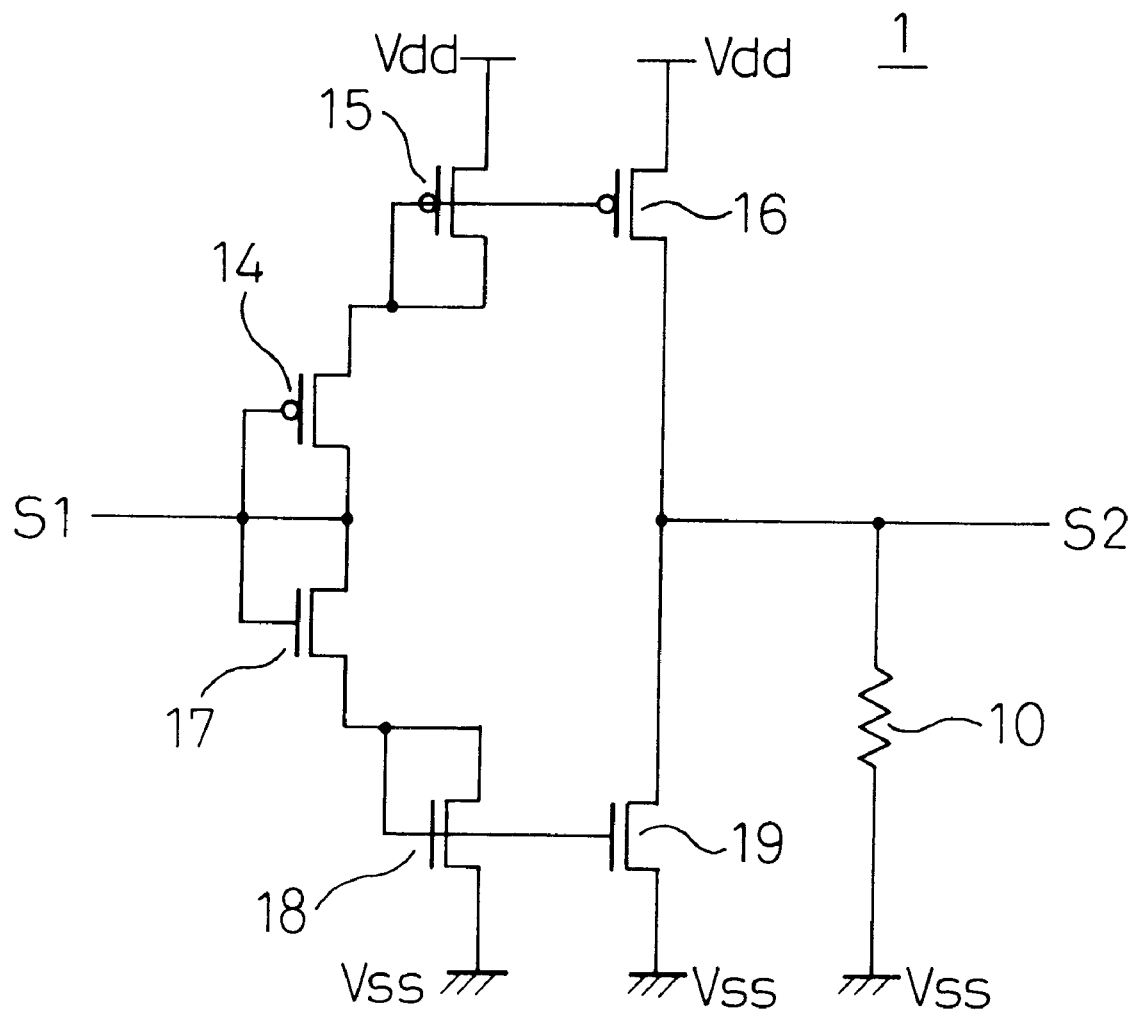
FIG. 9 shows an output driver of the third embodiment.

FIG. 8 shows a front driver of a driver circuit for transmitting signals according to the third embodiment of the first aspect of the present invention, and FIG. 9 shows an output driver of the driver circuit.

In FIG. 8, the front driver 4 is formed as a current limiting inverter consisting of PMOS transistors 44 and 45 and NMOS transistors 46 and 47 that are connected in series. A signal SS is commonly supplied to the gates of the PMOS transistor 44 and NMOS transistor 47. The gate of the PMOS transistor 45 receives a control voltage vcp, and the gate of the NMOS transistor 46 receives a control voltage Vcn.

In FIG. 9, the output driver 1 is formed as a constant current circuit employing current mirror circuits. An output terminal of the output driver 1 for providing an output signal S2 is connected to a load register 10 to form a current/voltage converter for converting an input current S1 from the front driver 4 into an output voltage S2.

The output driver 1 consists of PMOS transistors 14 to 16 and NMOS transistors 17 to 19. The load resistor 10 is arranged at the output terminal of the output driver 1. The PMOS transistors 15 and 16 are current-mirror-connected to each other, and the NMOS transistors 18 and 19 are current-mirror-connected to each other.

The current/voltage converter made of the output driver 1 and load resistor 10 is driven by the front driver 4 of FIG. 8. An output current of the front driver 4 is controlled by changing the control voltages Vcp and Vcn and is amplified by the current mirror circuits of the output driver 1. The third embodiment easily controls the output level of the output driver 1 by applying a current to the input terminal (S1) of the output driver 1. As will be explained later, it is easy for the front driver 4 to limit an output current by using, for example, a D/A converter that generates a current.

Figure 10:
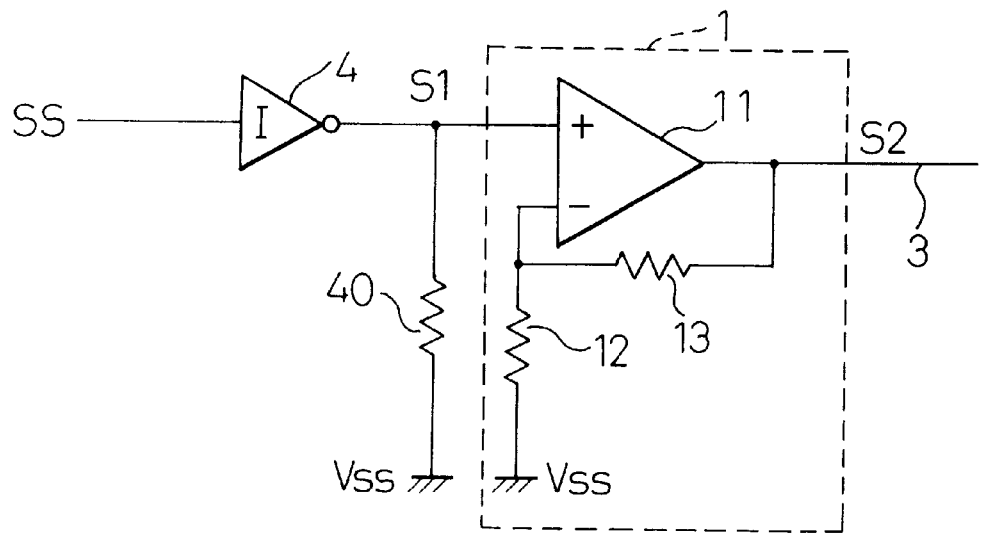
FIG. 10 shows a driver circuit for transmitting signals according to a modification of the third embodiment.

FIG. 10 shows a driver circuit for transmitting signals according to a modification of the third embodiment of the first aspect of the present invention.

A front driver 4 is a current limiting inverter whose output terminal is connected to a load resistor 40 to provide an output voltage signal S1. The voltage signal S1 is linearly amplified by an output driver 1, which is equal to that of the second embodiment of FIG. 7, to provide an output signal S2 of variable voltage level.

Figure 11:
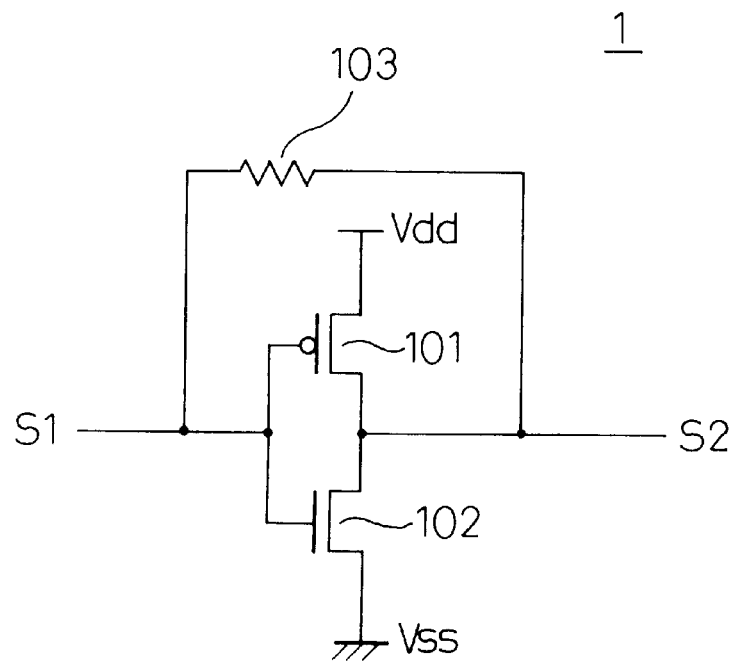
FIG. 11 shows an output driver of a driver circuit for transmitting signals according to a fourth embodiment of the first aspect of the present invention.

FIG. 11 shows an output driver of a driver circuit for transmitting signals according to the fourth embodiment of the first aspect of the present invention.

The output driver 1 is made of an inverter, which consists of a PMOS transistor 101 and an NMOS transistor 102, and a feedback resistor (circuit) 103 that feeds an output signal S2 back to an input terminal of the inverter.

The output driver 1 reduces the output impedance of the inverter to, for example, several tens of ohms by the feedback resistor 103. The feedback resistor 103 is capable of reducing the output impedance in accordance with a fraction of a loop gain.

The fourth embodiment is capable of providing an output impedance of, for example, several tens of ohms with the use of small transistors (101, 102).

Figure 12:
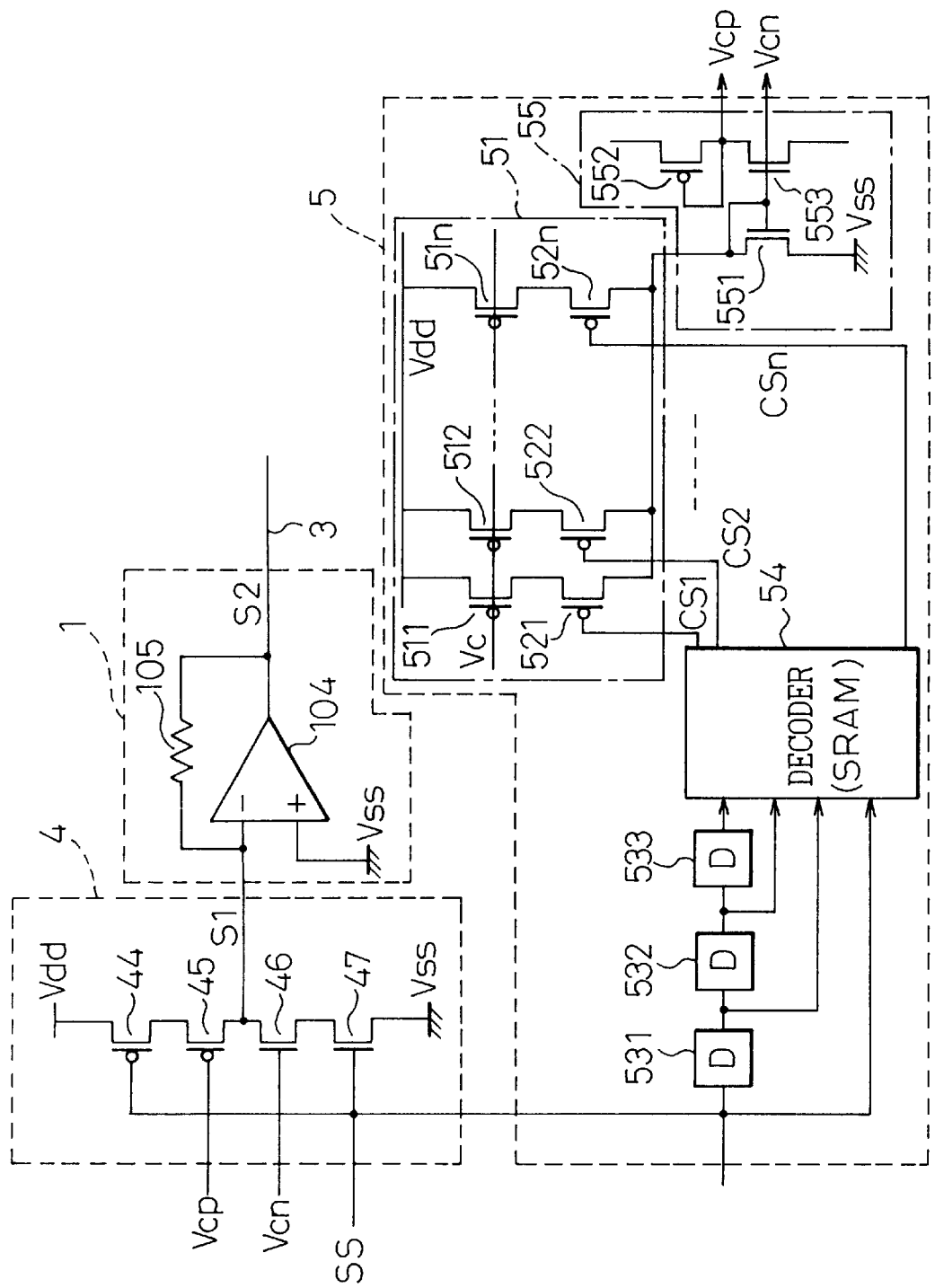
FIG. 12 shows a driver circuit for transmitting signals according to a fifth embodiment of the first aspect of the present invention.

FIG. 12 shows a driver circuit for transmitting signals according to the fifth embodiment of the first aspect of the present invention.

A front driver of the fifth embodiment is the same as that of FIG. 8, and an output driver thereof consists of an amplifier 104 and a feedback resistor 105. A level adjuster 5 serving as a control signal generator has three delay stages 531, 532, and 533, which provide each a 1-bit delay, a decoder 54, a weight circuit 51 for carrying out a weighting operation according to the output of the decoder 54, and a control voltage generator 55 for generating control voltages vcp and vcn according to a current provided by the weight circuit 51.

The decoder 54 receives a series of 4-bit data carried by 1-bit-, 2-bit-, and 3-bit-delayed signals and a direct signal of an input signal SS and provides weight signals CS1 to CSn. The weight circuit 51 consists of pairs (for example, 16 pairs) of PMOS transistors 511 and 521, 512 and 522, . . . and 51n and 52n. The gates of the transistors 511 to 51n receive a bias voltage Vc, and the gates of the transistors 521 to 52n receive the weight signals CS1 to CSn, respectively. The decoder 54 is, for example, a static RAM (SRAM). When a power source is turned on, a series of test bits are transmitted to a receiver through a signal transmission line 3, and the test bits received by the receiver are used to determine relationships between 4-bit input data and the weight signals CS1 to CSn. The determined relationships are written into the decoder 54, i.e., the SRAM.

The transistor pairs 511–521 to 51n–52n have different sizes. When one of the weight signals CS1 to CSn from the decoder 54 becomes low, a corresponding one of the transistors 521 to 52n is turned on so that a current determined by the size of the turned-on transistor passes through a transistor 551 of the control voltage generator 55. The weight signals CS1 to CSn control the level of an output signal S1 (S2) with the 1-bit-delayed signal providing the strongest influence, the 2-bit-delayed signal providing the second strongest influence, and the like. It is possible to equalize the sizes of the transistors 511 to 51n and 521 to 52n. In this case, an optional number of the weight signals CS1 to CSn from the decoder 54 are set to low according to the four input signals, to turn on corresponding ones of the transistors 521 to 52n. Then, a current corresponding to the turned-on transistors flows to the transistor 551.

The control voltage generator 55 has the NMOS transistor 551, an NMOS transistor 553, and a PMOS transistor 552. The transistor 551 is current-mirror-connected to the transistor 553, which is connected to the transistor 552 in series. A weighted current from the weight circuit 51 is received by the transistor 551, and the transistors 553 and 552 generate the control voltages Vcn and Vcp. These control voltages are applied to the gates of transistors 46 and 45 of the front driver 4, respectively, to control the level of a signal S2 provided by the output driver 1.

In this way, the driver circuit of the fifth embodiment compensates for the frequency characteristics of the transmission line 3 to correctly transmit signals.

Figure 13:
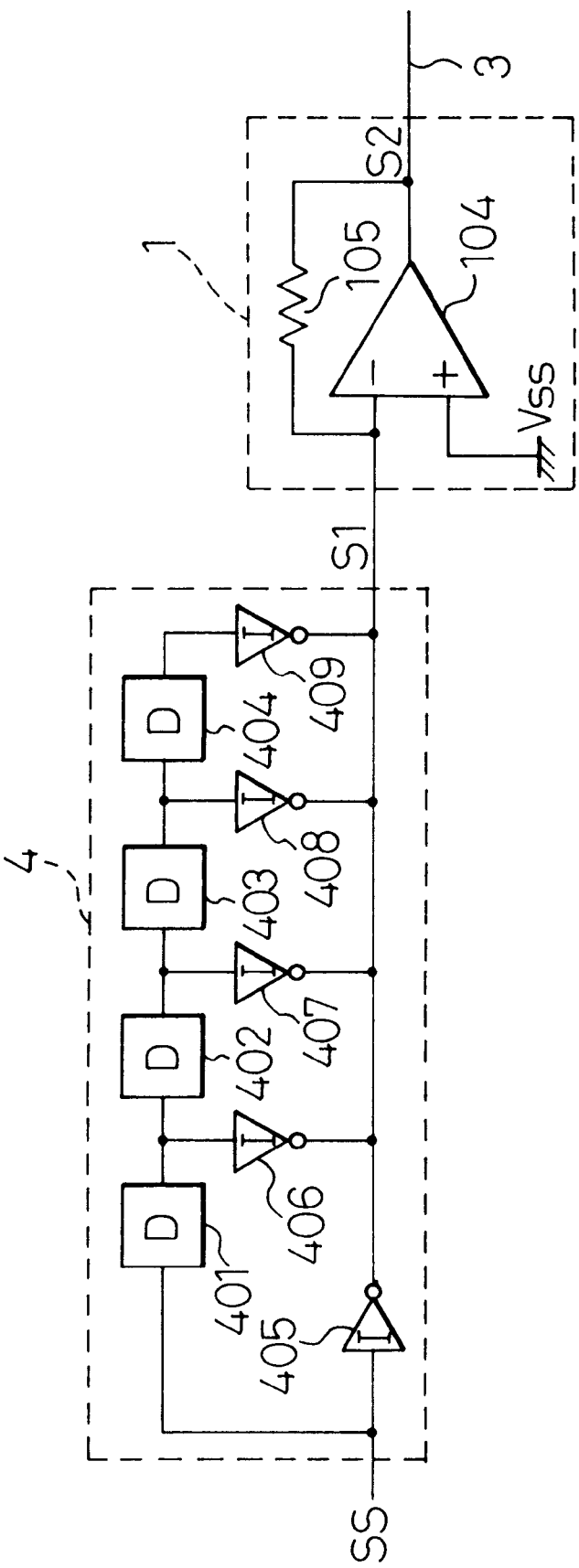
FIG. 13 shows a driver circuit for transmitting signals according to a sixth embodiment of the first aspect of the present invention.

FIG. 13 shows a driver circuit for transmitting signals according to the sixth embodiment of the first aspect of the present invention.

The driver circuit has a front drover 4 consisting of four delay stages 401 to 404 each providing a 1-bit delay and five current limiting inverters 405 to 409. The inverter 405 directly receives a signal SS, the inverter 406 receives a 1-bit-delayed signal prepared from the signal SS by the delay stage 401, the inverter 407 receives a 2-bit-delayed signal prepared from the signal SS by the delay stages 401 and 402, the inverter 408 receives a 3-bit-delayed signal prepared from the signal SS by the delay stages 401 to 403, and the inverter 409 receives a 4-bit-delayed signal prepared from the signal SS by the delay stages 401 to 404.

Each of the inverters 405 to 409 has the same structure as that of FIG. 8. By selecting control signals vcp and Vcn and the polarities thereof supplied to the inverters 405 to 409, the driver circuit acquires frequency characteristics that are opposite to those of a signal transmission line 3. The sizes of transistors that form the inverters 405 to 409 may differ from one another. For example, the transistors of the inverter 405 may have the largest size, and the sizes gradually decrease toward the transistors of the inverter 409 that are the smallest. An output driver 1 of the sixth embodiment is the same as that of the fifth embodiment of FIG. 12.

In this way, the sixth embodiment supplies a time series of bit data based on the signal SS to the current limiting inverters 405 to 409, which provide a common output signal S1. The signal S1 is transferred to an input terminal of the output driver 1 serving as a current/voltage converter with these arrangements, the driver circuit of the sixth embodiment compensates for the frequency characteristics of the transmission line 3 to correctly transmit signals.

Figure 14:
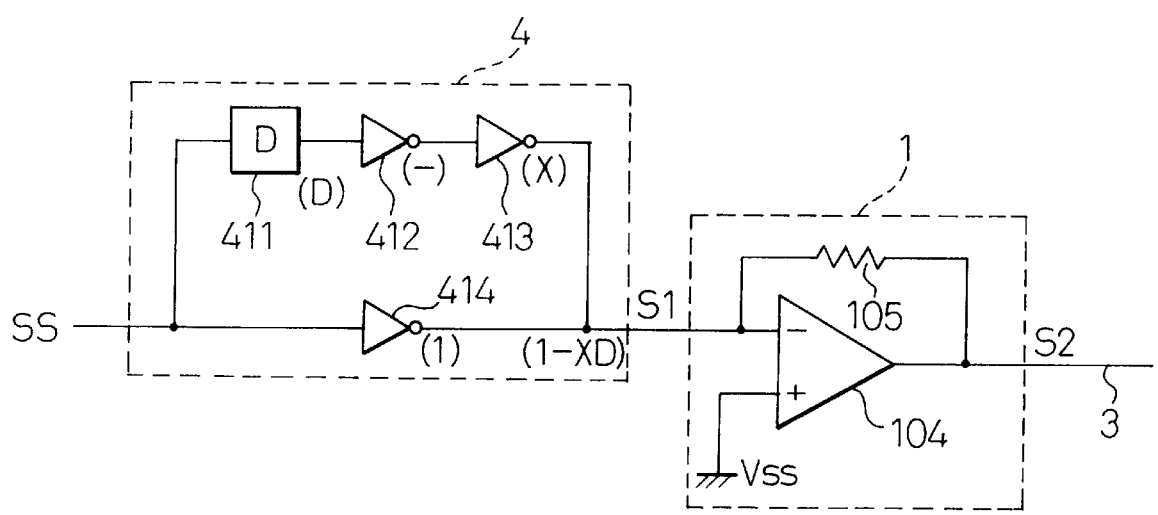
FIG. 14 shows a driver circuit for transmitting signals according to a seventh embodiment of the first aspect of th present invention.

FIG. 14 shows a driver circuit for transmitting signals according to the seventh embodiment of the first aspect of the present invention.

As is apparent from comparison between FIGS. 14 and 13, a front driver 4 of the seventh embodiment has a delay stage 411, an inverter 412, and two current limiting inverters 413 and 414. A signal SS is delayed by the delay stage 411, the delayed signal is inverted by the inverter 412, the inverted signal is multiplied by x (0<x<1) by the inverter 413, and the product signal is supplied to the inverter 414. As a result, the front driver 4 provides an output signal S1 of "1−xD." This results in making an output driver 1 execute an equalization process corresponding to PRD (partial response detection).

The seventh embodiment is simple and effective to transmit signals at high speed through a band-limited transmission line.

Figure 15:
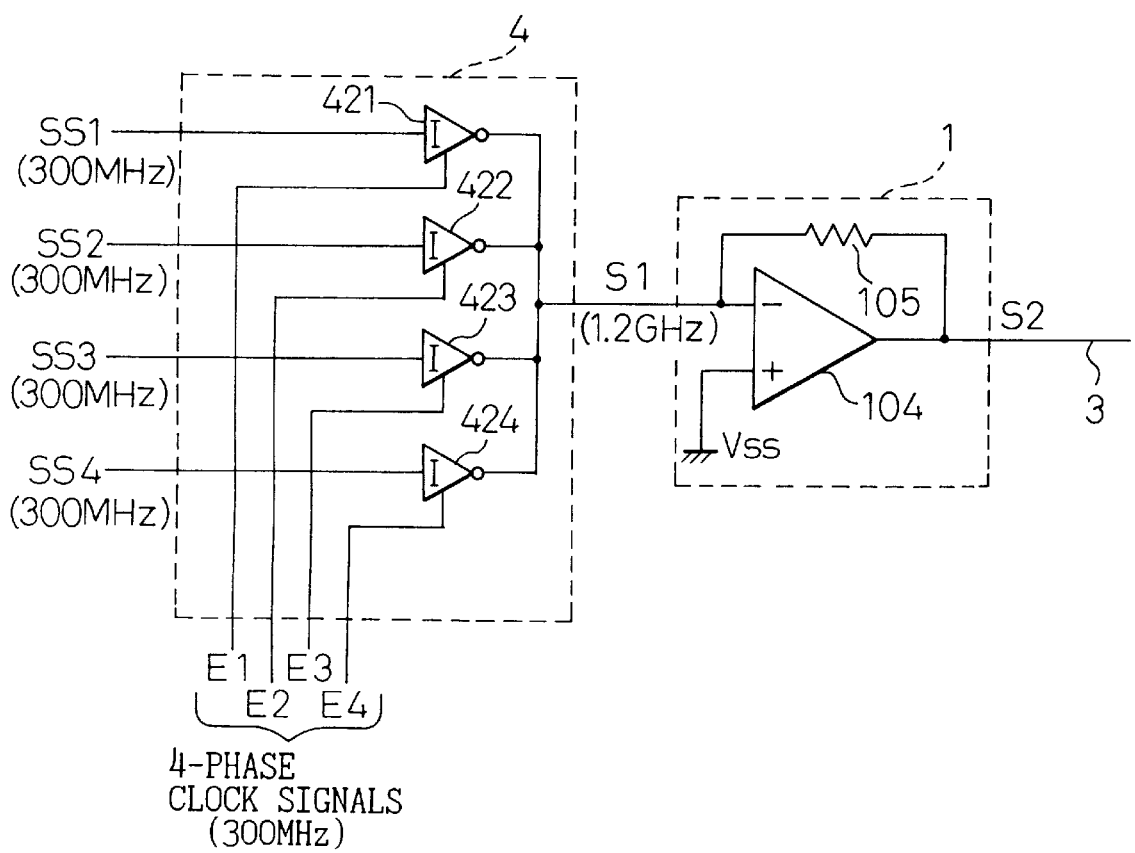
FIG. 15 shows a driver circuit for transmitting signals according to an eighth embodiment of: the first aspect of the present invention.

FIG. 15 shows a driver circuit for transmitting signals according to the eighth embodiment of the first aspect of the present invention.

A front driver 4 consists of four current limiting inverters 421 to 424 that are enabled and disabled in response to four-phase clock signals E1 to E4, respectively, of 300 MHz for example. The inverters 421 to 424 receive different data signals SS1 to SS4, respectively, that are in synchronization with a clock signal of, for example, 300 MHz. The inverters 421 to 424 are sequentially enabled by the clock signals E1 to E4 to provide serial data of 1.2 GHz (300 MHz×4). Each of the inverters 421 to 424 has the same structure as that of FIG. 8. An output driver 1 is the same as that of any one of the fifth to seventh embodiments.

The eighth embodiment forms the front driver 4 as a 4-to-1 multiplexer composed of the four current limiting inverters 421 to 424 that are interleaved in response to the four-phase clock signals. Namely, the front driver 4 carries out parallel-serial conversion that is always required in high-speed signal transmission. Although the front driver 4 processes the four different input signals SS1 to SS4 of 300 MHz by the four inverters 421 to 424 that are enabled in response to the four-phase clock signals E1 to E4 of 300 MHz, this does not limit the present invention. For example, ten different input signals synchronized with a 100-MHz clock signal may be processed by ten current limiting inverters controlled by 10-phase clock signals of 100 MHz. In this, case, the front driver 4 is a 10-to-1 multiplexer.

Figure 16:
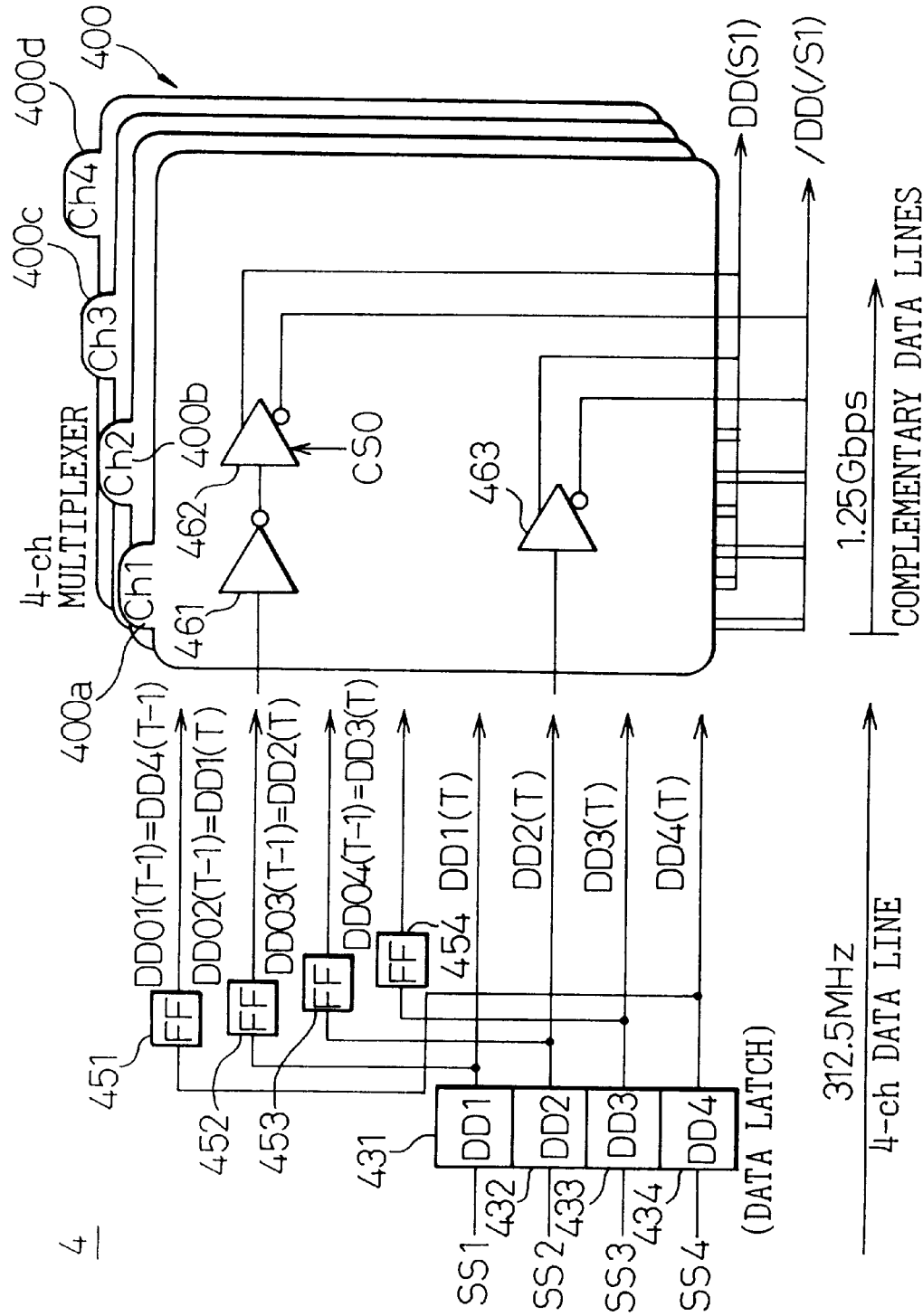
FIG. 16 shows a front driver of the driver circuit of FIG. 15.

FIG. 16 shows an example of the front driver 4 of FIG. 15.

The front driver 4 is a 4-to-1 multiplexer having data latches 431 to 434 for receiving the input signals SS1 to SS4, respectively, flip-flops 451 to 454, and a 4-channel multiplexer 400.

Each of channels ch1 to ch4 (400a to 400d) of the multiplexer 400 has an inverter 461, a preemphasis driver 462, and a pre-driver 463. Signal lines for transferring the input signals SSi to SS4 to the data latches 431 to 434, signal lines for transferring the outputs of the data latches 431 to 434 to the flip-flops 451 to 454, and signal lines for transferring the outputs of the flip-flops 451 to 454 to the multiplexer 400 are, for example, 4-channel, 312.5-MHz data lines. Signal lines for transmitting the outputs DD and /DD (S1 and /S1) of the preemphasis driver 462 and pre-driver 463 are, for example, complementary (differential) 1.25-Gbps signal lines.

The preemphasis driver 462 adjusts the levels of output signals by emphasizing the edges of waveforms of the signals in response to an emphasis control signal CSO and data carried by the signals SS1 to SS4 and provides complementary signals.

Figure 17:
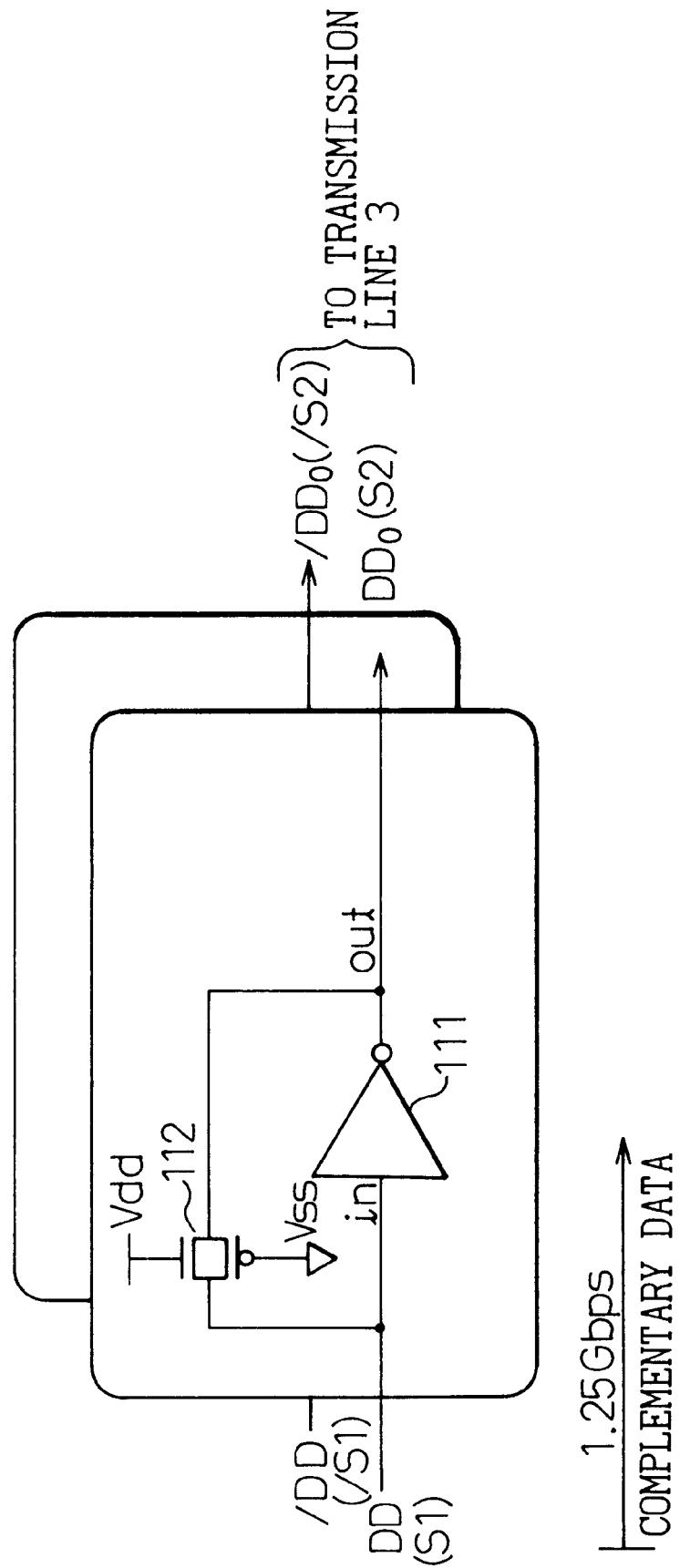
FIG. 17 shows an output driver of the driver circuit of FIG. 15.

FIG. 17 shows an example of the output driver of the driver circuit of FIG. 15.

The signals DD and /DD (S2 and /S2) provided by the multiplexer 400 of the front driver 4 are complementary signals of, for example, 1.25 Gbps and are supplied to the output driver 1, which provides complementary signals DD0 and /DD0 (S2 and /S2) to the transmission line 3. The output driver 1 consists of two drivers for amplifying the complementary signals DD (S1) and /DD (/S1), respectively, with each driver consisting of an inverter 111 and a transfer gate 112 that feeds the output of the inverter 111 back to the input thereof.

Figure 18:
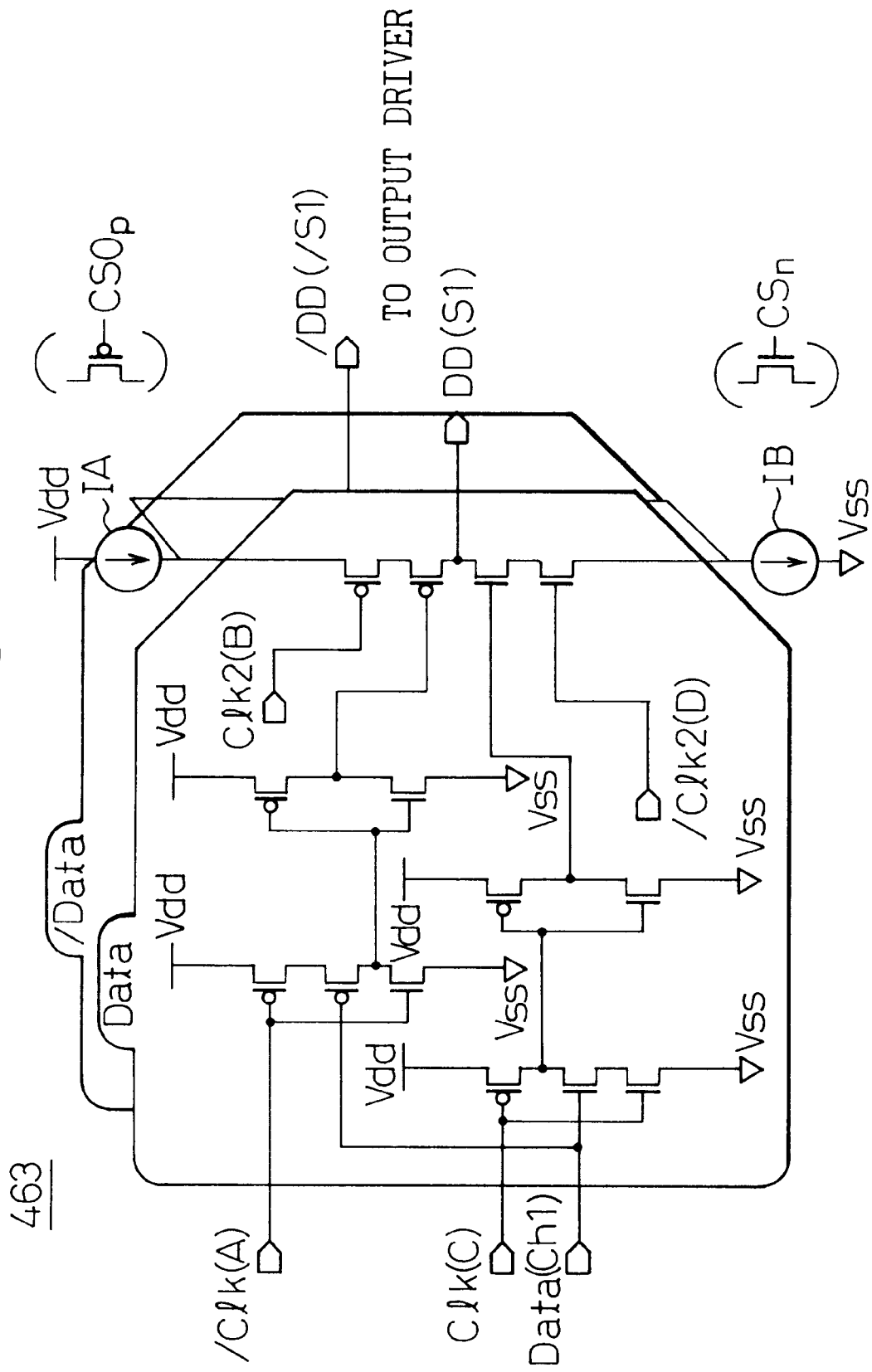
FIG. 18 shows a pre-driver of the front driver of FIG. 16.

FIG. 18 shows an example of the pre-driver 463 of the front driver 4 of FIG. 16.

The pre-driver 463 is arranged for each of the complementary signals Data (DD) and /Data A/DD) in each of the channels Ch1 to Ch4. Four-phase clock signals Clk(A), Clk(B), Clk(C), and Clk(D) have different rise timing shifted by 90 degrees from one another. These signals are used to sequentially select (multiplex) data of the channels Ch1 to Ch4 of, for example, 312.5 MHz to generate the complementary output signals DD and /DD of 1.25 GHz.

The preemphasis driver 462 is basically the same as the pre-driver 463 of FIG. 18. The preemiphasis driver 462, however, emphasizes an output level according to the emphasis control signal CS0. For example, current sources IA and IB in the output stage of the preemphasis driver 462 are formed from PMOS and NMOS transistors, and the emphasis control signal CS0 (current control voltages CS0p and CS0n) is applied to the gates of these transistors, to emphasize the output level of the preemphasis driver 462.

The pre-driver 463 (or the preemphasis driver 462) of FIG. 18 is only an example, and any other arrangement is employable.

Figure 19:
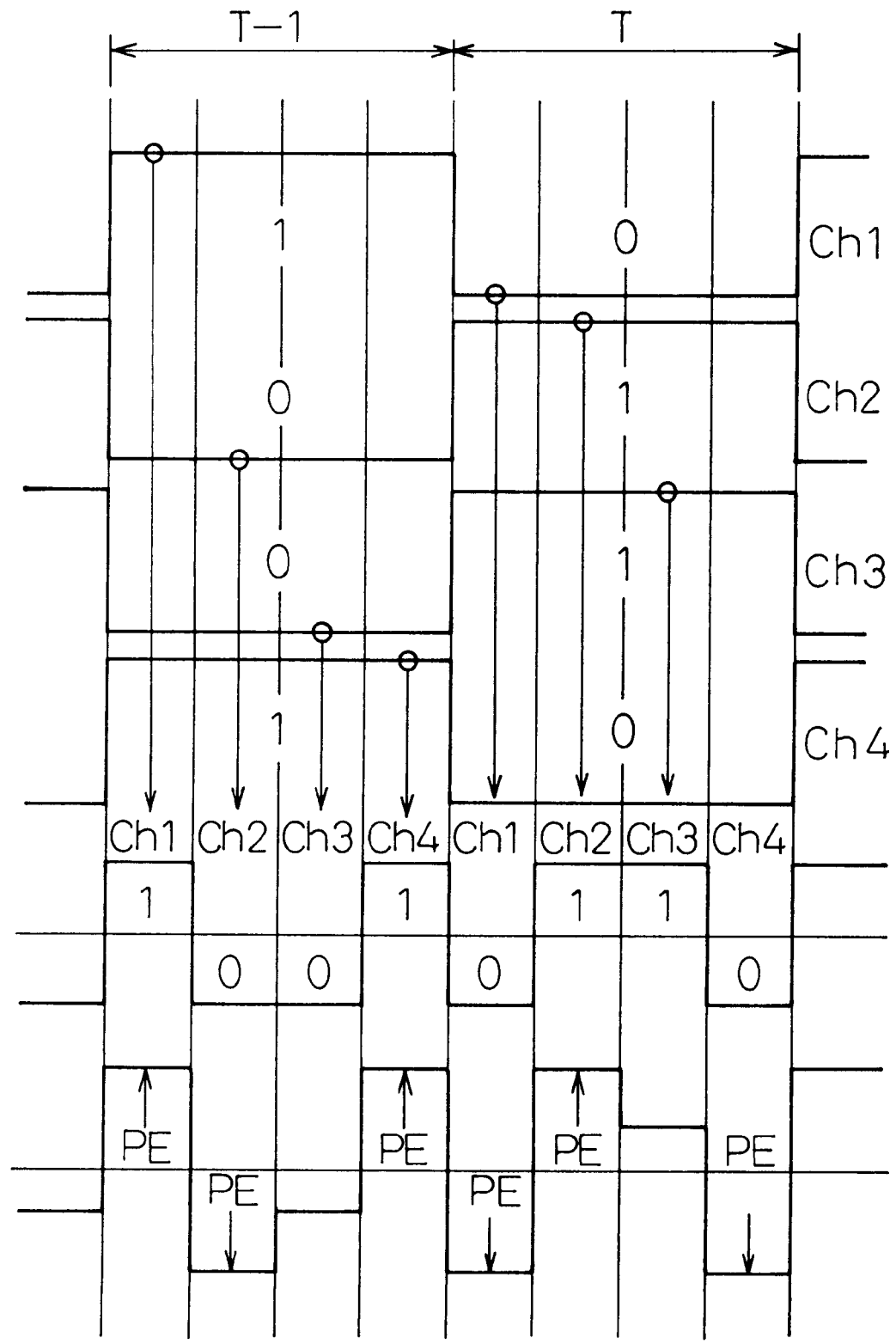
FIGS. 19 and 20 show simulation waveforms of the driver circuit of FIGS. 16 to 18.
Figure 20:
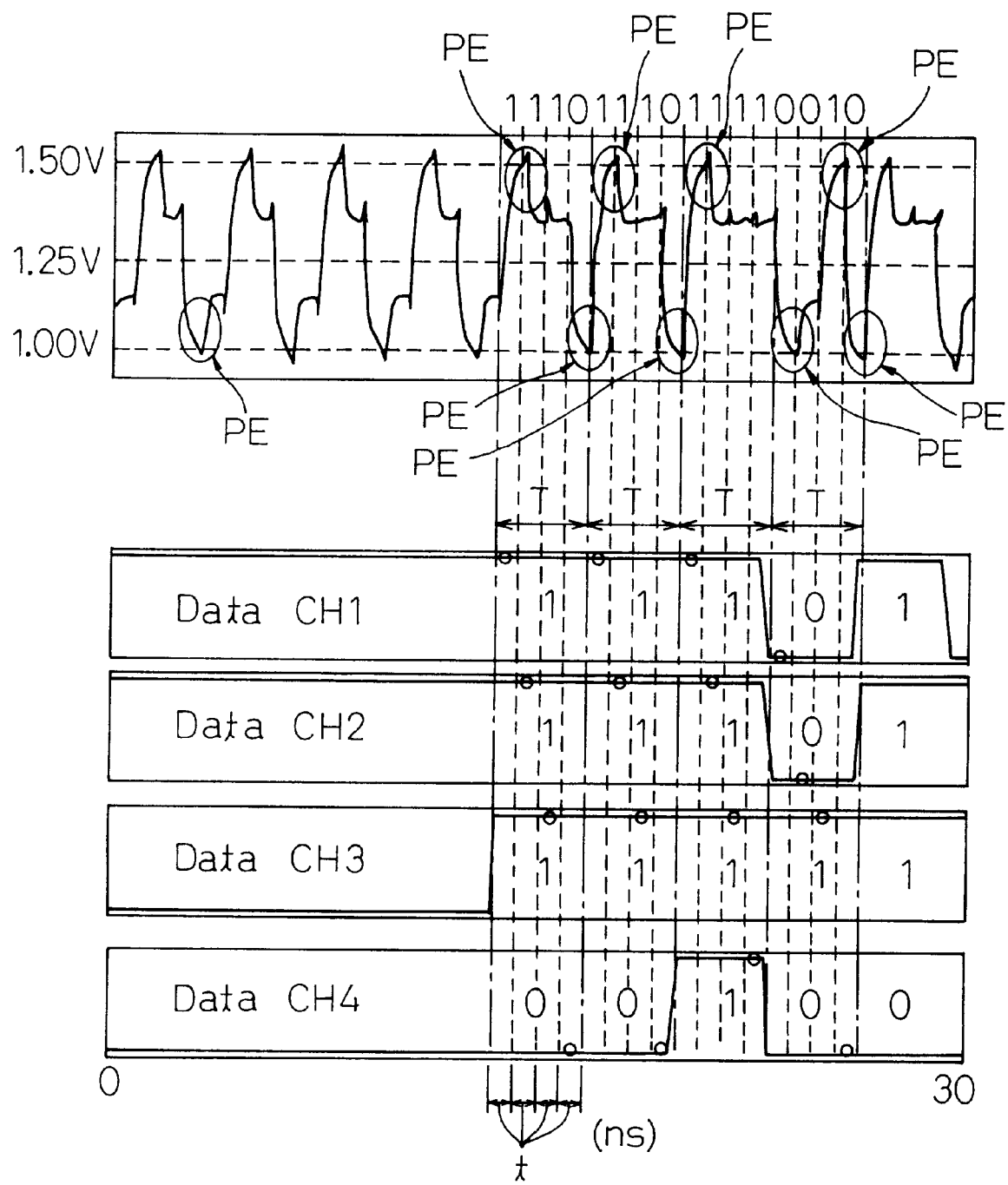

FIGS. 19 and 20 show simulation waveforms of the driver circuit of FIGS. 16 to 18.

In FIG. 19, the pre-drivers 463 of the multiplexer 400 sequentially select input data signals (T-1, T) of 312.5 MHz of the channels Ch1 to Ch4 (400a to 400d) in response to the 4-phase clock signals Clk(A) to Clk(D) and convert them into complementary output signals of 1.25 Gbps. At this time, the preemphasis drivers 462 of the channels Ch1 to Ch4 of the multiplexer 400 emphasize the levels of the output signals at 1.25 Gbps. The pre-driver 463 and preemphasis driver 462 of each channel provide the complementary output signals DI) and /DD.

As indicated with PE in FIGS. 19 and 20, a process of emphasizing the edge of an output waveform is carried out at each point of level inversion (from 1 to 0, or from 0 to 1). In FIG. 20, "T" is a period (3.2 ns) of data supplied at 312.5 MHz in each of the channels Ch1 to Ch4, and "t" is a period (0.8 ns) of the multiplexed complementary output signals DD and /DD of 1.25 Gbps.

Figure 21:
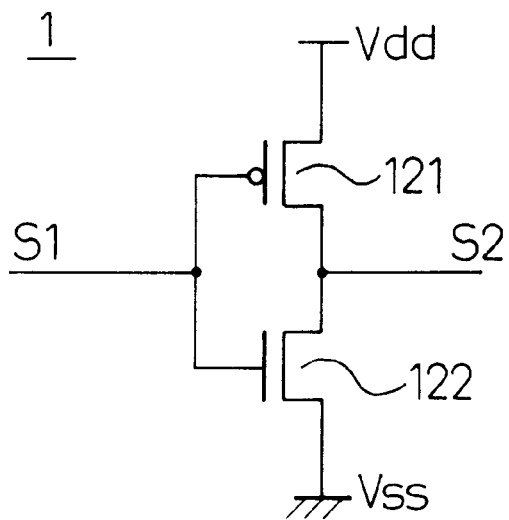
FIG. 21 shows an output driver of a driver circuit for transmitting signals according to a ninth embodiment of the first aspect of the present invention.

FIG. 21 shows an output driver of a driver circuit for transmitting signals according to the ninth embodiment of the first aspect of the present invention.

The output driver 1 is a push-pull circuit (inverter) composed of a source-grounded PMOS transistor 121 and a source-grounded NMOS transistor 122. Forming the output driver 1 as an inverter is advantageous in providing a rail-to-rail output range fully covering from a high-potential power source Vdd to a low-potential power source Vss.

Figure 22:
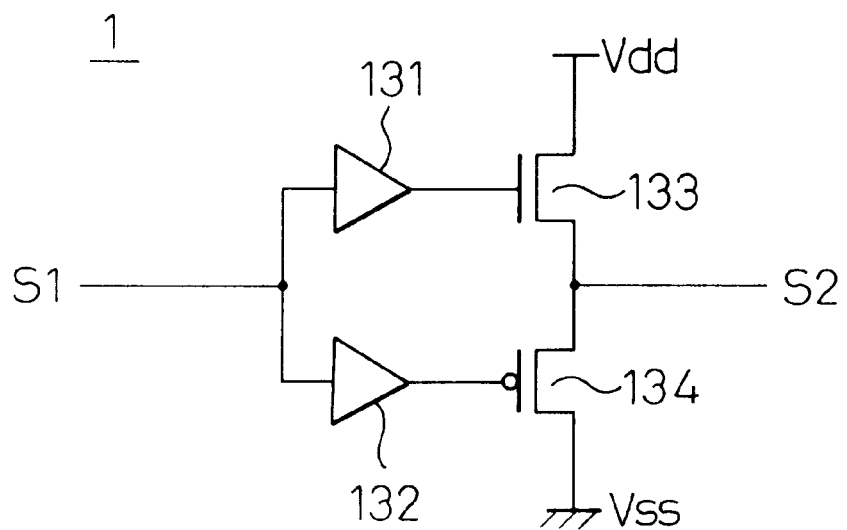
FIG. 22 shows an output driver of a driver circuit for transmitting signals according to a tenth embodiment of the first aspect of the present invention.

FIG. 22 shows an output driver of a driver circuit for transmitting signals according to the tenth embodiment of the first aspect of the present invention.

The output driver 1 is a source follower composed of a drain-grounded NMOS transistor 133 and a drain-grounded PMOS transistor 134. Amplifiers 131 and 132 shift gate voltages of the transistors 133 and 134 by threshold voltages of these transistors. In this embodiment, the amplifiers 131 and 132 provide offsets to minimize an ON period in which the transistors 133 and 134 are simultaneously ON.

Forming the output driver 1 as the source follower with the transistors 133 and 134 is advantageous in providing an output of low impedance and wide band.

Figure 23:
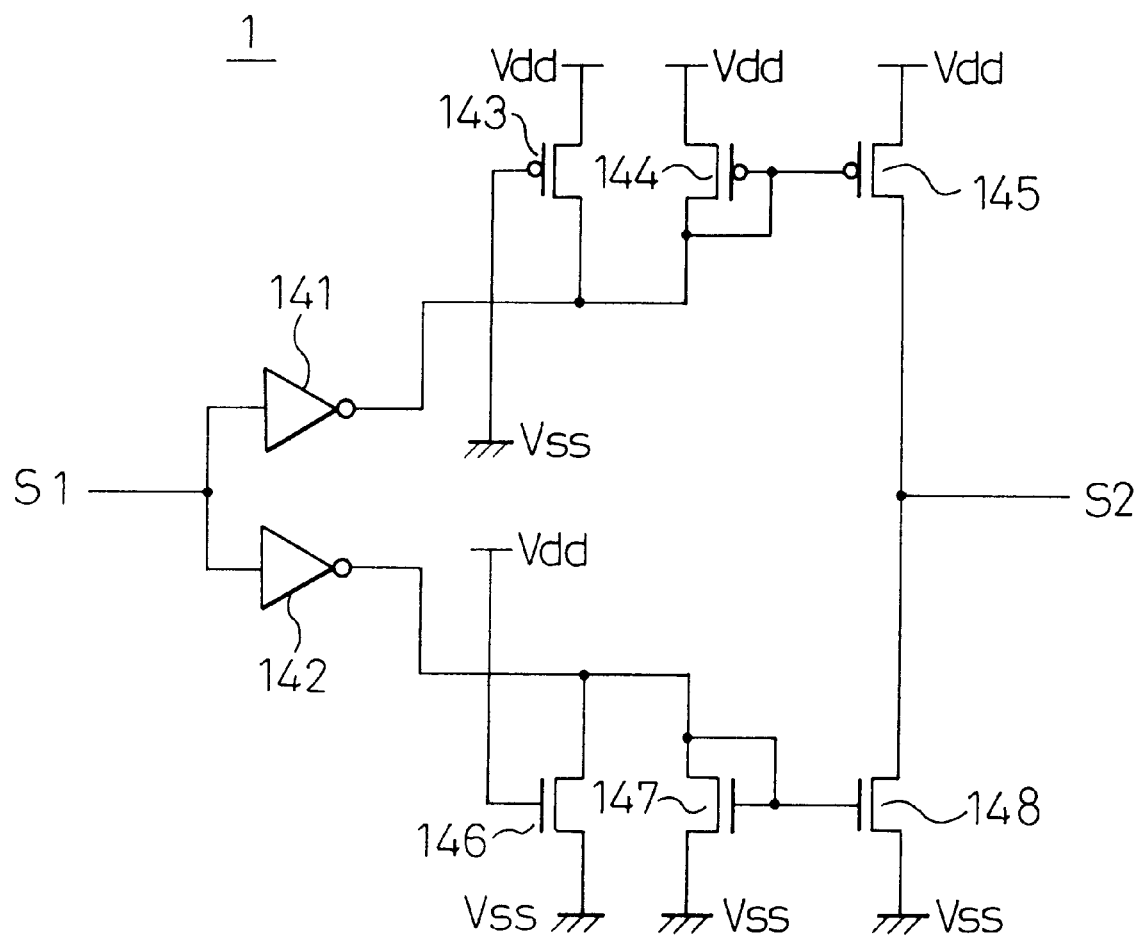
FIG. 23 shows an output driver of a driver circuit for transmitting signals according to an eleventh embodiment of the first aspect of the present invention.

FIG. 23 shows an output driver of a driver circuit for transmitting signals according to the eleventh embodiment of the first aspect of the present invention.

The output driver 1 has an inverter made of a PMOS transistor 145 and an NMOS transistor 148 in the last stage thereof, to provide an output range fully covering from a high source voltage Vdd to a low source voltage Vss. The gate of the PMOS transistor 145 is connected to a pull-up element (a PMOS transistor 144 of diode connection) to shift the gate potential of the PMOS transistor 145 to the high voltage Vdd. The gate of the NMOS transistor 148 is connected to a pull-down element (an NMOS transistor 147 of diode connection) to shift the gate potential of the NMOS transistor 148 to the low voltage Vss. This prevents the transistors 145 and 148 that form an inverter from simultaneously turning on, thereby preventing a through current and reducing current consumption. A PMOS transistor 143 and an NMOS transistor 146 function as resistors to stabilize the circuit. Inverters 141 and 142 for receiving a signal Si are made of small-sized transistors so that, unlike the last-stage inverter made of the transistors 145 and 148, the inverters 141 and 142 have no problem in current consumption.

Figure 24:
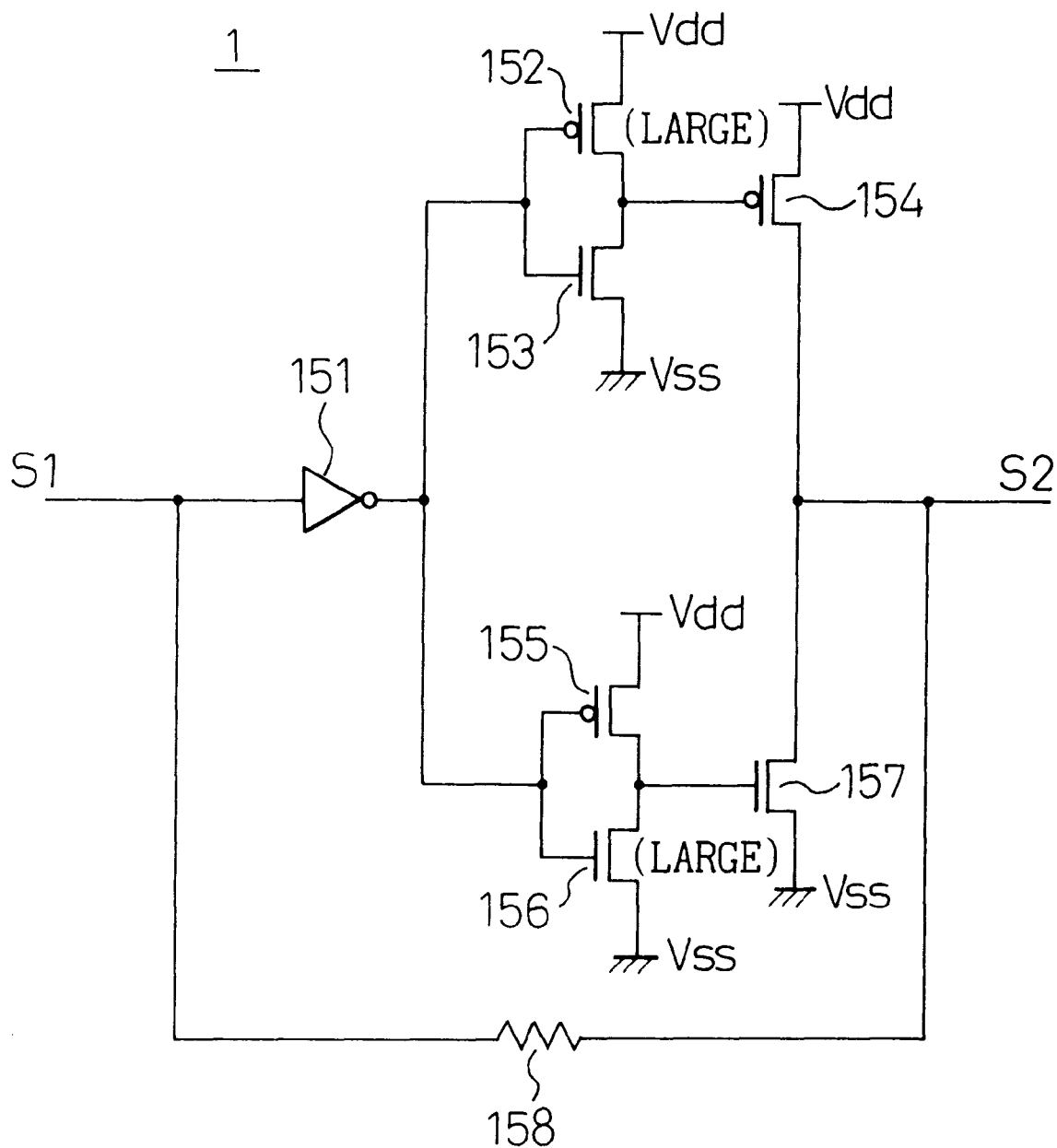
FIG. 24 shows a modification of the eleventh embodiment.

FIG. 24 shows a modification of the eleventh embodiment.

The last stage of an output driver 1 has an inverter made of a PMOS transistor 154 and an NMOS transistor 157 to provide an output range fully covering a high source voltage Vdd to a low source voltage Vss. The gate of the transistor 154 receives the output of an inverter made of a PMOS transistor 152 and an NMOS transistor 153. The gate of the transistor 157 receives the output of an inverter made of a PMOS transistor 155 and an NMOS transistor 156.

The size of the PMOS transistor 152 is larger than usual (by about 30%) so that it may actually function as a pull-up element (like the transistor 144 of FIG. 23). Similarly, the size of the NMOS transistor 156 is larger than usual (by about 30%) so that it may actually function as a pull-down element (like the transistor 147 of FIG. 23). An output terminal (S2) of the modification of FIG. 24 is connected to an input terminal (S1) thereof through a feedback resistor 158, to decrease the output impedance.

Figure 25:
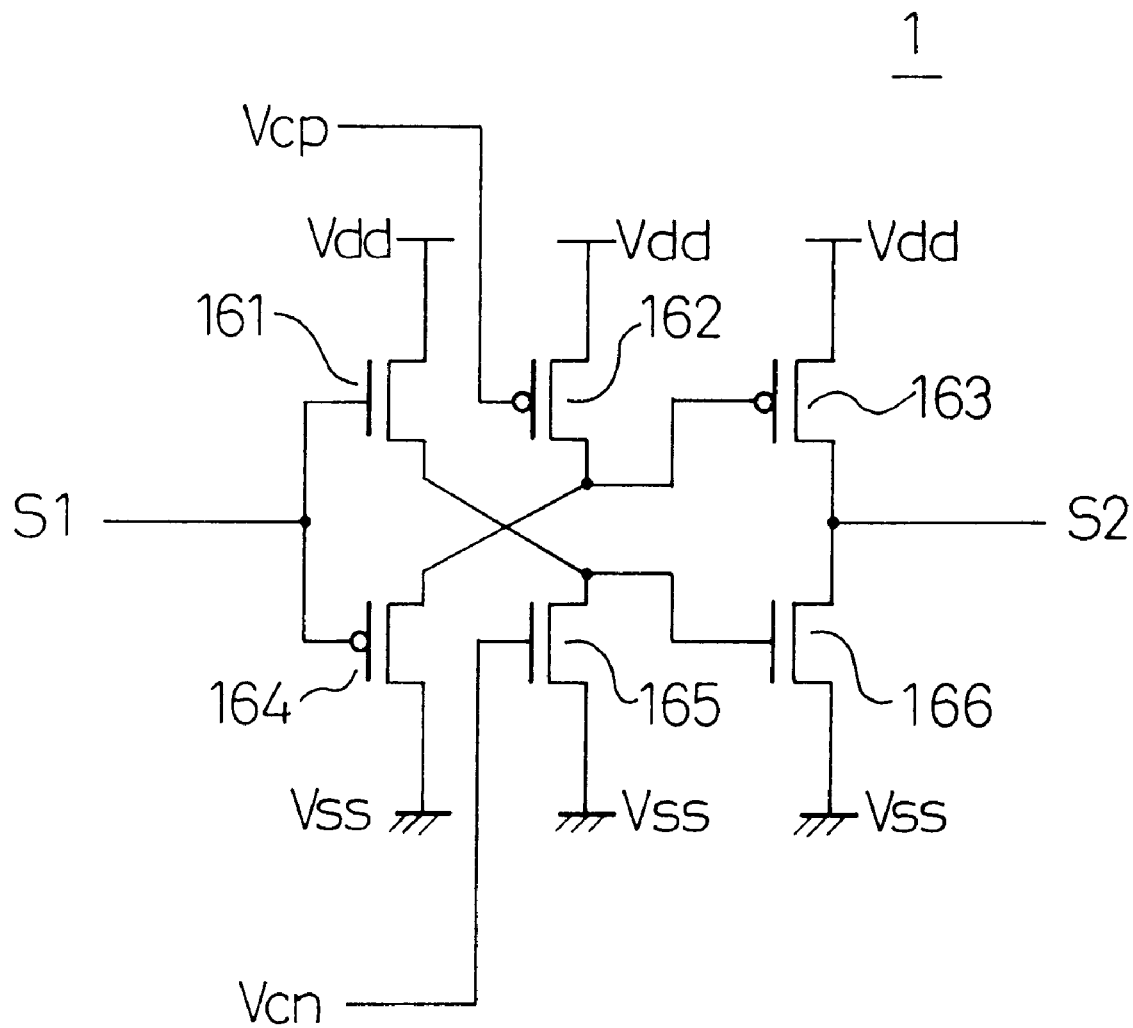
FIG. 25 shows an output driver of a driver circuit for transmitting signals according to a twelfth embodiment the first aspect of the present invention.

FIG. 25 shows an output driver of a driver circuit for transmitting signals according to the twelfth embodiment of the first aspect of the present invention.

A first stage of the output driver 1 is a source follower made of an NMOS transistor 161 and a PMOS transistor 164. The source follower drives an output stage made of source-grounded PMOS and NMOS transistors 163 and 166 through a PMOS transistor (pull-up element) 162 whose gate receives a control voltage Vcp and an NMOS transistor (pull-down element) 165 whose gate receives a control voltage Vcn.

The source follower made of the transistors 161 and 164 of the first stage causes a shift corresponding to a threshold voltage to reduce a period in which the transistors 163 and 166 of the output stage are simultaneously ON, thereby reducing power consumption. Since the output driver 1 consists of two amplifiers, i.e., the source follower (161, 164) and source-grounded circuit (163, 166), it realizes good frequency characteristics.

Figure 26:
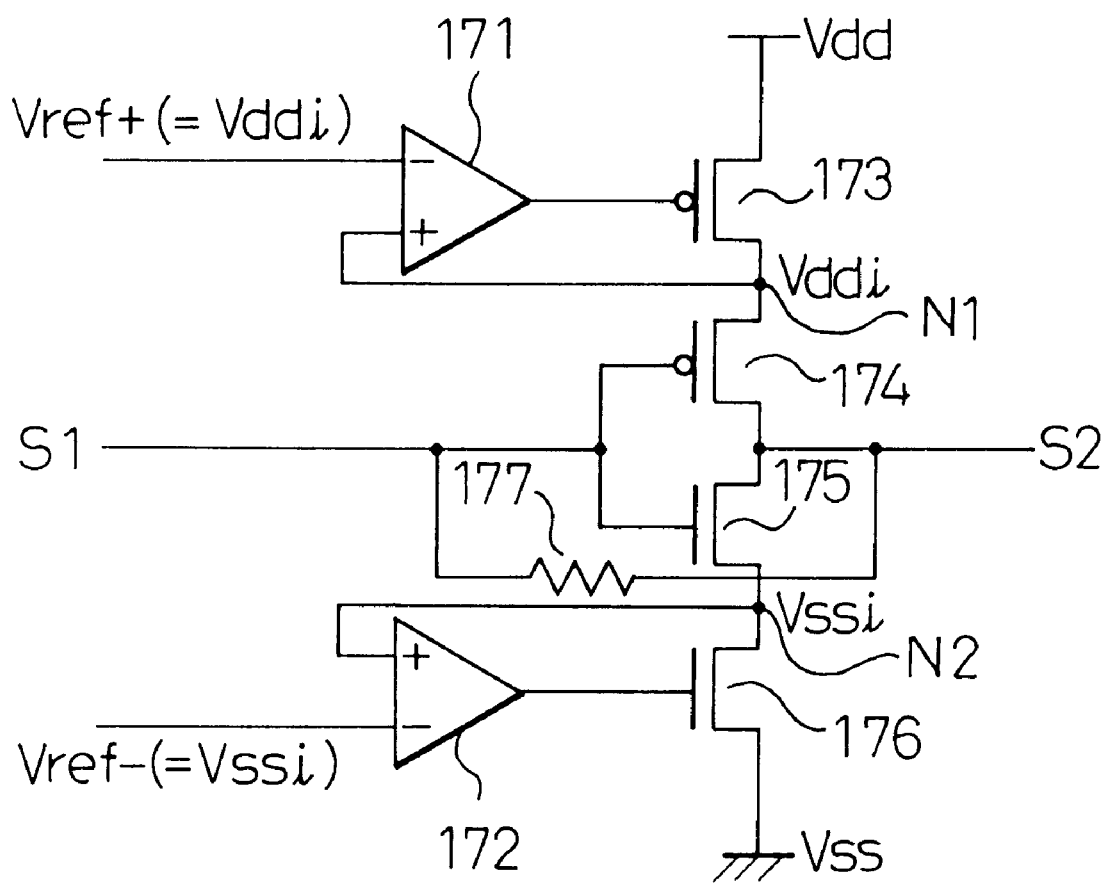
FIG. 26 shows an output driver of a driver circuit for transmitting signals according to a thirteenth embodiment of the first aspect of the present invention.

FIG. 26 shows an output driver of a driver circuit for transmitting signals according to the thirteenth embodiment of the first aspect of the present invention.

The output driver 1 basically consists of an inverter, which is composed of a PMOS transistor 174 and an NMOS transistor 175, and a feedback resistor 177 that connects output and input terminals of the inverter to each other. This arrangement changes source voltages applied to the inverter below and above usual ones (Vdd and Vss), to reduce a through current. Namely, a voltage Vddi is applied to the source (node N1) of the PMOS transistor 174, and a voltage Vssi is applied to the source (node N2) of the NMOS transistor 175. If the high source voltage vdd is 2.5 V, the voltage Vddi applied to the node N1 is about 2.1 V. If the low source voltage Vss is 0 V, the voltage Vssi applied to the node N2 is about 0.4 V. This arrangement is capable of reducing a current passing through the inverter (174, 175) by about one tenth.

In FIG. 26, an operational amplifier 171 and a PMOS transistor 173 generate the voltage Vddi, end an operational amplifier 172 and an NMOS transistor 176 generate the voltage Vssi. A negative logic terminal of the amplifier 171 receives a reference voltage Vref+(=Vddi), and a positive logic terminal thereof is connected to the node N1. The output of the amplifier 171 is connected to the gate of the transistor 173. The amplifier 171 controls the transistor 173 so that the node N1 is set to the reference voltage Vref+(=Vddi). Similarly, a negative logic terminal of the amplifier 172 receives a reference voltage Vref−(=Vssi), and a positive logic terminal thereof is connected to the node N2. The output of the amplifier 172 is connected to the gate of the transistor 176. The amplifier 172 controls the transistor 176 so that the node N2 is set to the reference voltage Vref−(=vssi).

In this way, the thirteenth embodiment forms the output driver 1 basically as the inverter (174, 175) having the feedback resistor 177. By lowering the high source voltage Vddi applied to the inverter to below the usual high source voltage Vdd and by increasing the low source voltage Vssi to above the usual low source voltage Vss, this embodiment decreases a through current passing the inverter, thereby reducing power consumption while securing proper frequency characteristics.

Figure 27:
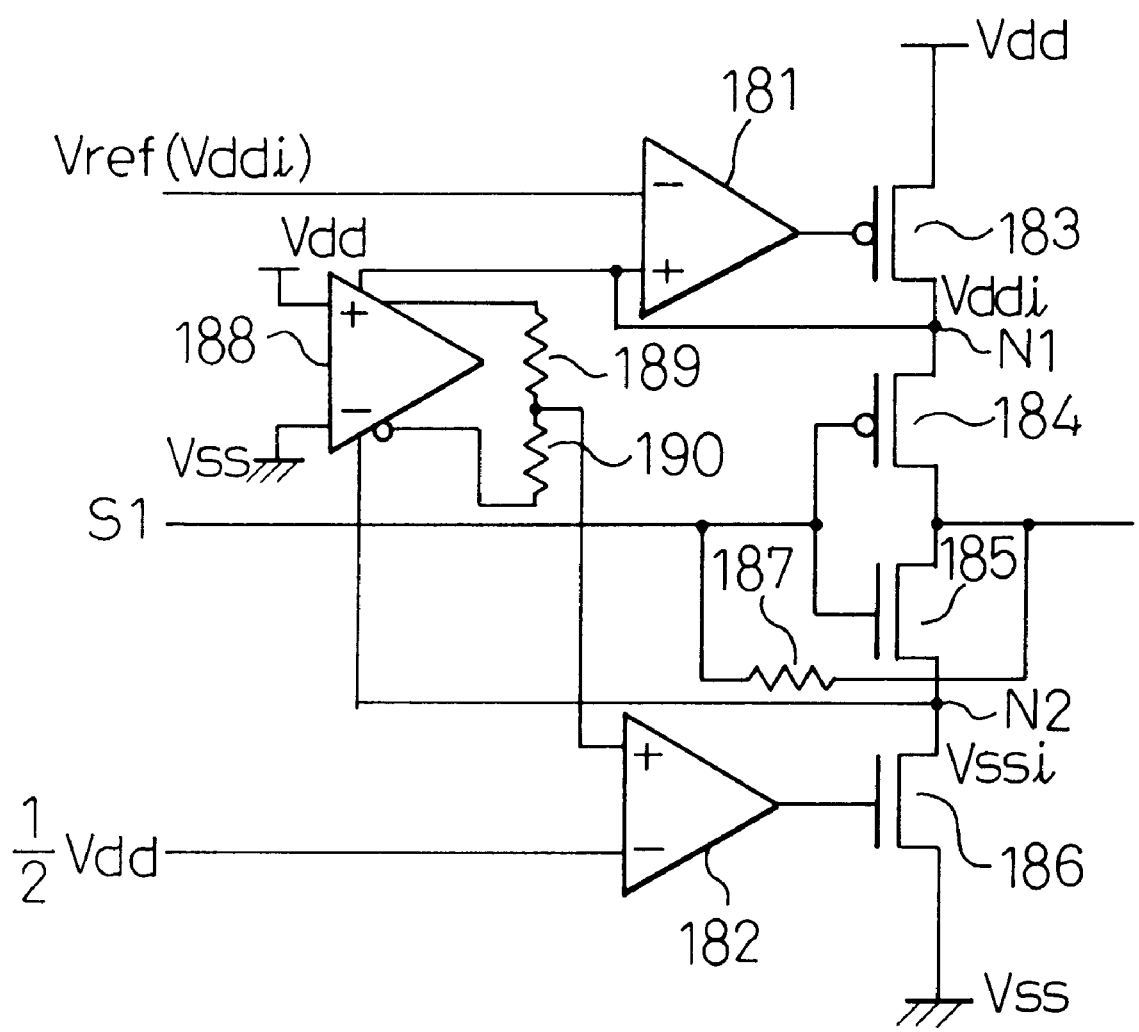
FIG. 27 shows a modification of the thirteenth embodiment.

FIG. 27 shows a modification of the thirteenth embodiment.

The modification forms an output driver 1 with an inverter, which is composed of a PMOS transistor 184 and an NMOS transistor 185, and a feedback resistor 187 that connects output and input terminals of the inverter to each other. Source voltages applied to the inverter are lower than the usual ones (Vdd and Vss), to reduce a through current. More precisely, a voltage Vddi is applied to the source (node N1) of the PMOS transistor 184, and a voltage Vssi is applied to the source (node N2) of the NMOS transistor 185. An operational amplifier 181 and a PMOS transistor 183 for generating the voltage Vddi are the same as those of FIG. 26. Elements for generating the voltage Vssi are different from those of FIG. 26.

Namely, a negative logic terminal of an operational amplifier 182 receives, as a reference voltage, an intermediate voltage of Vdd/2, and a positive logic terminal thereof receives an intermediate voltage from a replica driver 188 through resistors 189 and 190. The output of the amplifier 182 is connected to the gate of the transistor 186. Source voltages for the replica driver 188 are the voltages Vddi and Vssi at the nodes N1 and N2, so that an intermediate voltage between the voltages Vddi and Vssi is equalized with an intermediate voltage (Vdd/2) between the usual source voltages Vdd and Vss.

Figure 28:
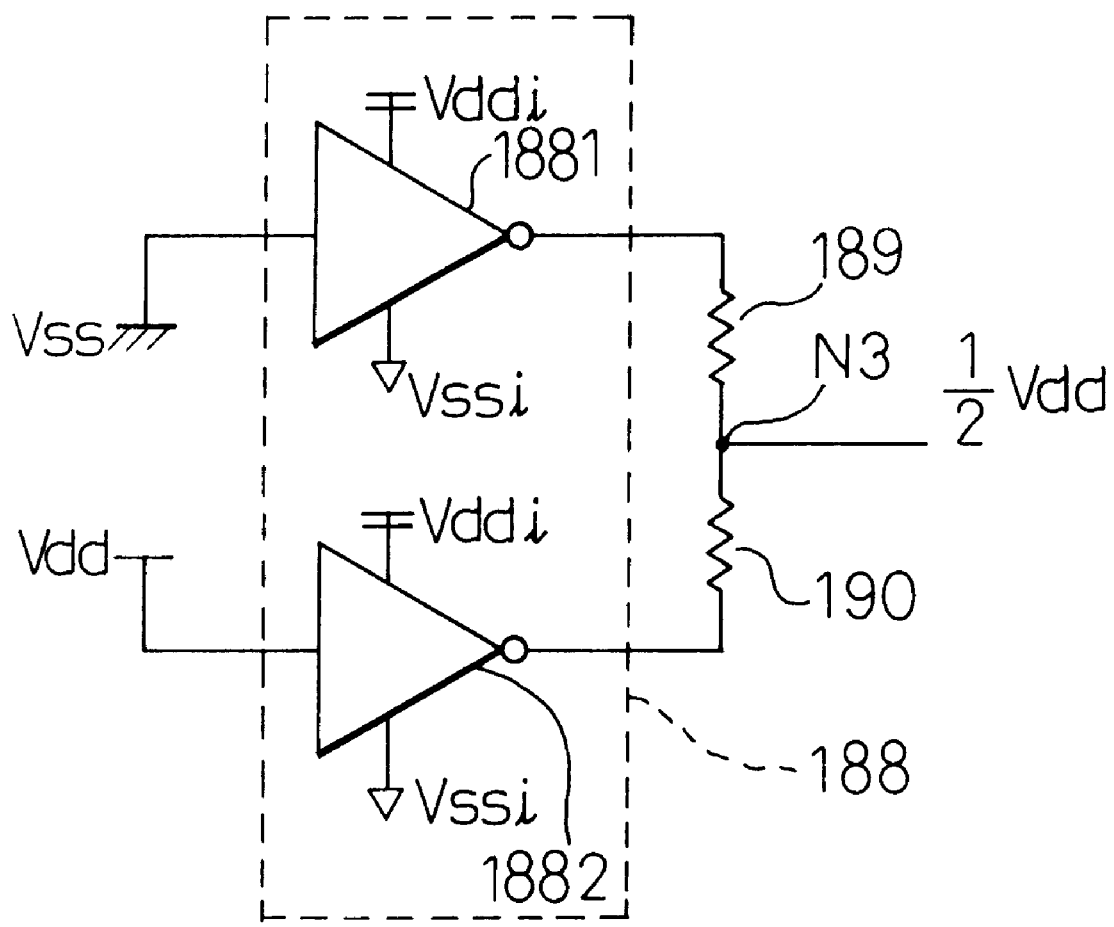
FIG. 28 shows a replica driver of the modification of FIG. 27.

FIG. 28 shows the replica driver of FIG. 27.

The replica driver 188 consists of an inverter 1881 that receives the low source voltage Vss and an inverter 1882 that receives the high source voltage Vdd. The voltage Vddi at the node N1 and the voltage Vssi at the node N2 are applied as source voltages to the inverters 1881 and 1882. The inverters 1881 and 1882 are made of small-sized transistors to minimize the steady currents flowing thereto.

The output of the inverter 1881 is the voltage Vssi, and the output of the inverter 1882 is the voltage Vddi. These voltages are applied to ends of the resistors 189 and 190 having an identical resistance value. A node N3 between the resistors 189 and 190 provides a signal (voltage) applied to the positive logic terminal of the amplifier 182. The voltage at the node N3 is an intermediate voltage between the voltages Vssi and Vddi. The amplifier 182 controls the transistor 186 to control the node N2, so that the intermediate voltage at the node N3 is equal to the intermediate voltage Vdd/2 between the source voltages Vdd and Vss.

Even if the characteristics of transistors suffer from manufacturing variations, the thirteenth embodiment and its modification of FIGS. 27 and 28 correctly control the voltages Vddi and Vssi applied to the output inverter (184, 185) of the output driver.

As explained above in detail, each of the driver circuits of the first aspect of the present invention is capable of preventing waveform distortion and inter-code interference that occur on signals transmitted through a transmission line, thereby correctly transmitting the signals through the transmission line.

Figure 29:
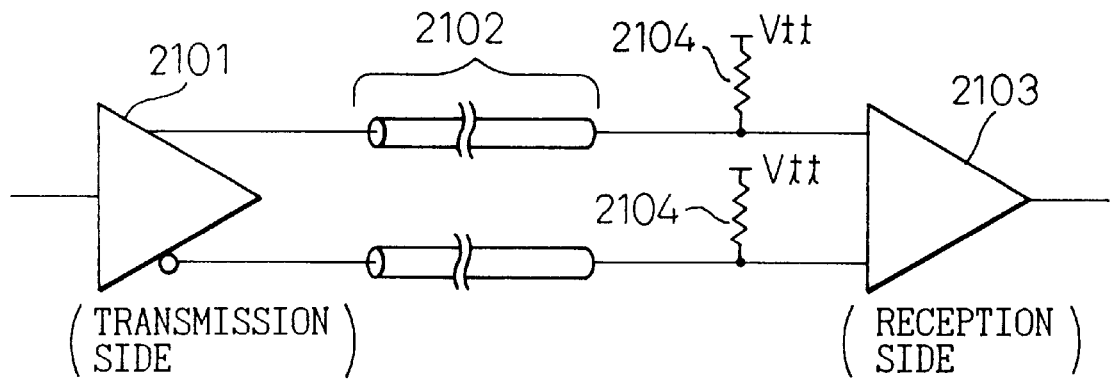
FIG. 29 shows a signal transmission system according to a prior art.

FIG. 29 shows a signal transmission system according to a prior art. The system includes a differential driver 2101, a cable 2102, a differential receiver 2103, and a terminating resistor 2104.

High-speed signal transmission between circuit boards and between apparatuses, for example, between a server and a main storage device is carried out in a differential manner. The differential driver 2101 is installed on a server (a main storage device) serving as a signal transmitter, and the receiver 2103 is installed on a main storage device (a server) serving as a receiver. The terminating resistor 2104 connected to a terminating voltage Vtt is installed on the differential input side of the receiver 2103. The differential (complementary) signal transmission is used not only between circuit boards or between apparatuses but also between elements and circuit blocks in a chip if the amplitudes of signals used are small.

It is relatively easy for the system cf FIG. 29 to improve the operation speed of the differential driver 2101. However, it is difficult to improve the operation speed of the receiver 2103. In the case of signal transmission between a server and a main storage device, the characteristics of the receiver 2103 determine the performance of the system.

More precisely, differential signals transmitted from the differential driver 2101 through the cable 2102 are differentially amplified by a differential amplifier arranged in the receiver 2103. Factors that prevent a high-speed operation in the system of the prior art are attenuation in the high-frequency components of signals in the cable 2102 and a limited frequency band of the differential amplifier of the receiver 2101. If a signal transmission speed is increased to several hundred Mbps to several Gbps, standard differential amplifiers are unable to secure high-speed operation.

In addition, the receiver 2103 of the prior art is unable to effectively remove a common-mode voltage (an average of the voltages of two signal lines; for transmitting differential signals) under high-speed conditions, and therefore, is unable to correctly detect and receive signals at high speed. To remove the common-mode voltage, some prior arts employs transformers, which increase cost and space.

Receiver circuits and signal transmission systems according to the second aspect of the present invention will be explained in detail with reference to the drawings.

The second aspect employs a capacitor network having capacitors for accumulating charge and switches for controlling input signals to the capacitors. The second aspect also employs a comparator having inverters for amplifying the outputs of the capacitor network and a common-mode feedback circuit for receiving the outputs of the inverters and maintaining a common-mode voltage substantially at a fixed value. With these arrangements, the receiver circuits and signal transmission systems of the second aspect are capable of correctly transmitting signals at high speed.

Figure 30:
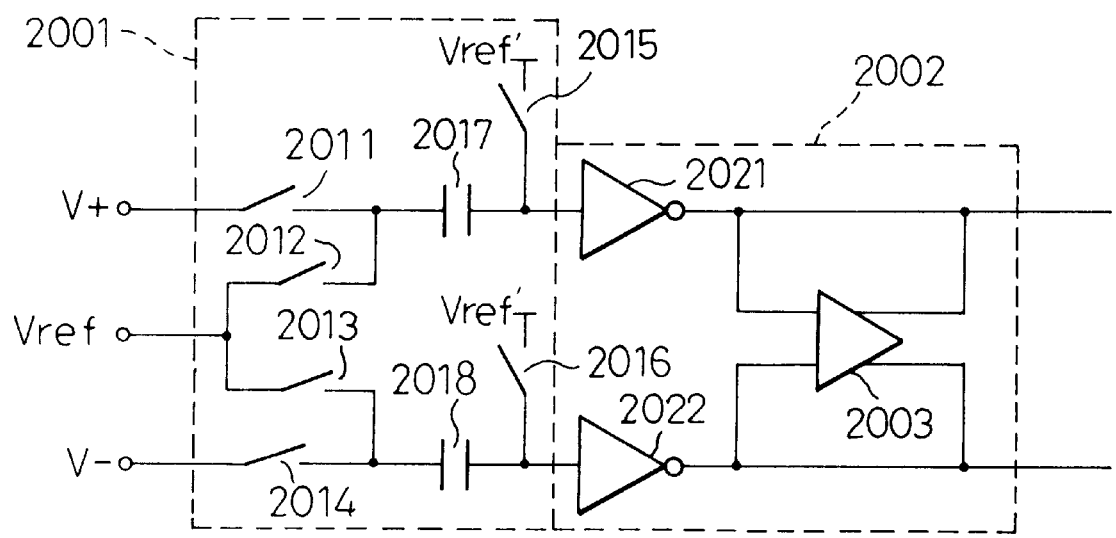
FIG. 30 shows the principle of a receiver circuit according to the second aspect of the present invention.

FIG. 30 shows the principle of a receiver circuit according to the second aspect of the present invention. The receiver circuit has a capacitor network 2001 and a comparator 2002.

The capacitor network 1 is composed of switches 2011 to 2016 and capacitors 2017 and 2018. An input terminal V+is connected to an input terminal of an inverter 2021, which is at an input terminal of the comparator 2002, through the switch 2011 and capacitor 2017 that are connected in series. An input terminal V− is connected to an input terminal of an inverter 2022, which is at another input terminal of the comparator 2002, through the switch 2014 and capacitor 2018 that are connected in series.

A node between the switch 2011 and the capacitor 2017 and a node between the switch 2014 and the capacitor 2018 receive a first reference voltage Vref through the switches 2012 and 2013. A node between the capacitor 2017 and the inverter 2021 and a node between the capacitor 2018 and the inverter 2022 receive a second reference voltage Vref' through the switches 2015 and 2016. The capacitor network 1 removes a common-mode voltage contained in differential signals to some extent. The common-mode voltage corresponds to an average of voltages in two signal lines that transmit the differential signals.

The comparator 2002 consists of the inverters 2021 and 2022 and a common-mode feedback circuit 2003. The comparator 2002 amplifies the outputs of the capacitor network 2001 at high speed in high bands arid further removes the common-mode voltage by feedback.

Figure 31:
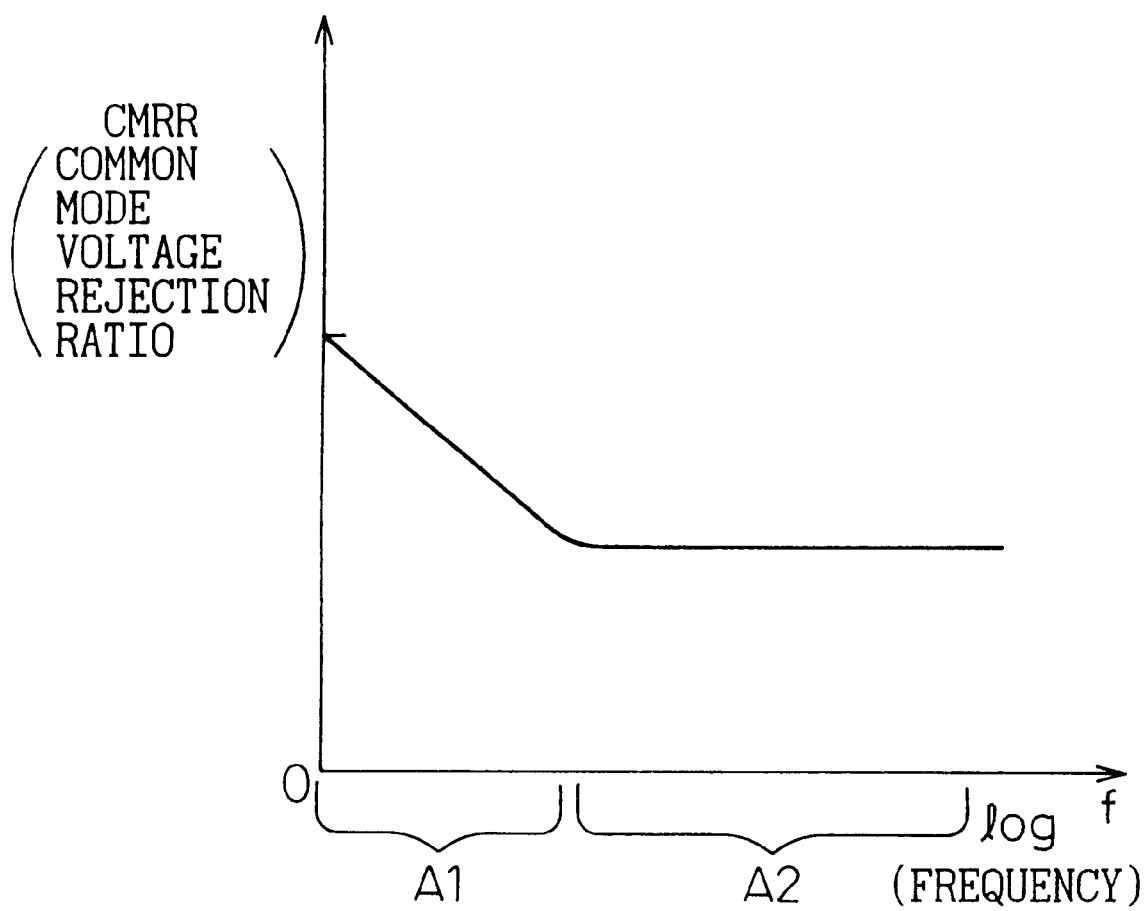
FIG. 31 shows the removal of a common mode voltage in the receiver circuit of FIG. 30.

FIG. 31 shows removal of the common-mode voltage by the receiver circuit of FIG. 30. An ordinate represents common-mode voltage rejection ratios (CMRRs) and an abscissa represents frequencies (log f).

In a low-frequency region A1 of, for example, direct current to several KHz, the capacitor network 2001 removes the common-mode voltage. In a high-frequency region A2 above several KHz, the comparator 2002 further removes the common-mode voltage.

Namely, the capacitor network 2001 alternates the accumulation of signal voltages, the precharge of the input terminals of the comparator 2002, and the supply of signals to the comparator 2002, to remove the common-mode voltage contained in differential signals t-o some extent. As shown in FIG. 31, the lower the frequency, the move the common-mode voltage is removed by the capacitor network 2001. The capacitor network 2001 sufficiently removes DC components in the common-mode voltage.

The comparator 2002 amplifies the signals from which common-mode voltage has been removed to some extent. This amplification is achieved not by a usual differential amplifier but by a high-speed, high-band amplifier made of the inverters 2021 and 2022. The common-mode voltage remaining in the outputs of the inverters 2021 and 2022 is removed and stabilized by feedback by the common-mode feedback circuit 2003.

In this way, the receiver circuit of the second aspect of the present invention employs not: a usual differential amplifier but an amplifier made of inverters to operate at high speed and low voltage. The receiver circuits and signal transmission systems based on the second aspect of the present invention are capable of correctly transmitting signals at high speed.

Figure 32:
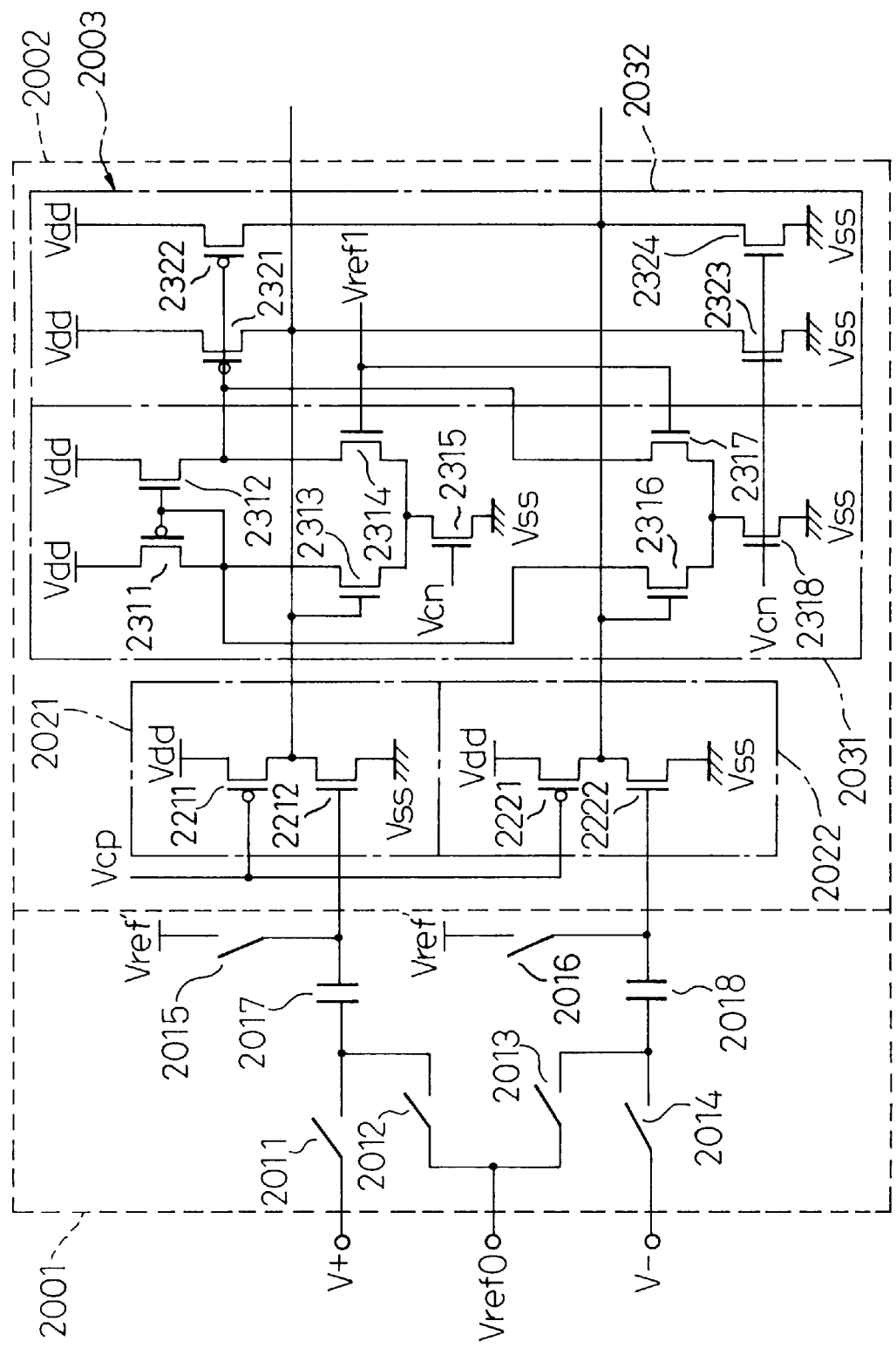
FIG. 32 shows a receiver circuit according to a first embodiment of the second aspect of the present invention.

FIG. 32 shows a receiver circuit according to the first embodiment of the second aspect of the present invention. The receiver circuit has a capacitor network 2001, a comparator 2002, and a common-mode feedback circuit 2003.

The capacitor network 2001 consists of switches 2011 to 2016 and capacitors 2017 and 2018. An input terminal V+ is connected to an input terminal of an inverter 2021, which is at an input terminal of the comparator 2002, through the switch 2011 and capacitor 2017 that are connected in series. An input terminal V− is connected to an input terminal of an inverter 2022, which is at another input terminal of the comparator 2002, through the switch 2014 and capacitor 2018 that are connected in series.

A node between the switch 2011 and the capacitor 2017 and a node between the switch 2014 and the capacitor 2018 receive a first reference voltage Vref0 through the switches 2012 and 2013, respectively. A node between the capacitor 2017 and the inverter 2021 and a node between the capacitor 2018 and the inverter 2022 receive a second reference voltage Vref' through the switches 2015 and 2016, respectively. The capacitor network 2001 removes a common-mode voltage (an average of voltages in two signal lines that transmit differential signals) to some extent in the region A1 of FIG. 31.

The first reference voltage Vref0 is determined according to the specifications of an interface connected to the receiver circuit between apparatuses. For example, the first reference voltage Vref0 is an intermediate voltage of the amplitudes of signals handled by the interface. The second reference voltage Vref' is one that is proper for internal circuits of the receiver circuit. For example, it is a bias voltage for optimizing the operations of the inverters 2021 and 2022 of the comparator 2002.

In a first phase, the switches 2011 and 2014 are opened and the switches 2012 and 2013 are closed. At the same time, the switches 2015 and 2016 are closed to charge the capacitors 2017 and 2018 and precharge the input terminals of the comparator 2002. Namely, a bias voltage is applied to optimize the operations of the inverters 2021 and 2022. In a second phase, the switches 2011 and 2014 are closed and the switches 2012, 2013, 2015, and 2016 are opened to transfer the voltages of differential signals (complementary signals) to the inverters 2021 and 2022 of the comparator 2002 through the capacitors 2017 and 2018. These first and second phases are repeated to remove a common-mode voltage contained in the differential signals to some extent. The lower the frequency, the larger the common-mode voltage and DC components removed by the capacitor network 2001.

The comparator 2002 has the inverters 2021 and 2022 and common-mode feedback circuit 2003 to amplify the outputs of the capacitor network 2001 at high speed in high bands, to further remove the common-mode voltage by feedback.

The inverters 2021 and 2022 are each a single-end inverter. The inverter 2021 consists of a PMOS transistor 2211 and an NMOS transistor 2212, and the inverter 2022 consists of a PMOS transistor 2221 and an a NMOS transistor 2222. The differential input signals are supplied to the gates of the NMOS transistors 2212 and 2222, respectively. A predetermined bias voltage Vcp is applied to the gates of the PMOS transistors 2211 and 2221 so that these transistors serve as constant-current load. To reduce input capacitance (gate capacitance) and improve operation speed, the inverters 2021 and 2022 are each preferred to be a constant-current-load inverter with an NMOS input as shown in FIG. 32. Ii they are arranged in a first stage to receive signals from a cable (2102), they may be each a usual CMOS inverter because input capacitance is not so critical in such a case. Here, the usual CMOS inverter is one that commonly receives an input signal at the gates of the PMOS and the NMOS transistors thereof.

The common-mode feedback circuit 2003 consists of a detector 2031 and a feedback unit 3032. The detector 2031 is a current-mirror differential amplifier having two input transistor pairs and includes a PMOS transistor 2311 and NMOS transistors 2312 to 2318. The feedback unit 2032 includes PMOS transistors 2321 and 2322 and NMOS transistors 2323 and 2324. In the detector 2031, the two transistor pairs 2313–2314 and 2316–2317 detect a difference between a reference voltage Vref1 and the outputs of the inverters 2021 and 2022 and are connected to the common transistors 2311 and 2312. In the feedback unit 2032, the PMOS transistors 2321 and 2322 receive the output of the detector 2031, and the NMOS transistors 2323 and 2324 receive a predetermined bias voltage Vcn. A node between the transistors 2321 and 2323 is connected to the output of the inverter 2021, and a node between the transistors 2322 and 2324 is connected to the output of the inverter 2022. The gates of the transistors 2315 and 2318 receive the bias voltage Vcn.

In the common-mode feedback circuit 2003, the detector 2031 provides the sum (corresponding to a common-mode voltage) of the outputs of the inverters 2021 and 2022, and the feedback unit 2032 carries out a feedback operation to cancel the common-mode voltage. Namely, the common-mode feedback circuit 2003 further reduces the common-mode voltage, which has been reduced to some extent by the capacitor network 2001, even in a high-frequency region (the region A2 of FIG. 31).

The receiver circuit of the first embodiment employs the inverters 2021 and 2022 to obtain a differential gain so that the receiver circuit operates with low voltage. Being combined with the capacitor network 2001, the common-mode feedback circuit 2003 of a simple structure is capable of realizing a large common-mode voltage rejection ratio (CMRR) and high-speed operation.

FIG. 33 shows a receiver circuit according to the second embodiment of the second aspect of the present invention. More specifically, this embodiment describes a capacitor network 2001 that is a partial response detector (PRD). The capacitor network 2001 includes switches 2111, 2112, 2141, 2142, 2015, and 2016 and capacitors 2171, 2172, 2181, and 2182.

Figure 35:
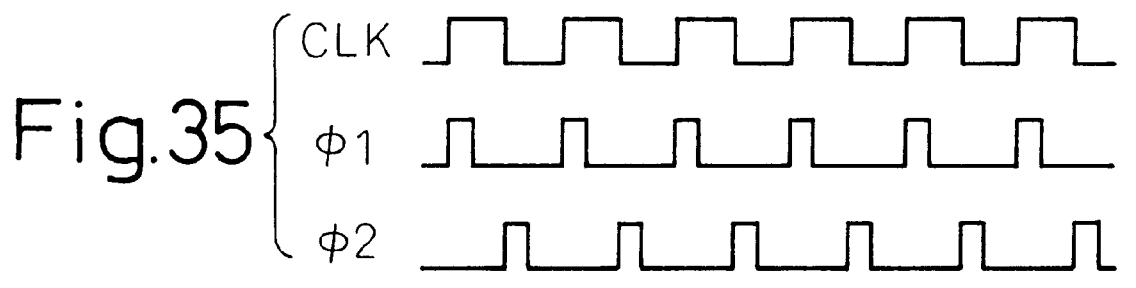

FIG. 34 shows an example of the capacitor network 2001 of the receiver circuit of FIG. 33, and FIG. 35 shows the timing of control signals used by the capacitor network 2001.

In FIG. 34, the capacitor network 2001 consists of the capacitors 2171, 2172, 2181, and 2182 and transfer gates 2111, 2112, 2141, 2142, 2015, and 2016. The switching of the transfer gates 2111 and 2142 is controlled by control signals $\phi 2$ and $\phi 2$, and the switching of the transfer gates 2112, 2141, 2015, and 2016 is controlled by control signals $\phi 1$ and $/\phi 1$. Here, the signals $/\phi 1$ and $/\phi 2$ are inverted logic signals of the signals $\phi 1$ and $\phi 2$. Timing relationships between the control signals $\phi$ and $\phi 2$ and a clock signal CLK are as shown in FIG. 35.

Figure 36A:
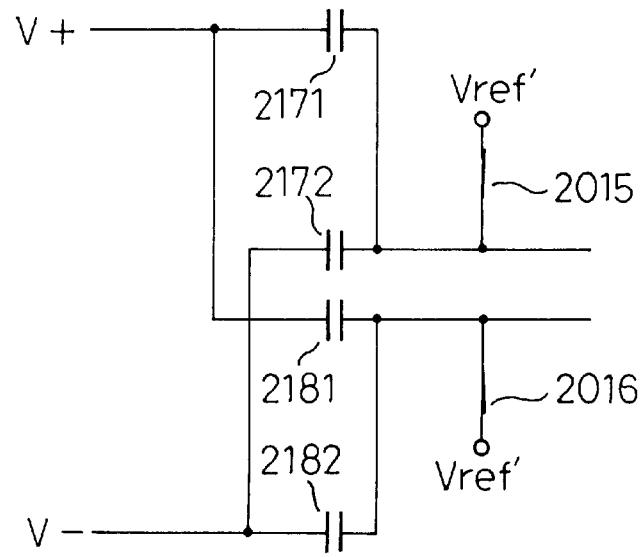
FIGS. 36A and 36B show the operation of the capacitor network of FIG. 34.
Figure 36B:
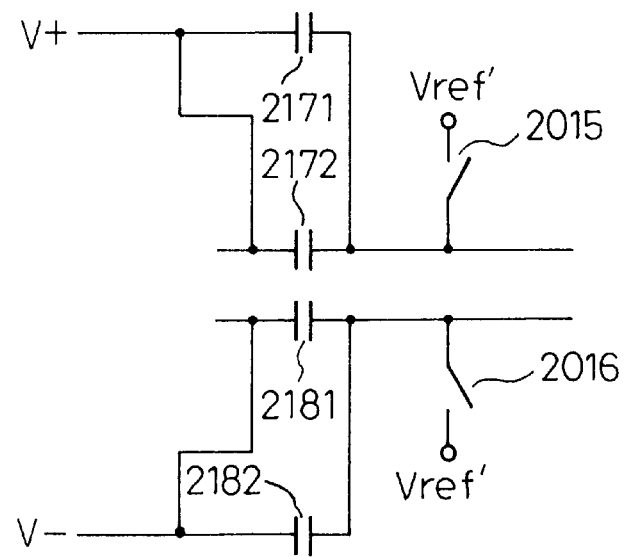

FIGS. 36A and 36B show the operations of the capacitor network 2001 of FIG. 34.

By controlling the control signals $\phi 1$ and $\phi 2$, the capacitor network 2001 alternates the operations of FIGS. 36A and 36B.

If the control signal $\phi 1$ is high ($/\phi 1$ being low) and the control signal $\phi 2$ is low ($/\phi 2$ being high), an inter-code interference estimation of FIG. 36A is carried out. If the control signal $\phi 1$ is low and the control signal $\phi 2$ is high, a signal determining operation of FIG. 36B is carried out. While the inter-code interference estimation is being carried out, input nodes to the comparator 2002 are precharged.

The inter-code interference can completely be estimated in theory if the capacitance C1 of the capacitors 2171 and 2182 and the capacitance C2 of the capacitors 2172 and 2181 satisfy the following:

$$C1/(C1+C2)=(1+\exp(-T/\tau))/2$$

where $\tau$ is the time constant of a cable (bus) and T is a 1-bit period in which data for one bit appears on the bus. In practice, however, there is parasitic capacitance, and therefore, an approximate capacitor ratio is adopted based on the above equation.

In this way, the second embodiment employs the partial response detection for the capacitor network to remove a common-mode voltage and estimate the inter-code interference caused in a transmission line. As a result, the second embodiment realizes high-speed signal transmission even with a cable employing thin core wires.

Figure 37:
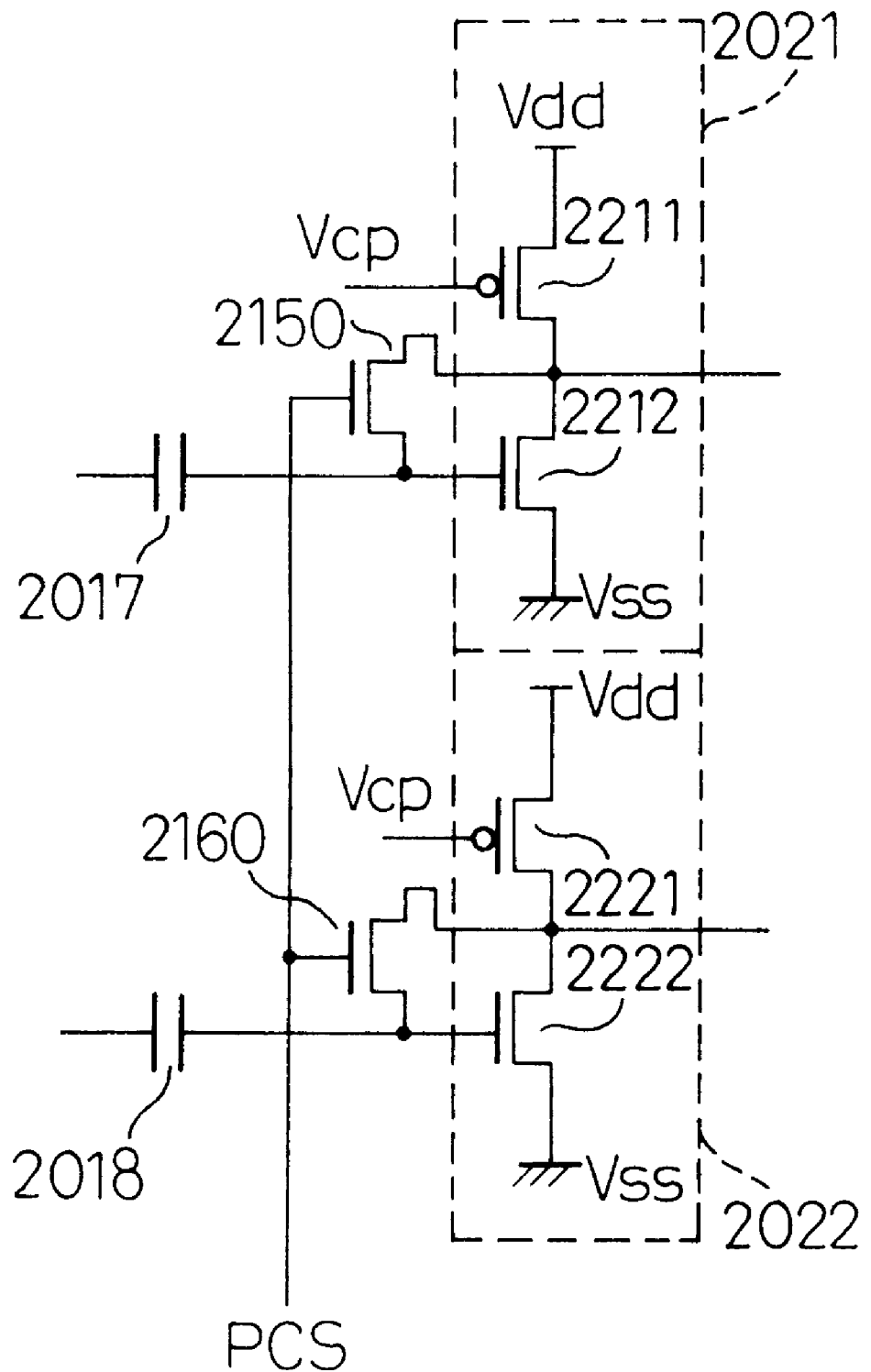
FIG. 37 shows a receiver circuit according to a third embodiment of the second aspect of the present invention.

FIG. 37 shows a receiver circuit according to the third embodiment of the second aspect of the present invention. More specifically, this embodiment relates to an inverter-precharge circuit to be used in place of the switches 2015 and 2016 and inverters 2021 and 2022 of the receiver circuit of FIG. 32.

In FIG. 37, inverters 2021 and 2022 are arranged at the input terminals of the comparator 2002 (FIG. 32). Input and output terminals of the inverters 2021 and 2022 are connected to each other through transistors 2150 and 2160, respectively, to realize negative feedback.

Namely, the input and output terminals of the single-end (constant-current-load) inverter 2021 consisting of transistors 2211 and 2212 are connected to each other through the transistor 2150 whose gate receives a precharge control signal PCS. The input and output terminals of the inverter 2022 consisting of transistors 2221 and 2222 are connected to each other through the transistor 2160 whose gate receives the precharge control signal PCS. The precharge control signal PCS may be identical to the control signal $\phi 1$ of FIG. 34. This arrangement can simultaneously carry out a precharge operation on each input terminal of the comparator 2002 and an auto-zero operation in an input amplifying stage (the inverters 2021 and 2022). As a result, the comparator 2002 may have a small input offset voltage.

Figure 38:
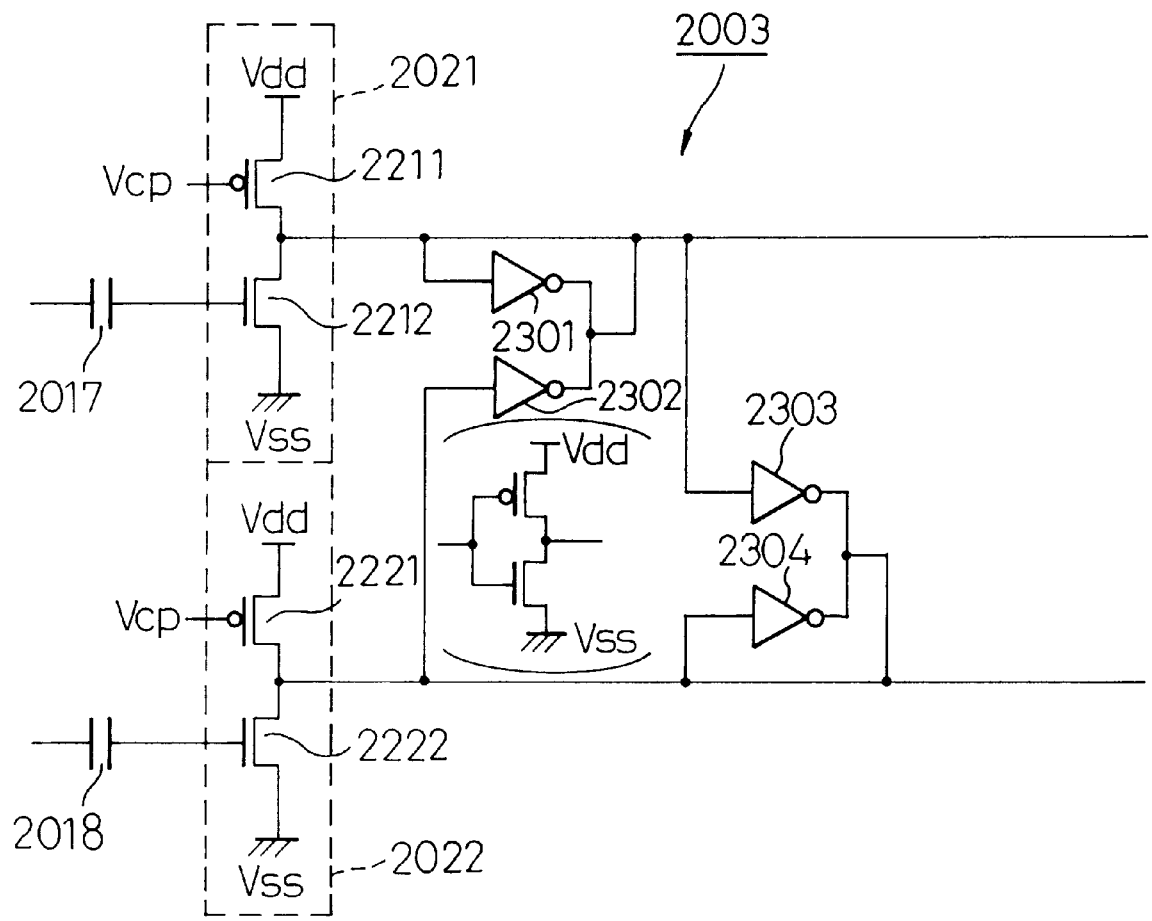
FIG. 38 shows a receiver circuit according to a fourth embodiment of the second aspect of the present invention.
Figure 39:
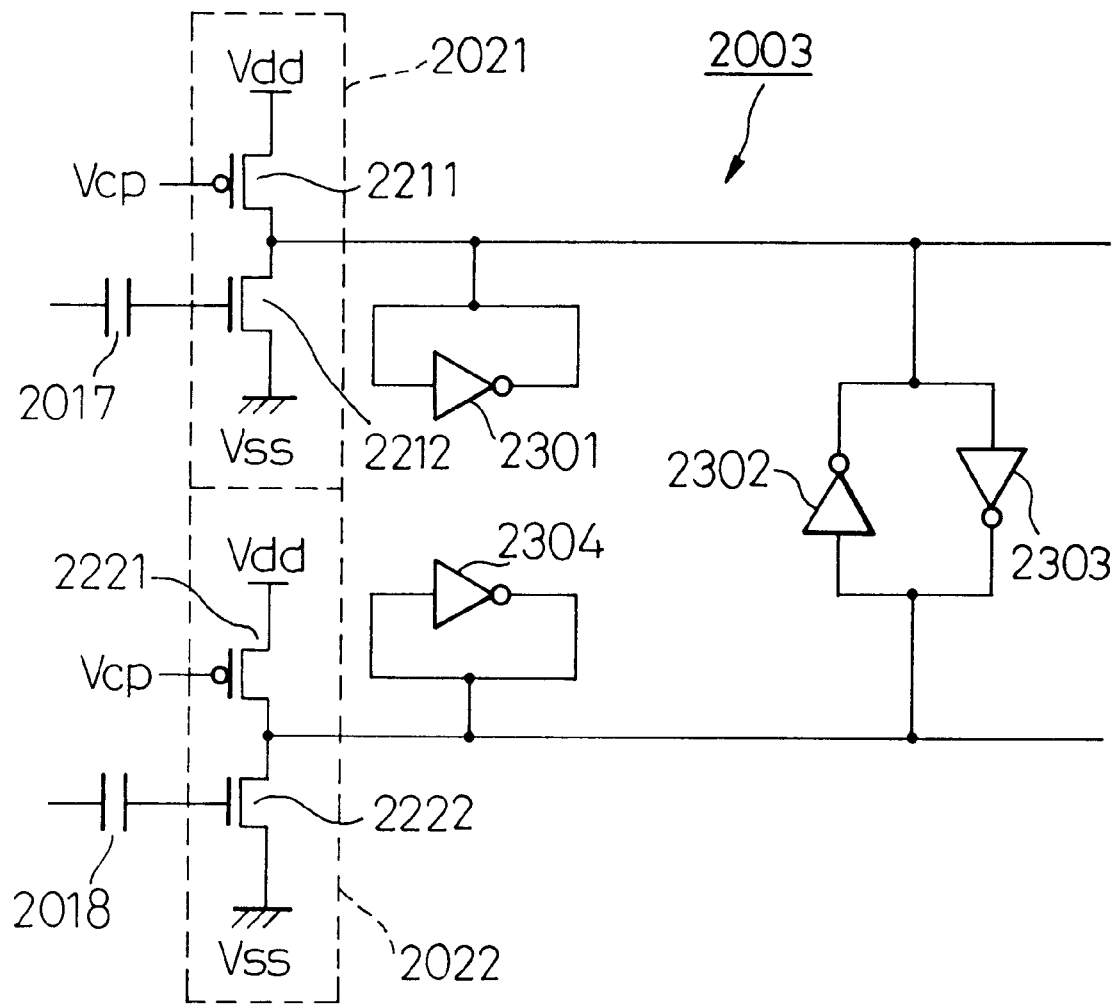
FIG. 39 shows a circuit diagram rewritten from FIG. 38.

FIG. 38 shows a common-mode feedback circuit 2003 of a receiver circuit according to the fourth embodiment of the second aspect of the present invention. FIG. 39 shows a circuit diagram rewritten from FIG. 38.

In FIG. 38, the common-mode feedback circuit 2003 consists of four CMOS inverters 2301 to 2304. The inverters 2301 and 2302 feed the outputs of inverters 2021 and 2022, which are arranged in an input amplifying stage of the comparator 2002 (FIG. 32), back to the output of the inverter 2021. The inverters 2303 and 2304 feed the outputs of the inverters 2021 and 2022 back to the output of the inverter 2022. The inverters 2301 to 2304 are each used as a transconductance circuit for converting a voltage into a current. The inverters 2301 and 2302 convert voltages in the two output signal lines of the inverters 2021 and 2022 into currents, add them to each other, and feed the sum back to the output line of the inverter 2021. The inverters 2303 and 2304 convert the voltages in the two output lines into currents, add them to each other, and feed the sum back to the output line of the inverter 2022.

The circuit of FIG. 38 can be rewritten into that of FIG. 39. In the common-mode feedback circuit 2003, the output and input of each of the CMOS inverters 2301 and 2304 are short-circuited to form a clamp circuit. The clamp circuits are arranged in the output signal lines, respectively, and a CMOS latch circuit consisting of the inverters 2302 and 2303 is arranged between the signal lines.

The fourth embodiment may form the common-mode feedback circuit 2003 entirely with CMOS inverters. All internal nodes are connected to the input and output lines of the common-mode feedback circuit 2003, to realize low-voltage and high-speed operation.

Figure 40:
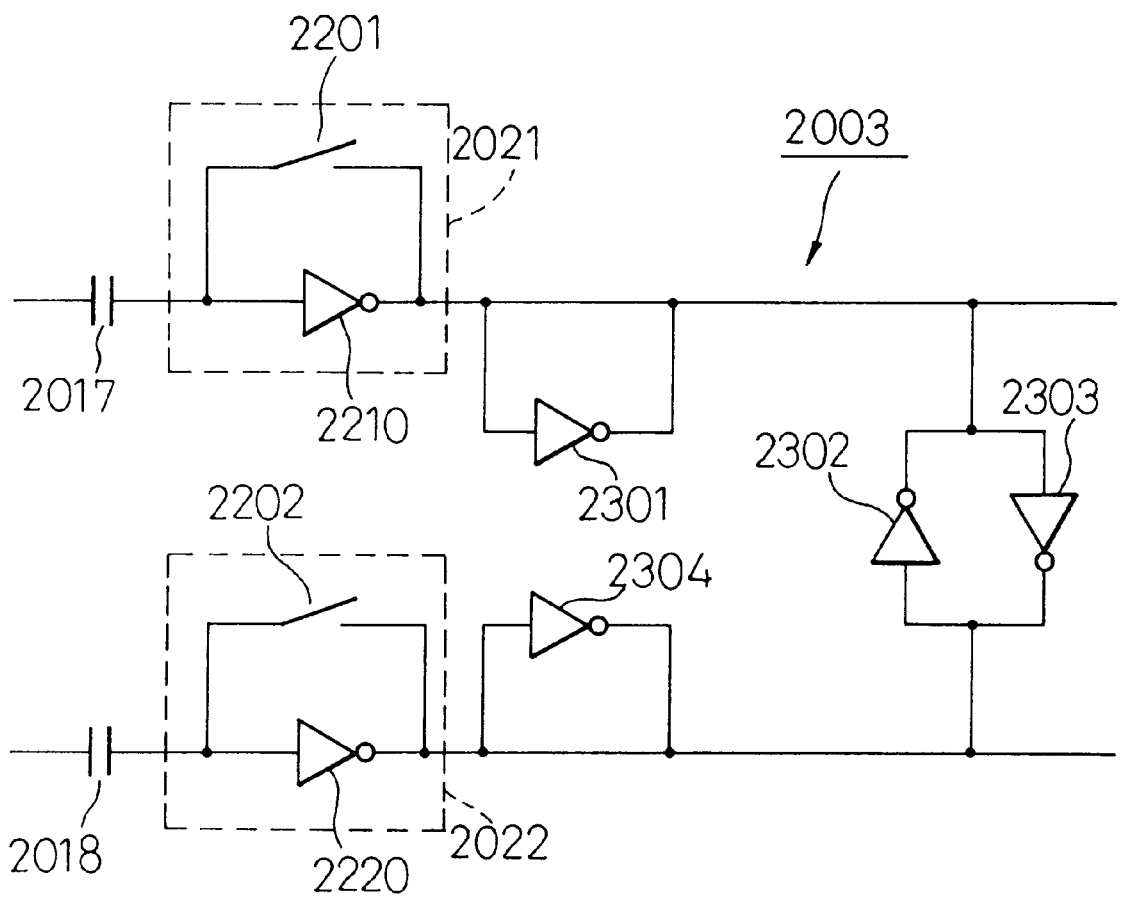
FIG. 40 shows a receiver circuit according to a fifth embodiment of the second aspect of the present invention.

FIG. 40 shows a receiver circuit according to the fifth embodiment of the second aspect of the present invention.

As is apparent from comparison between FIGS. 39 and 40, the fifth embodiment replaces the single-end inverters 2021 and 2022 of the fourth embodiment with CMOS inverters 2210 and 2220. Like the third embodiment of FIG. 37, the fifth embodiment arranges switches 2201 and 2202 (corresponding to the NMOS transistors 2150 and 2160 of FIG. 37) between the input and output terminals of the inverters 2210 and 2220, respectively, to carry out negative feedback.

The fifth embodiment forms the inverters 2021 and 2022 of the input amplifying stage of the comparator 2002 (FIG. 32) with the CMOS inverters 2210 and 2220, to realize the matching of CMOS inverter characteristics. This makes designing easier. The fifth embodiment may form the input amplifying stage and common-feedback circuit 2003 of the comparator 2002 entirely with CMOS inverters, to realize low-voltage, high-speed operation like the fourth embodiment.

Figure 41:
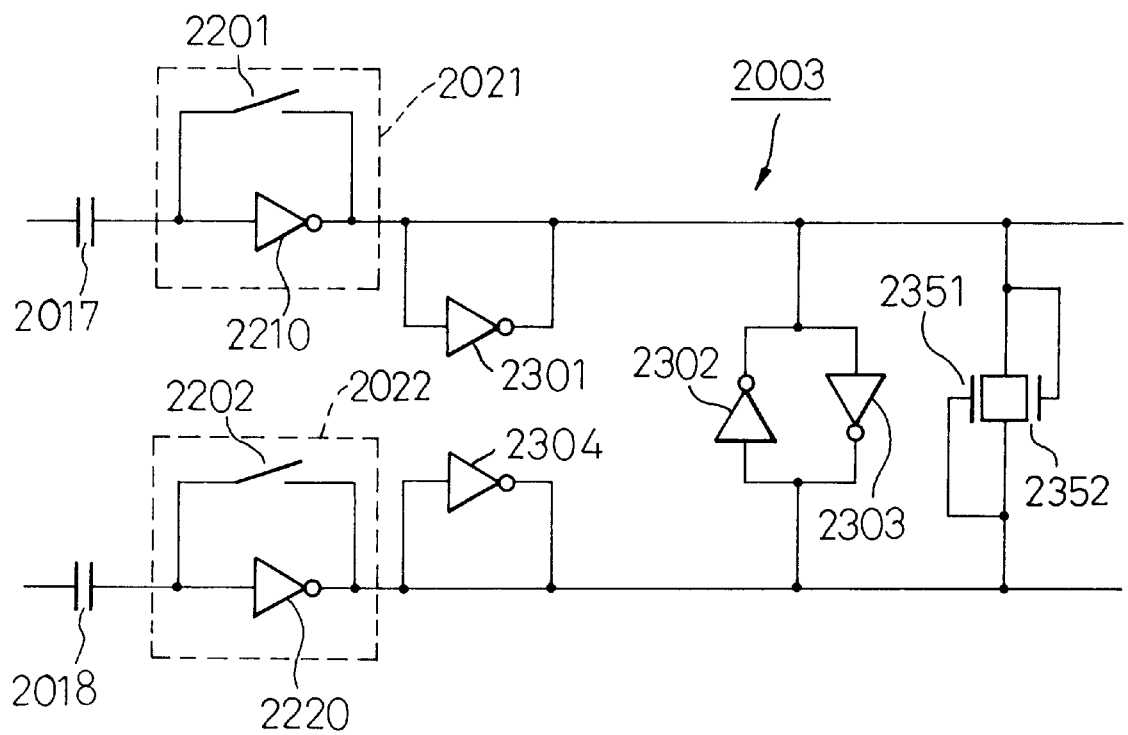
FIG. 41 shows a receiver circuit according to a sixth embodiment of the second aspect of the present invention.

FIG. 41 shows a receiver circuit according to the sixth embodiment of the second aspect of the present invention.

As is apparent from comparison between FIGS. 41 and 40, the sixth embodiment adds a clamp circuit made of NMOS transistors 2351 and 2352 to the fifth embodiment, so that the amplitude of the outputs of the comparator 2002 (FIG. 32) may not vary entirely between source voltages. More precisely, the clamp circuit is arranged to clamp the differential outputs of the comparator 2002 so that the amplitude of the outputs of the comparator 2002 may not exceed a forward voltage of the NMOS transistors 2351 and 2352.

Figure 42:
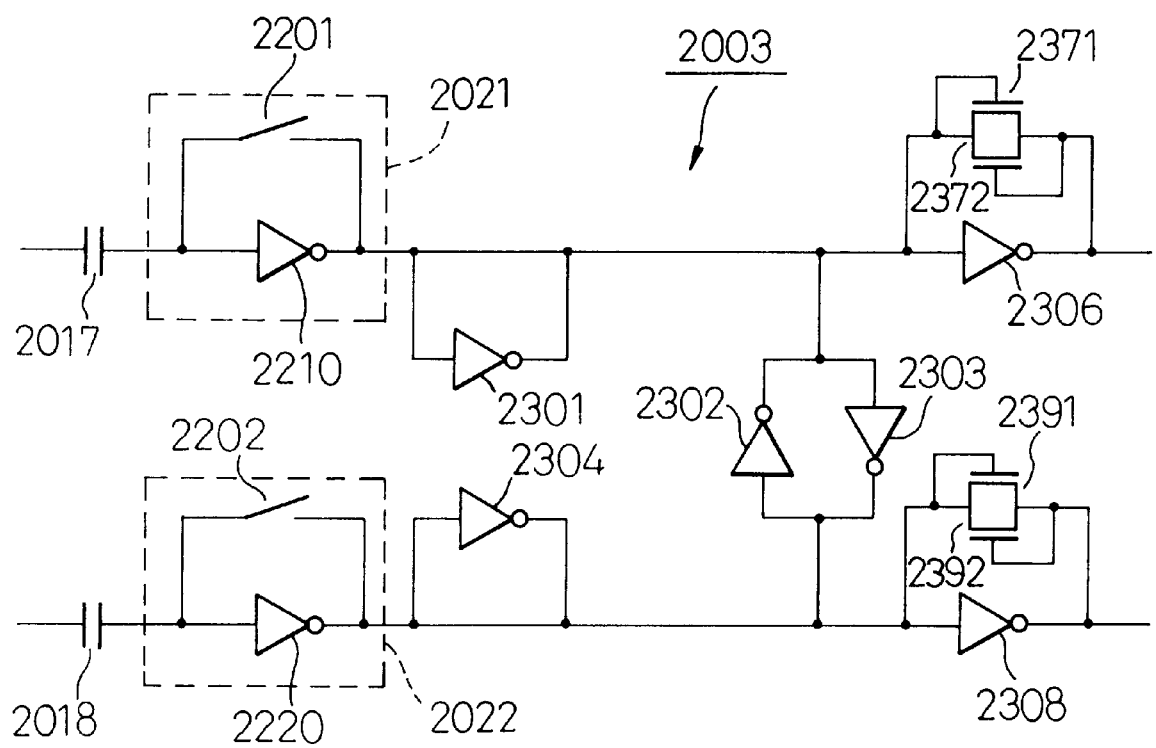
FIG. 42 shows a receiver circuit according to a seventh embodiment of the second aspect of the present invention.

FIG. 42 shows a receiver circuit according to the seventh embodiment of the second aspect of the present invention.

Similar to the sixth embodiment, the seventh embodiment employs clamp circuits made of NMOS transistors 2371, 2372, 2391, and 2392 to minimize the amplitude of the output signals of the comparator 2002 (FIG. 32). The clamp circuit 2371–2372 connects the input and output terminals of an inverter 2306 to each other, and the clamp circuit 2391–2392 connects the input and output terminals of an inverter 2308 to each other. The inverters 2306 and 2308 are in a second amplifying stage.

The sixth and seventh embodiments of the second aspect of the present invention employ the clamp circuits to reduce the amplitude of the outputs of the comparator 2002 within a predetermined range, thereby improving operation speed.

Figure 43:
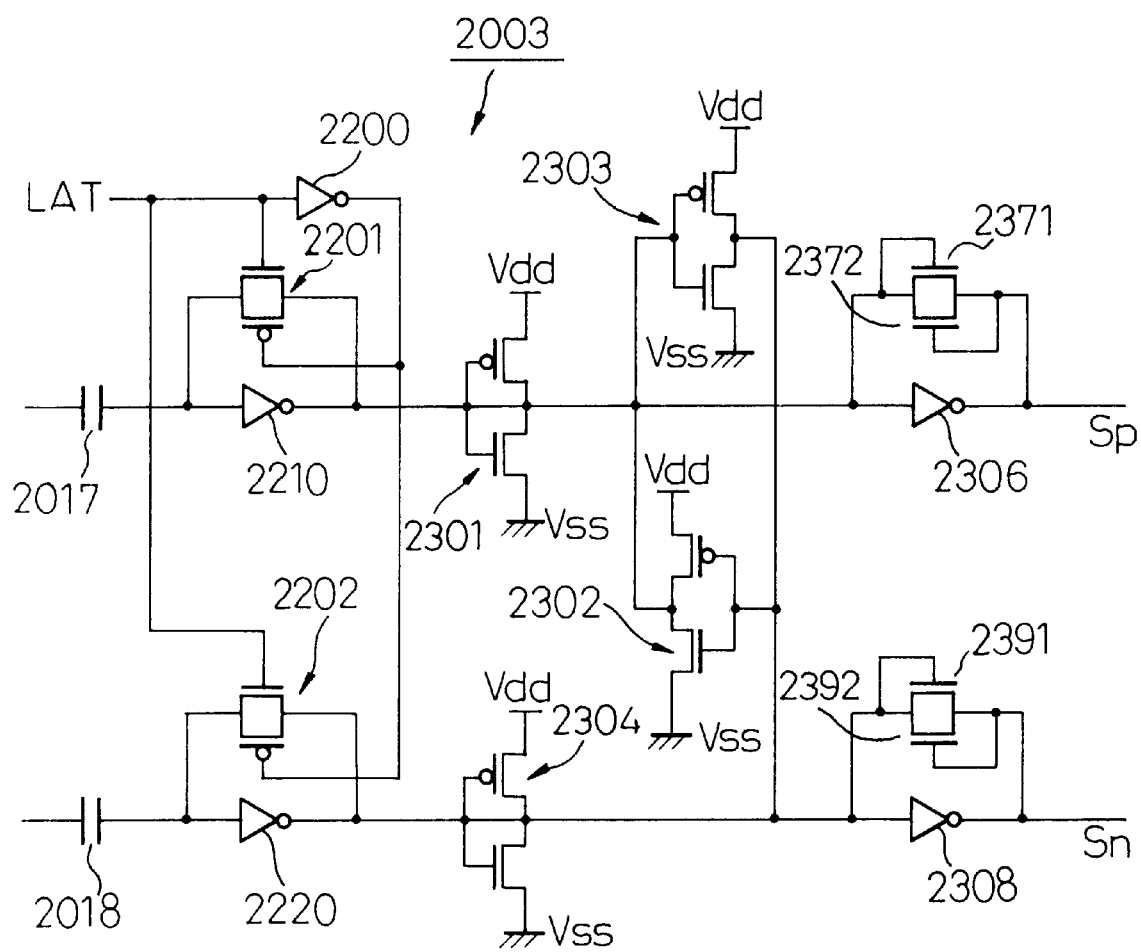
FIG. 43 shows an example circuit based on the seventh embodiment of FIG. 42.

FIG. 43 shows an example circuit based on the seventh embodiment of FIG. 42.

As is apparent from comparison between FIGS. 42 and 43, the circuit of FIG. 43 employs switches 2201 and 2202 each made of a transfer gate. A switching control signal LAT and an inverter 2200 control the switching of the transfer gates 2201 and 2202. Inverters 2301 to 2304 are CMOS inverters. Clamp circuits for connecting the input and output terminals of inverters 2306 and 2308 are each made of two NMOS transistors 2371 and 2372 (2391 and 2392).

Figure 44:
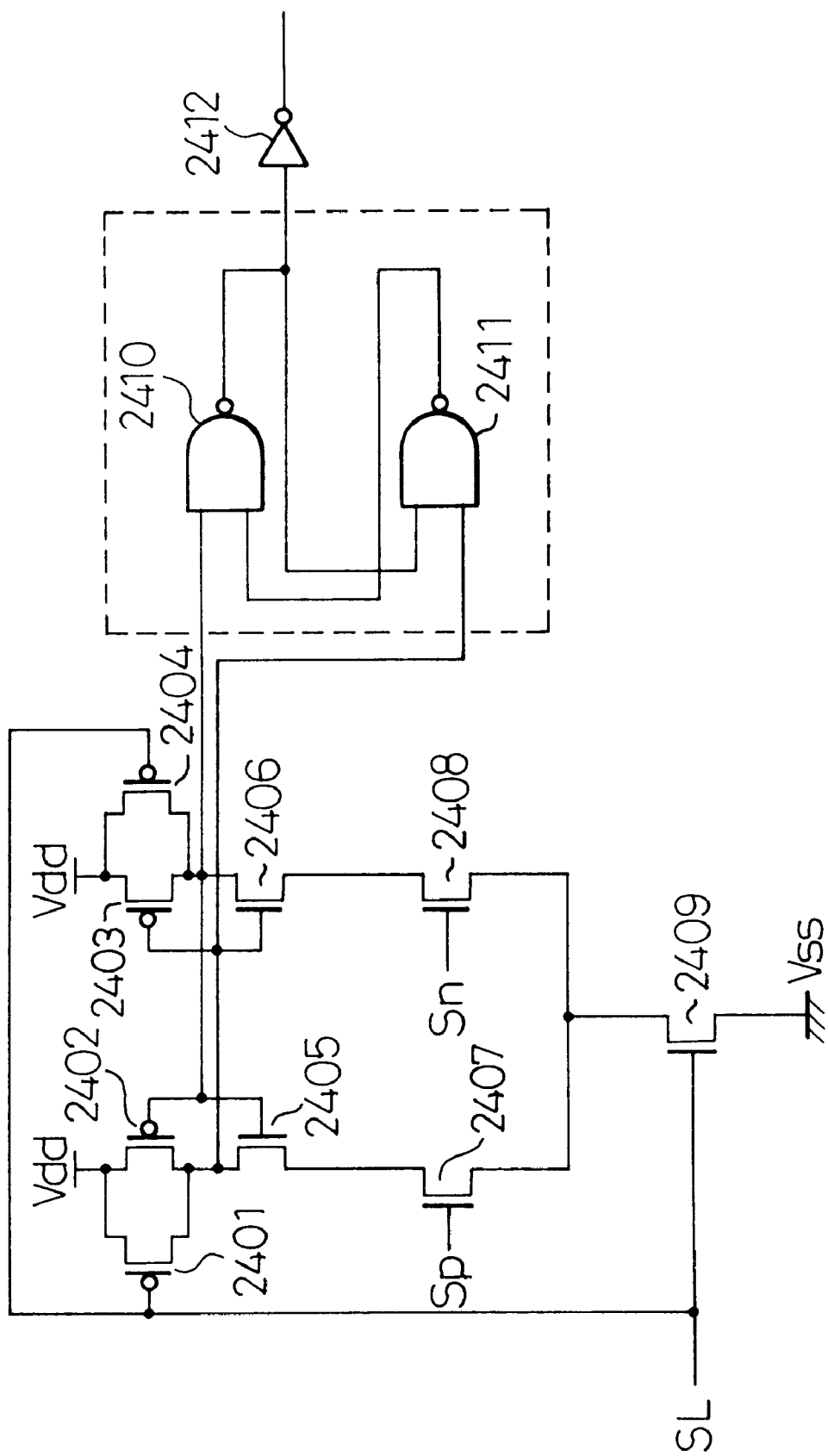
FIG. 44 shows a circuit arranged after the circuit of FIG. 43.

FIG. 44 shows a rear circuit arranged after the circuit of FIG. 43 which is a part of the comparator circuit 2002 (FIG. 32).

The rear circuit has a differential amplifier made of PMOS transistors 2401 to 2404 and NMOS transistors 2405 to 2409, as well as a latch circuit made of NAND gates 2410 and 2411. The gates of the transistors 2407 and 2408 receive the differential outputs of the comparator 2002. The gates of the transistors 2401, 2404, and 2409 receive a latch control signal SL that becomes high to instruct a latch operation. If the latch control signal SL is low, a reset operation is carried out. The output of the latch circuit consisting of the NAND gates 2410 and 2411 is provided outside through an inverter 2412.

Figure 45:
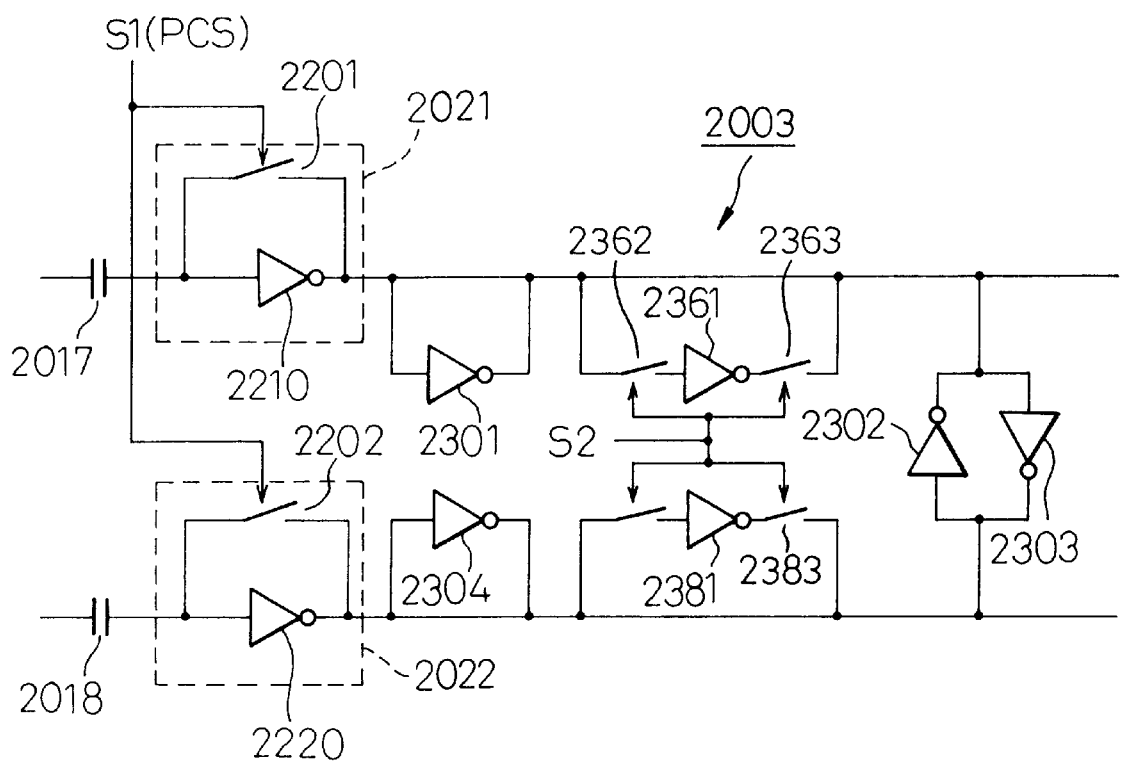
FIG. 45 shows a receiver circuit according to an eighth embodiment of the second aspect of the present invention.
Figure 46:
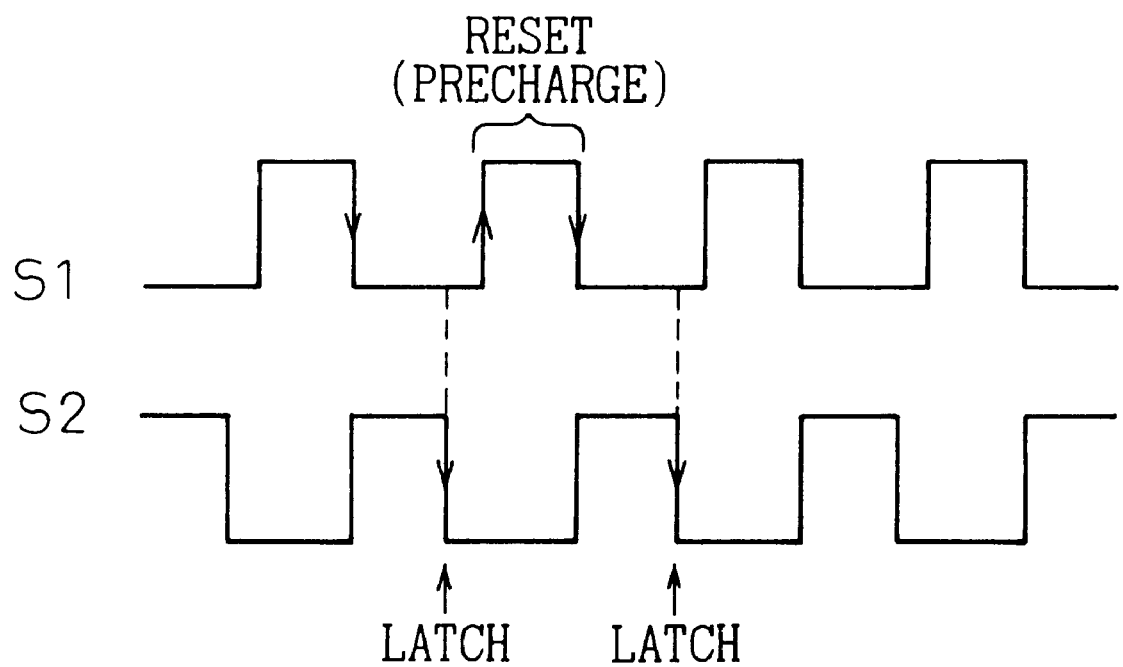
FIG. 46 shows the timing of control signals used by the eighth embodiment of FIG. 45.

FIG. 45 shows a receiver circuit according to the eighth embodiment of the second aspect of the present invention, and FIG. 46 shows the timing of control signals used by the eighth embodiment.

The eighth embodiment arranges inverters 2361 and 2381 controlled by switches 2362, 2363, 2382, and 2383 on signal lines, respectively, in a common-mode feedback circuit 2003, to change the differential gain of the circuit 2003. Switches 2201 and 2202 are turned on if a control signal S1 (corresponding to the precharge control signal PCS of FIG. 37) is high, to connect input and output terminals of inverters 2210 and 2220, to achieve a precharge operation. The switches 2362, 2363, 2382, and 2383 are turned on if a control signal S2 is high, to connect the inverters 2361 and 2362 to the signal lines.

In FIG. 46, the control signal S2 becomes high for a predetermined period in a signal detection period (measuring period) after the precharge period (reset period) in which the control signal S1 is high, to increase the differential gain of the common-mode feedback circuit 2003. The control signal S2 becomes low just before the control signal S1 again rises to high, to operate the common-mode feedback circuit 2003 as a latch circuit to latch signals. This arrangement eliminates the need of latch units such as differential amplifier circuits and latch circuits in the rear stage of the comparator 2002, thereby simplifying the structure and improving operation speed.

In this way, the eighth embodiment employs an amplifier of small input offset voltage as a latch to correctly and speedily detect signals.

The receiver circuit of any one of the embodiments of the second aspect of the present invention is applicable to a signal transmission system that transmits differential signals from a differential driver circuit (2101) to the receiver circuit through a cable (2102) of FIG. 29. The receiver circuit is applicable not only to signal transmission between a server and a main storage device, between servers connected through a network, or between apparatuses and circuit boards but also to signal transmission between chips and between elements and circuit blocks in a chip.

As explained above in detail, the second aspect of the present invention provides the receiver circuits and signal transmission systems capable of correctly transmitting signals at high speed.

Figure 47:
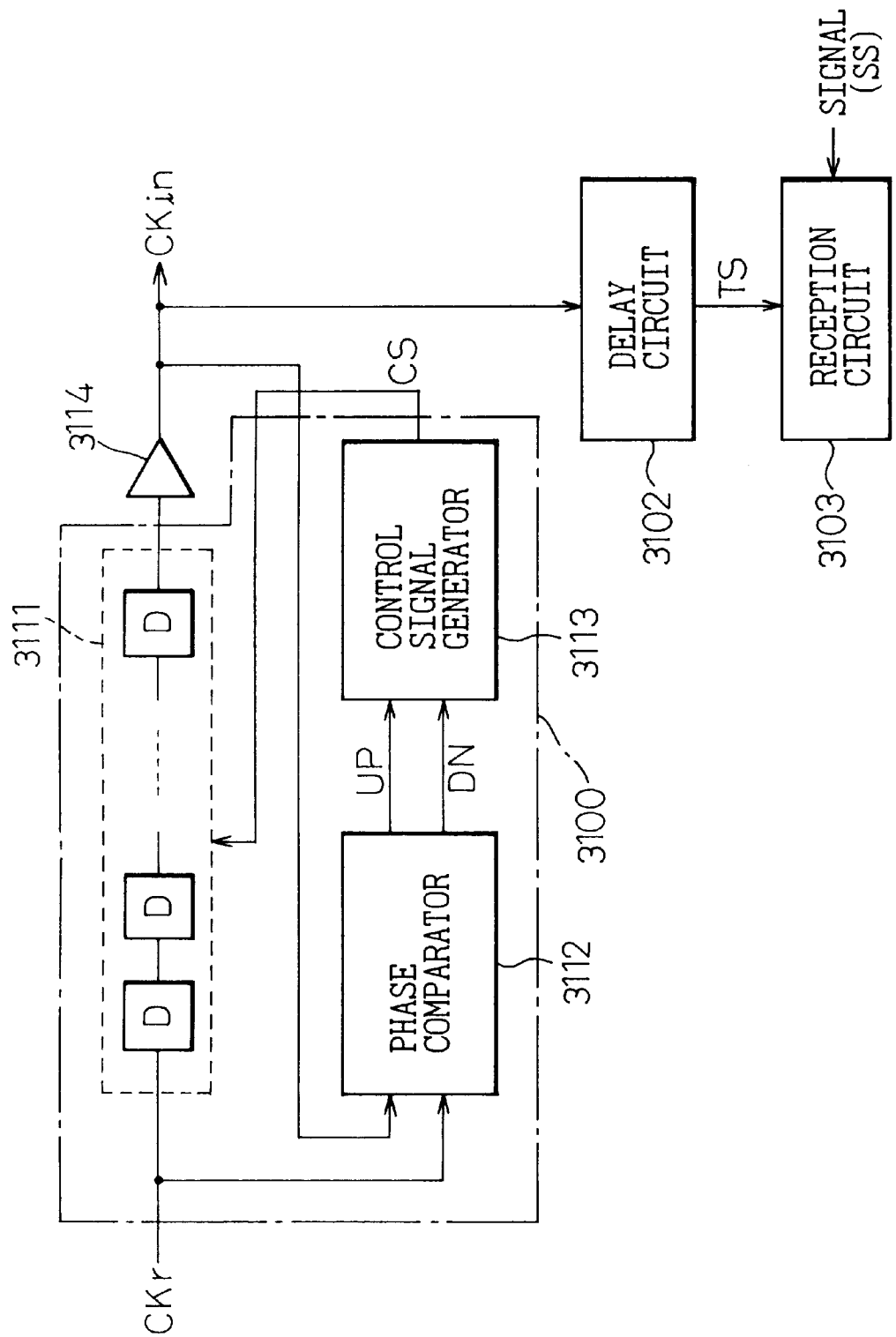
FIG. 47 shows a timing signal generator circuit according to a prior art.

FIG. 47 shows a timing signal generator circuit according to a prior art employing a DLL circuit. The timing signal generator circuit has the DLL circuit 3100, a variable delay line 3111, a phase comparator 3112, a control signal generator 3113, a clock driver 3114, a delay circuit 3102, and a receiver circuit 3103.

The DLL circuit 3100 includes the variable delay line 3111, phase comparator 3112, and control signal generator 3113. The phase comparator 3112 receives a reference clock signal CKr and an internal clock signal CKin of the clock driver 3114 and controls the number of delay units to be activated in the variable delay line 3111 to minimize the phase difference between the clock signals CKr and CKin. For this purpose, the phase comparator 3112 supplies an up signal UP or a down signal DN to the control signal generator 3113 according to the phase difference between the clock signals CKr and CKin. In response to the signal UP or DN, the control signal generator 3113 provides a control signal C. to determine the number of delay units D to be activated in the variable delay line 3111. As a result, the internal clock signal CKin is synchronized with the reference clock signal CKr.

The internal clock signal CKin from the clock driver 3114 is used by an LSI chip (semiconductor integrated circuit device). For example, the signal CKin is used as a timing signal TS by the receiver circuit 3103 through a proper number of delay elements of the delay circuit 3102. The receiver circuit 3103 may latch a signal SS that is synchronized with the signal CKin. The delay circuit 3102 delays the signal CKin according to the performance of the clock driver 3114 and the load capacitance of signal lines and generates the timing signal TS. The DLL circuit 3100 may be replaced with a PLL circuit that controls the oscillation frequency of a VCO (variable control oscillator) according to a control voltage. it. The timing signal generator circuit of the prior art of FIG. 47 that employs a DLL circuit or a PLL circuit may generate the internal clock signal CKin whose phase matches with that of the reference clock signal CKr. When the internal click signal CKin is used for high-speed signal transmission between, for example, LSI chips, there occurs a problem that must be solved.

When carrying out signal transmission between LSI chips or between electronic apparatuses, it is usual to employ a plurality of signal lines to transmit multiple bits to secure a required signal transmission band. In this case, variations in the delay characteristics of the signal lines differ from one to another in terms of optimum bit reception timing. To adjust the reception timing of bits transmitted through different lines, it is necessary to arrange a plurality of DLL circuits. This results in increasing the circuit scale.

To transmit signals at high speed, jitter in the DLL and PLL circuits must be minimized. Reducing jitter is equal to increasing the operation frequency of PLL circuits or reducing the delay time of DLL circuits. This results in deteriorating a phase (or delay time) margin and incorrectly receiving signals.

If a very long cable or a cable having poor signal transmission characteristics is used between apparatuses, e.g., between a server and a main storage device, it is necessary to drop an operation frequency to surely transmit and receive signals through such a cable. It is difficult to provide a timing signal generator circuit having a wide range of operation frequencies and capable of generating an accurate, high-speed timing signal.

A circuit for generating a clock signal having an optional phase in response to a clock signal of frequency f0 may be made from a combination of DLL circuits and a phase interpolator. Based on the clock signal of frequency f0, the DLL circuits generate multiphase (for example, 4-phase) clock signals, which are interpolated by the phase interpolator into an optional phase.

Compared with the PLL and DLL circuits, the phase interpolators are small because they do not include feedback circuits. In addition, the phase interpolators involve little jitter, and therefore, are appropriate to generate timing signals for a signal transmission circuit that transmits multiple signals. However, it is difficult to realize a phase interpolator that operates over a wide range of frequencies. By using a variable delay circuit that provides a maximum delay of 1/f0 with respect to a clock signal of frequency f0, a timing signal generator circuit equivalent to the phase interpolator may be formed. To make such circuit operate on clock signals of low frequencies, a longer delay time is needed. The longer delay time, however, increases circuit scale and jitter.

Now, timing signal generator circuits according to the third aspect of the present invention will be explained with reference to the drawings.

Figure 48:
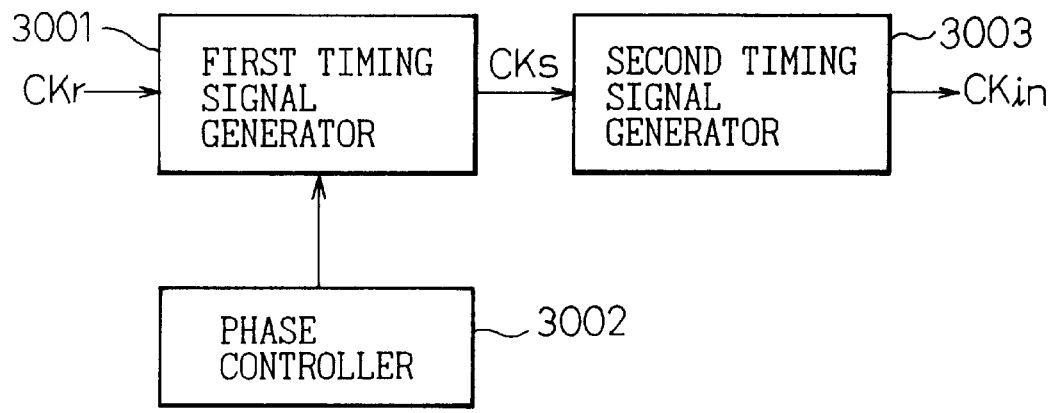
FIG. 48 shows the principle of a timing signal generator circuit according to the third aspect of the present invention.

FIG. 48 shows the principle of a timing signal generator circuit according to the third aspect of the present invention.

A first timing signal generator 3001 generates a first timing signal CKs by effectively variably delaying a clock signal CKr. The phase of the first timing signal CKs is controlled by a phase control unit 3002. The signal CKs is supplied to a second timing signal generator 3003. The second timing signal generator 3003 divides the frequency of the signal CKs and generates a second timing signal CKin whose frequency is an integer fraction of the frequency of the signal CKS. The third aspect effectively variably delays the clock signal CKr not only by directly delaying the clock signal CKr with the use of a variable delay line but also by controlling the phase of the clock signal CKr with the use of, for example, a phase interpolator.

The third aspect employs the optional phase generator 3001 of high frequency (or a delay generator circuit of short delay) and uses the output thereof to generate an optional phase of lower frequency (or a variable delay of longer delay time). Since a phase interpolator of high frequency or a variable delay circuit of short delay time causes little jitter, the timing signal generator circuit of the third aspect provides the internal clock signal (second timing signal) CKin of little jitter.

In this way, the timing signal generator circuit of the third aspect of the present invention is capable of generating a precision timing signal at high speed. This circuit employs a simple structure to secure a wide range of operation frequencies, and the timing signal generated thereby involves little jitter.

Figure 49:
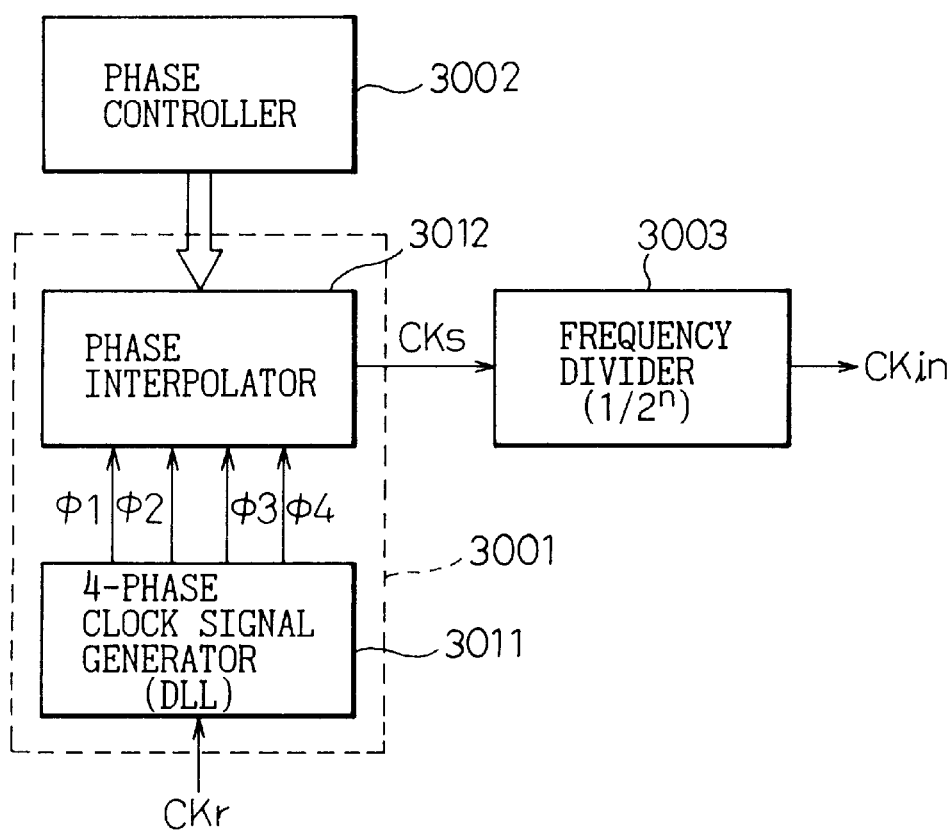
FIG. 49 shows a timing signal generator circuit according to a first embodiment of the third aspect of the present invention.

FIG. 49 shows a timing signal generator circuit according to the first embodiment of the third aspect of the present invention. The circuit has a first timing signal generator 3001, a phase controller :3002, and a frequency divider (a second timing signal generator) 3003.

The first timing signal generator 3001 has a 4-phase clock generator 3011 and a phase interpolator 3012. The 4-phase clock generator 3011 employs the DLL technique, receives a periodical reference clock signal CKr, and generates 4-phase clock signals φ1 to φ4, which are supplied to the phase interpolator 3012 to provide a first timing signal CKs having an optional phase determined by the signals φ1 to φ4.

The signal CKs is supplied to the $½^n$ frequency divider 3003 employing, for example, a binary counter to provide an internal clock signal (second timing signal) CKin whose frequency is $½^n$ of the frequency of the signal CKs (CKr). As shown in FIG. 47, the signal CKin is passed through a delay circuit (3102) and is used as a timing signal (TS) for a reception circuit (3103).

Figure 50:
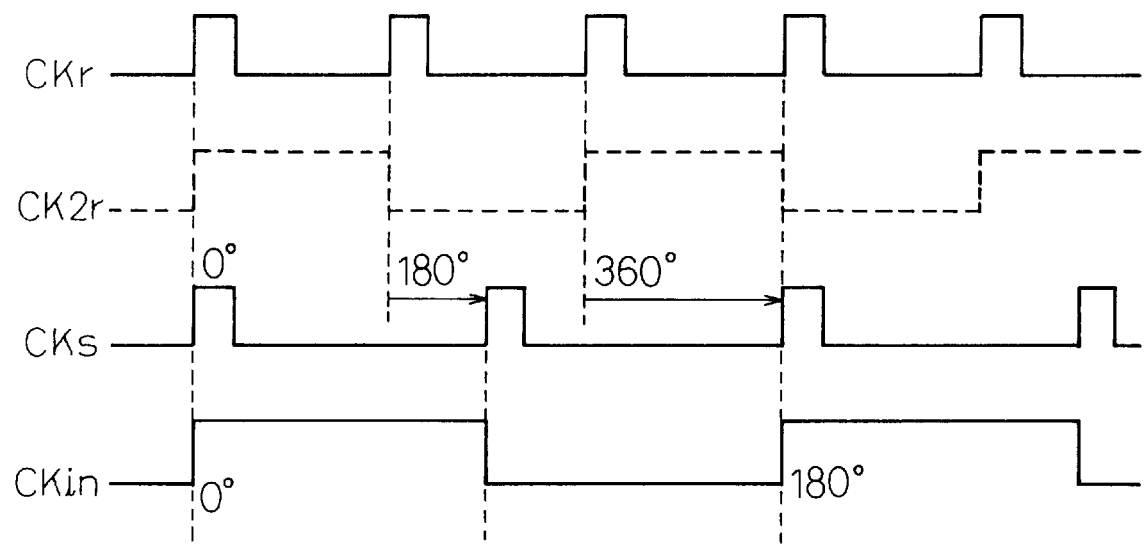
FIG. 50 shows the operation of the circuit of FIG. 49.

FIG. 50 shows the operation of the circuit of FIG. 49. A signal CK2r has a period two times longer than that of the reference clock signal CKr. Namely, the frequency of the signal CK2r is half that of the reference clock signal CKr.

The output signal CKs of the phase interpolator 3012 is supplied to the frequency divider 3003. If the relative phase delay of the signal CKs is increased every clock period in the sequence of 0, 180, and 360 degrees, the phase of the signal CKin from the frequency divider 3003 will be 180 degrees. When the phase of the signal CKs is x, the phase of the signal CKin is 180+x, to effectively realize a delay that is longer than one period of the reference clock signal CKr.

In this way, the phase of the output signal CKin of the frequency divider 3003 can be changed in the full range of 0 to 360 degrees by sequentially moving forward or back the phase of the output signal CKs of the phase interpolator 3012.

The timing signal generator circuit or the first embodiment of the third aspect divides the output of the phase interpolator (first timing signal generator) by the frequency divider (second timing signal generator) to generate an optional long delay. Passing the output of the phase interpolator through the frequency divider enables a signal of low frequency to have an optional phase. Consequently, the timing signal generator circuit of this embodiment has a simple structure to cover a wide range of operation frequencies and to generate an accurate, high-speed timing signal without jitter.

The function of the phase interpolator may be provided by a variable delay circuit. In this case, a frequency divider (or an equivalent circuit) is employed to effectively realize a long variable delay.

Figure 51:
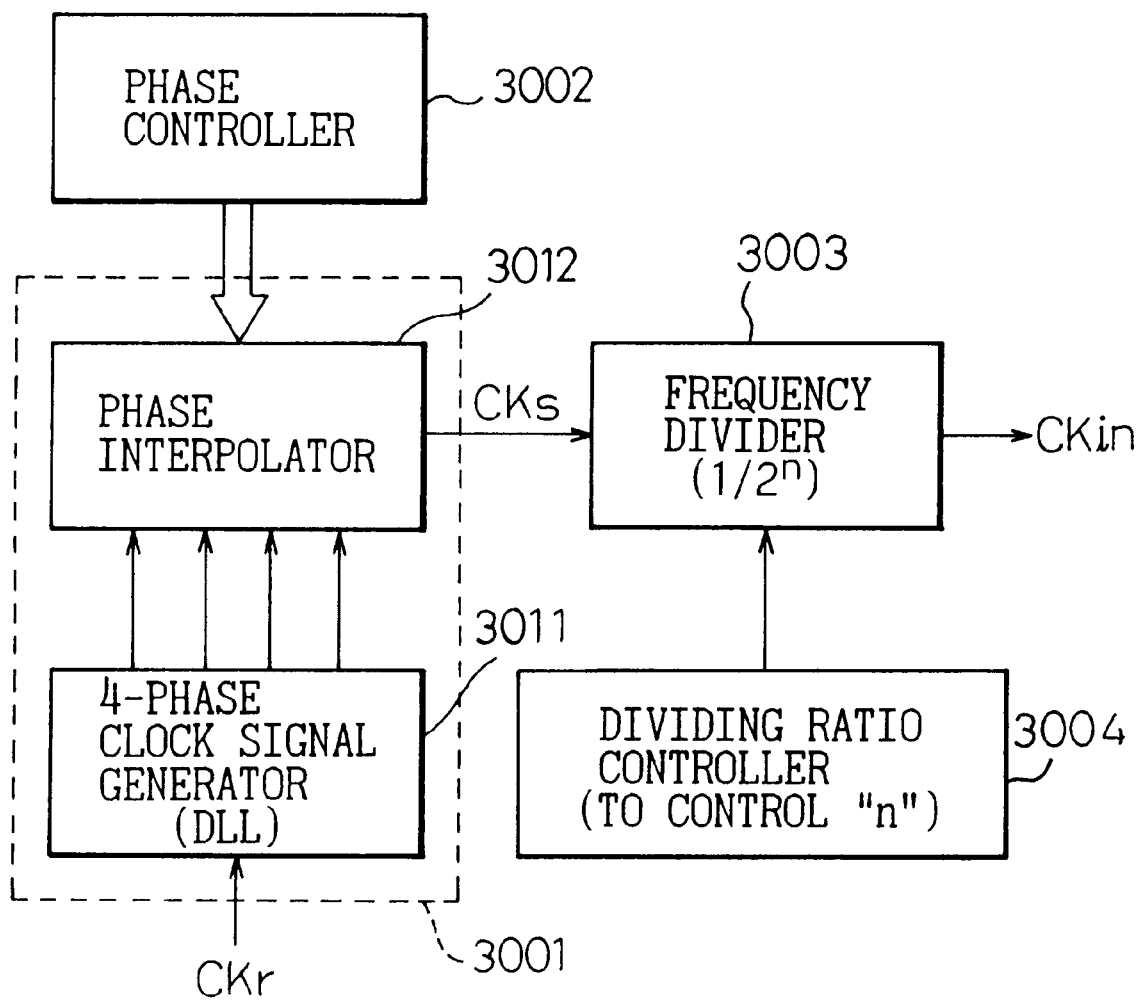
FIG. 51 shows a timing signal generator circuit according to a second embodiment of the third aspect of the present invention.

FIG. 51 shows a timing signal generator circuit according to the second embodiment of the third aspect of the present invention.

As is apparent from comparison between FIGS. 51 and 49, the second embodiment adds to the first embodiment of FIG. 49 a frequency dividing ratio controller 3004 for controlling a frequency dividing ratio (a value of $½^n$) for a frequency divider 3003.

For example, the controller 3004 changes "n" among 0, 1, 2, 3, and 4 to divide the frequency f of an output signal CKs of a phase interpolator 3012 by 1 (f), 2 (f/2), 4 (f/4), 8 (f/8), or 16 (f/16).

If the frequency of the signal CKs ranges from 70% to 140% of 625 MHZ (from about 438 MHZ to 875 MHz), the frequency of an internal clock signal CKin provided by the frequency divider 3003 can be in the expanded range of about 27 MHZ to 875 MHZ (a dynamic range of 32 times). The value of 27 MHz is derived from 438/16 (MHZ). By expanding the range of values of "n" controlled by the controller 3004, the frequency of the internal clock signal CKin provided by the frequency divider 3003 may further be widened to further expand the dynamic range.

Figure 52:
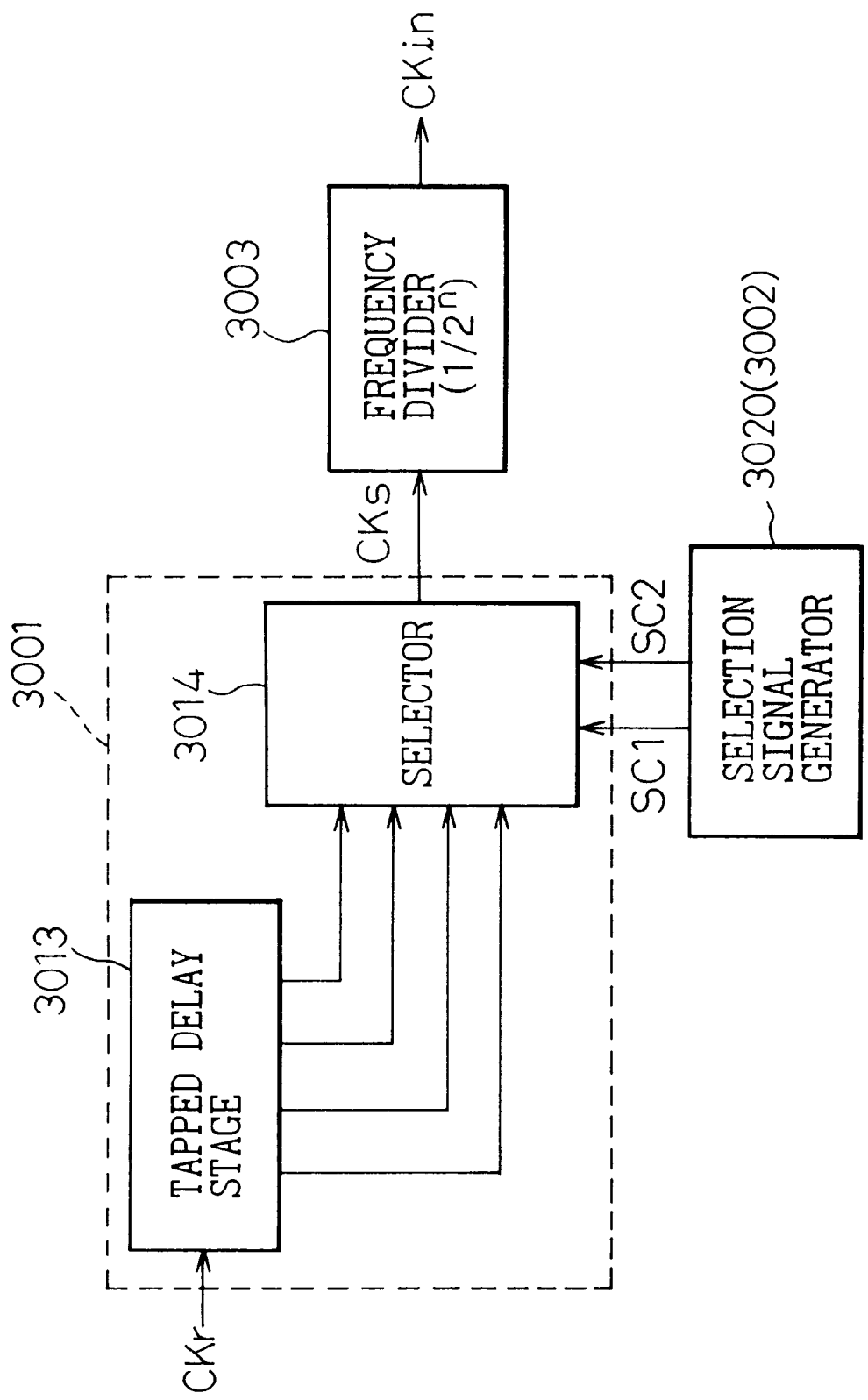
FIG. 52 shows a timing signal generator circuit according t third embodiment of the third aspect of the present invention.

FIG. 52 shows a timing signal generator circuit according to the third embodiment of the third aspect of the present invention. The circuit includes a tapped delay stage 3013, a selector 3014, and a selection signal generator 3020.

The third embodiment employs the tapped delay stage (variable delay circuit) 3013 instead of the phase interpolator 3012 of FIG. 49.

The tapped delay stage 3013 has cascaded delay units and taps arranged at predetermined delay units. The delay stage 3013 receives a reference clock signal CKr, delays the same, and provides differently delayed tap outputs. One of the tap outputs is selected by the selector 3014 as a first timing signal CKs. The selection signal generator 3020 (phase control unit 3002) generates control signals SC1 and SC2 according to which the selector 3014 selects one of the tap outputs. Namely, the signals SC1 and SC2 control the delay (phase) of the first timing signal CKs provided by a first timing signal generator 3001 made of the tapped delay stage 3013 and selector 3014.

The signal CKs is supplied to a frequency divider 3003, which provides an internal clock signal CKin whose frequency is $½^n$ of that of the signal CKs. Similar to By, the second embodiment, the third embodiment may have a frequency dividing ratio controller (3004) to change the value "n" to control the frequency dividing ratio of the frequency divider 3003.

The third embodiment needs no 4-phase clock generator (3011) employing the DLL technique of the first and second embodiments, and therefore, the timing signal generator circuit of the third embodiment is simple.

Figure 53:
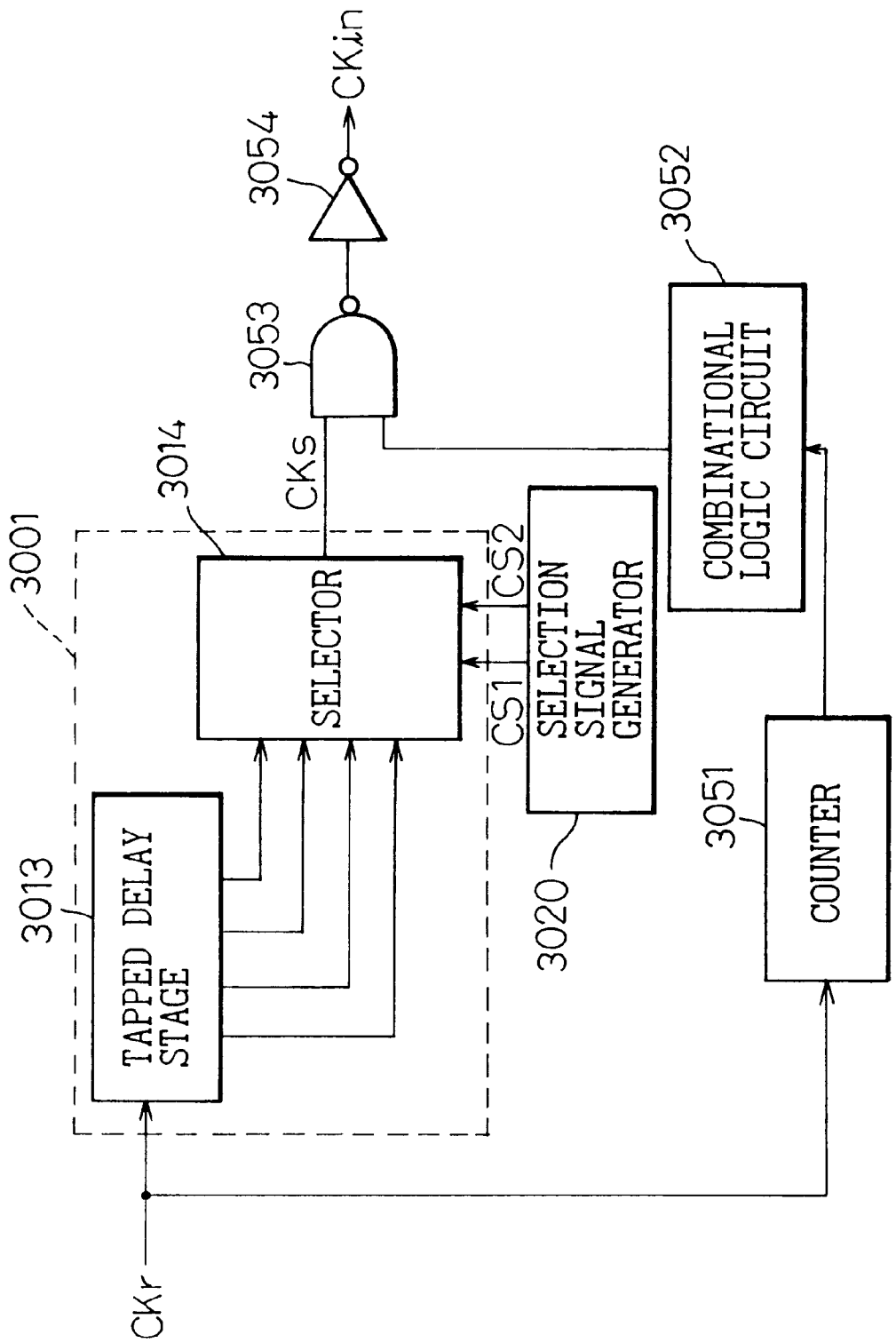
FIG. 53 shows a timing signal generator circuit according to a fourth embodiment of the third aspect of the present invention.

FIG. 53 shows a timing signal generator circuit according to the fourth embodiment of the third aspect of the present invention. The circuit has a counter 3051, a combinational logic circuit 3052, a NAND gate 3053, and an inverter 3054.

As is apparent from comparison between FIGS. 53 and 52, the fourth embodiment employs, instead of the frequency divider (3003) of FIG. 52, the counter 3051, combinational logic circuit 3052, NAND gate 3053, and inverter 3054. A tapped delay stage 3013, a selector 3014, and a selection signal generator 3020 of the fourth embodiment are the same as those of the third embodiment of FIG. 52.

In FIG. 53, a reference clock signal CKr is supplied to the tapped delay stage 3013 and counter 3051. Each tap output of the tapped delay stage 3013 is supplied to the selector 3014, which provides an input terminal of the NAND gate 3053 with a first timing signal CKs selected according to output signals CS1 and CS2 of the selection signal generator 3020. The output of the counter 3051 is passed through the combinational logic circuit 3052 and is supplied to the other input terminal of the NAND gate 3053. The output of the NAND gate 3053 is supplied to the inverter 3054, which provides an internal clock signal (a second timing signal) CKin. In this way, the fourth embodiment employs the output of the counter (sequential circuit) 3051 that receives the reference clock signal CKr, to gate the signal CKs from the selector 3014.

The fourth embodiment has the advantages of the third embodiment and also advantages of small jitter and a short phase-changing time.

Figure 54:
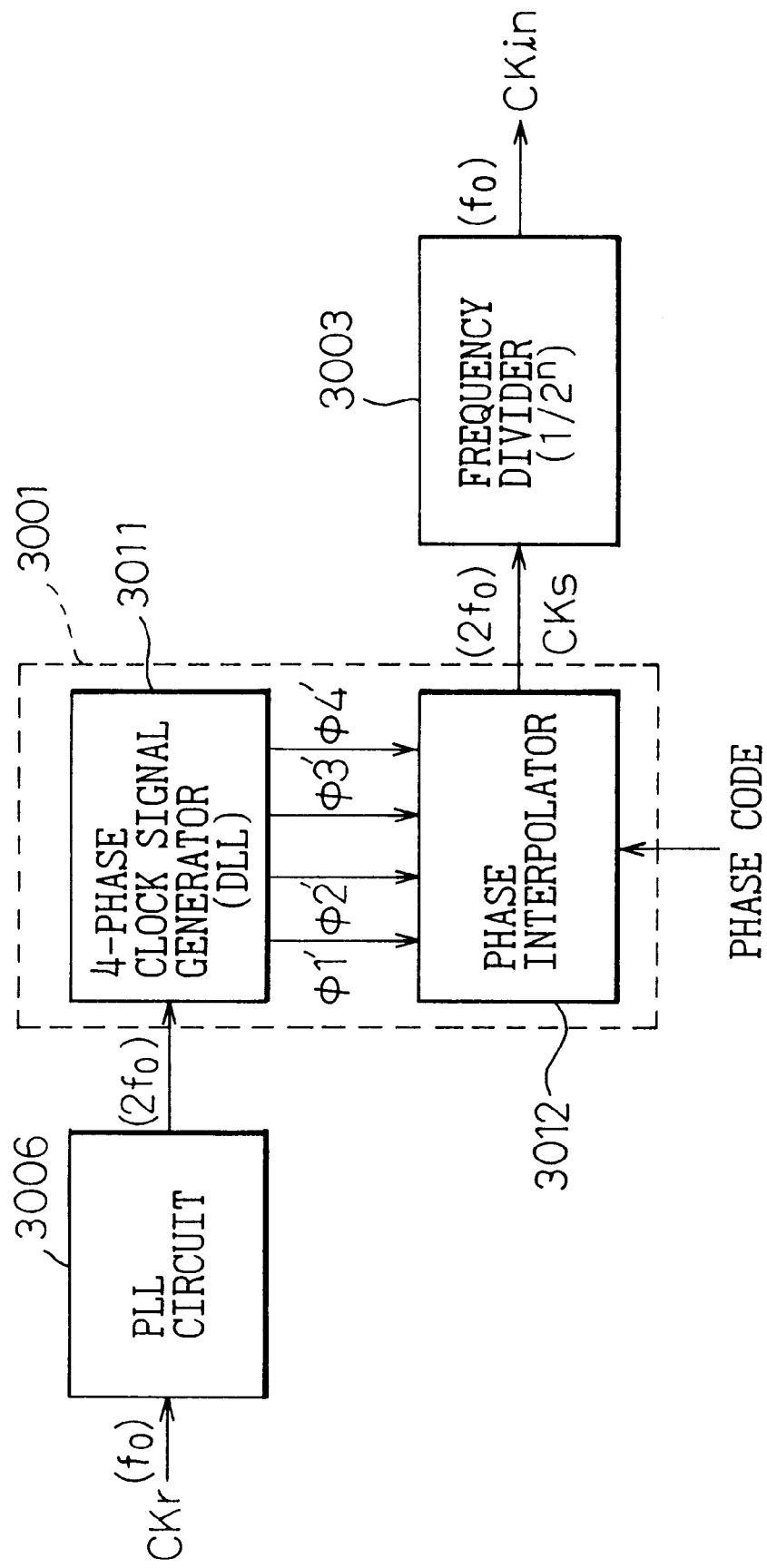
FIG. 54 shows a timing signal generator circuit according to fifth embodiment of the third aspect of the present invention.

FIG. 54 shows a timing signal generator circuit according to the fifth embodiment of the third aspect of the present invention.

A PLL circuit 3006 receives a reference clock signal CKr whose frequency is a signal transmission frequency f0, doubles the frequency to 2f0, and supplies the frequency-doubled signal to a 4-phase clock generator 3011. The generator 3011 generates 4-phase clock signals φ1', φ2', φ3', and φ4', which are supplied to a phase interpolator 3012. According to a phase control code, the phase interpolator 3012 generates a first timing signal CKs, which is supplied to a frequency divider 3003. The frequency divider 3003 halves the frequency of the signal CKs and generates a second timing signal (internal clock signal) CKin having a frequency of f0. The PLL circuit 3006 is not limited to one that doubles the frequency f0 of the reference clock signal CKr. It may multiply the frequency f0 by an integer (N). In this case, the frequency divider 3003 may be an N-frequency divider that divides the frequency of the signal CKs having a frequency of Nf0, i.e., N times the frequency of the reference clock signal CKr, by N.

In this way, the fifth embodiment involves little jitter in terms of time because the operation frequency of the first clock generator 3001 is high, and generates an accurate timing signal (CKin).

Figure 55:
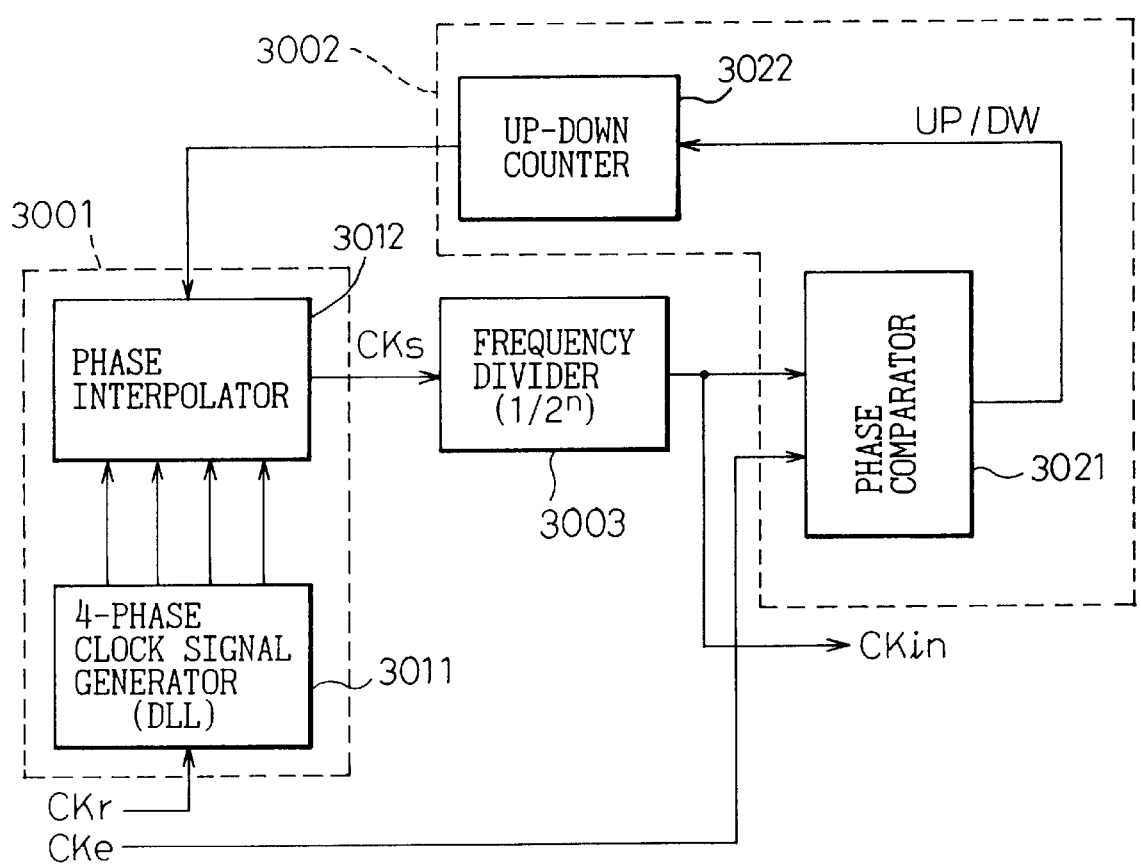
FIG. 55 shows a timing signal generator circuit according to a sixth embodiment of the third aspect of the present invention.

FIG. 55 shows a timing signal generator circuit according to the sixth embodiment of the third aspect of the present invention. The circuit has a phase comparator 3021 and an up-down counter 3022.

As is apparent from comparison between FIGS. 55 and 49, the sixth embodiment forms the phase controller 3002 of the first embodiment of FIG. 49 with the phase comparator 3021 and up-down counter 3022.

The phase comparator 3021 receives an internal clock signal CKin and an external clock signal CFe, compares the phases thereof with each other, and provides the up-down counter 3022 with an up signal UP or down signal DW accordingly. If the phase of the internal clock signal (second timing signal) CKin is behind the phase of the external clock signal CKe, feedback control through the up-down counter 3022 is carried out to reduce the phase delay of a phase interpolator 3012. If the phase of the signal CKin is ahead of the phase of the signal CKe, the feedback control through the up-down counter 3022 is carried out to increase the phase delay of the phase interpolator 3012. In more detail, the up-down counter 3022 integrates the up signal UP or down signal DW provided by the phase comparator 3021 according to phase advance or delay and controls the phase of the phase interpolator 3012 according to a digital value of the integration.

The sixth embodiment is capable of locking the phase of the internal clock signal CKin with respect to the phase of the external clock signal CKe.

Figure 56B:
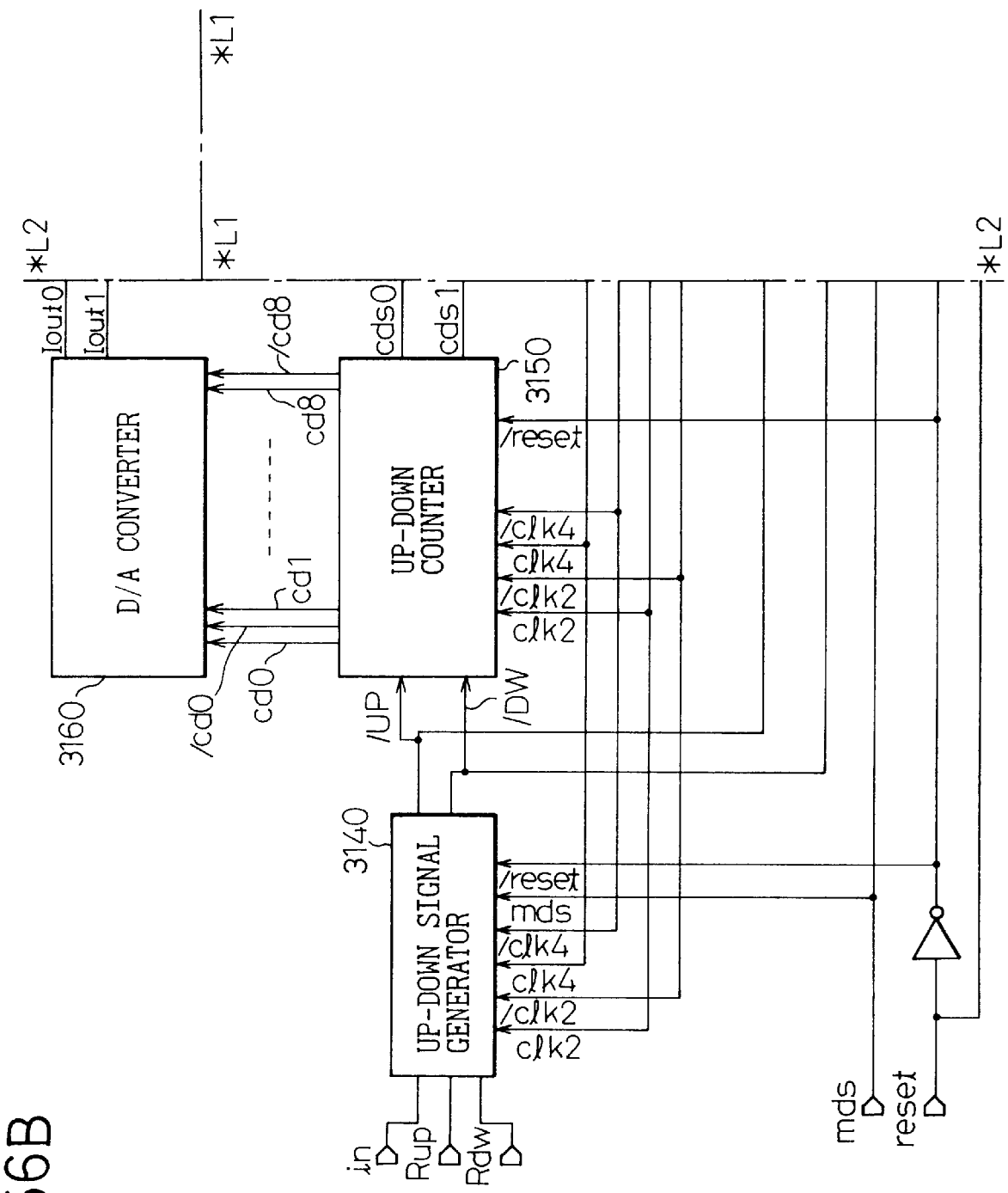
Figure 56C:
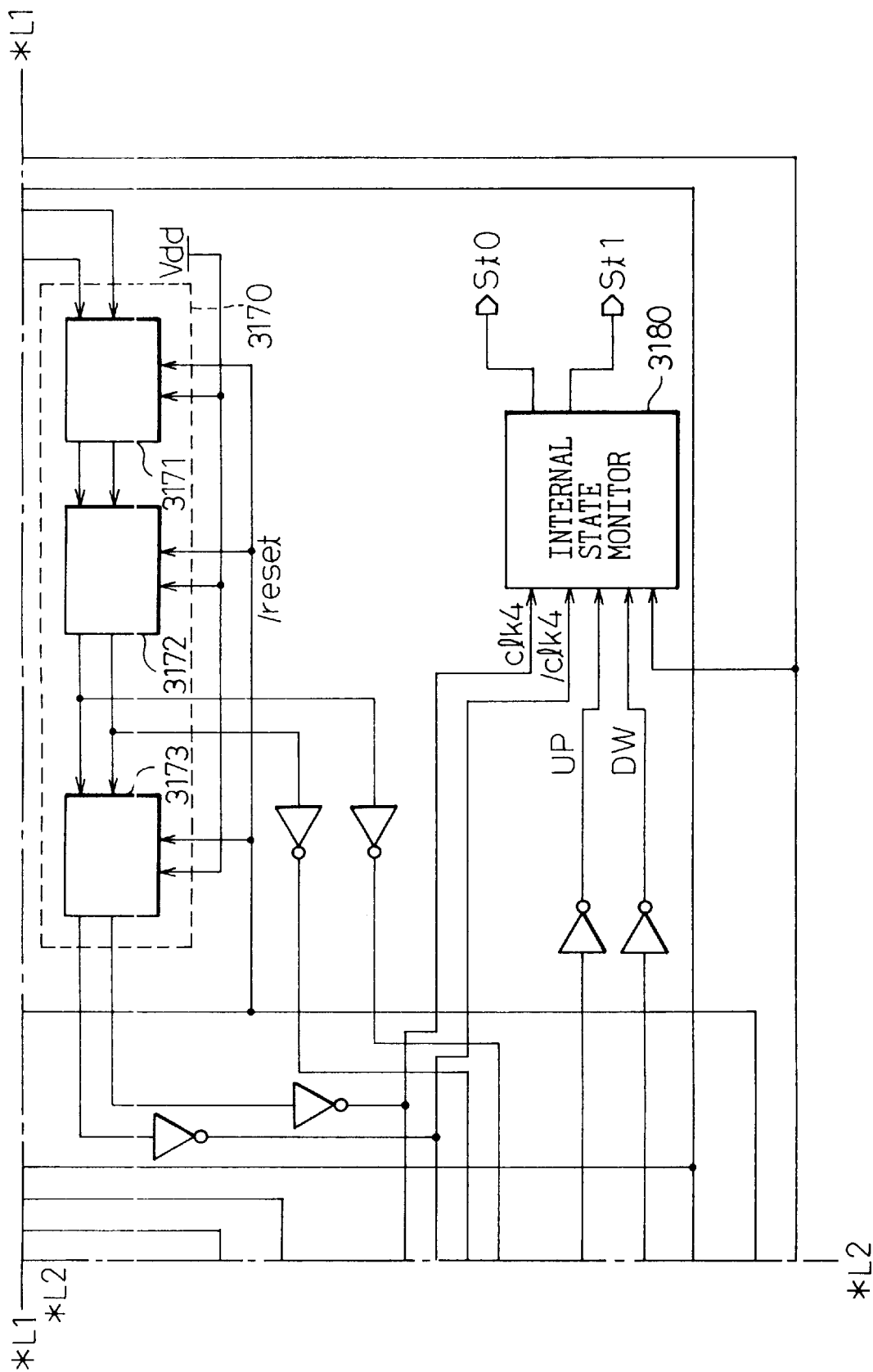

FIGS. 56A, 56B, and 56C show a concrete example of a timing signal generator circuit according to the third aspect of the present invention. The circuit includes a sign switching circuit 3110, a phase interpolator (quadrature mixer plus comparator) 3120, frequency dividers 3130 and 3170, an up-down signal generator 3140, an up-down counter 3150, a digital-to-analog (D/A) converter 3160, and an internal state monitor 3180.

The sign switching circuit 3110 receives 4-phase clock signals φ1, φ2, φ3, and φ4 from a 4-phase clock generator 3011 employing the DLL technique, switches the signs thereof, and provides the phase interpolator 3120 with clock signals clka, clkb, clkc, and clkd. The phase interpolator 3120 receives output signals Iout0 and Iout1 from the D/A converter 3160 and a reset signal /reset (an inverted logic signal of a signal "reset") and provides complementary signals CKs and /CKs corresponding to the output signals Iout0 and Iout1 to the frequency divider 3130 through inverters.

The frequency divider 3130 serving as an output circuit has the function of the frequency dividing ratio controller 3004 of FIG. 51. In addition to the complementary signals CKs and /CKs from the phase interpolator 3120, the frequency divider 3130 receives selection signals CD1 and CD2 for controlling a frequency dividing ratio $\frac{1}{2^n}$ to, for example, ½, ¼, and ⅛. Further, the frequency divider 3130 receives a mode switching signal "mds" and the reset signals "reset" and provides complementary internal clock signals (second timing signals) CKin and /CKin.

The up-down signal generator 3140 generates up-down signals /UP and /DW from output signals "in," Rup, and Rdw. The signals /UP and /DW are transferred to the up-down counter 3150. The up-down signal generator 3140 and up-down counter 3150 also receive output signals clk2, /clk2, clk4, and /clk4 of the frequency divider 3170 (for internal circuits), the mode switching signal "mds," and the reset signal /reset. The outputs of the up-down counter 3150 are supplied to the D/A converter 3160. The D/A converter 3160 provides the phase interpolator 3120 with the internal output signals Iout0 and Iout1. The higher two bits cds0 and cds1 of the output of the up-down counter 3150 are supplied to the sign switching circuit 3110 and are used to switch the signs of the 4-phase clock signals.

The frequency divider 3170 is composed of, for example, three frequency dividers 3171 to 3173. The frequency divider 3170 receives the output signals CKs and /CKs from the phase interpolator 3120 through inverters and provides the up-down signal generator 3140 and up-down counter 3150 with the frequency-divided output signals clk2, /clk2, clk4, and /clk4. The internal state monitor 3180 receives the output signals clk4 and /clk4 from the frequency divider 3170 as well as the output signals UP and DW from the up-down signal generator 3140 through inverters and generates signals St0 and St1, which are used to monitor the internal state of the timing signal generator circuit.

Figure 57A:
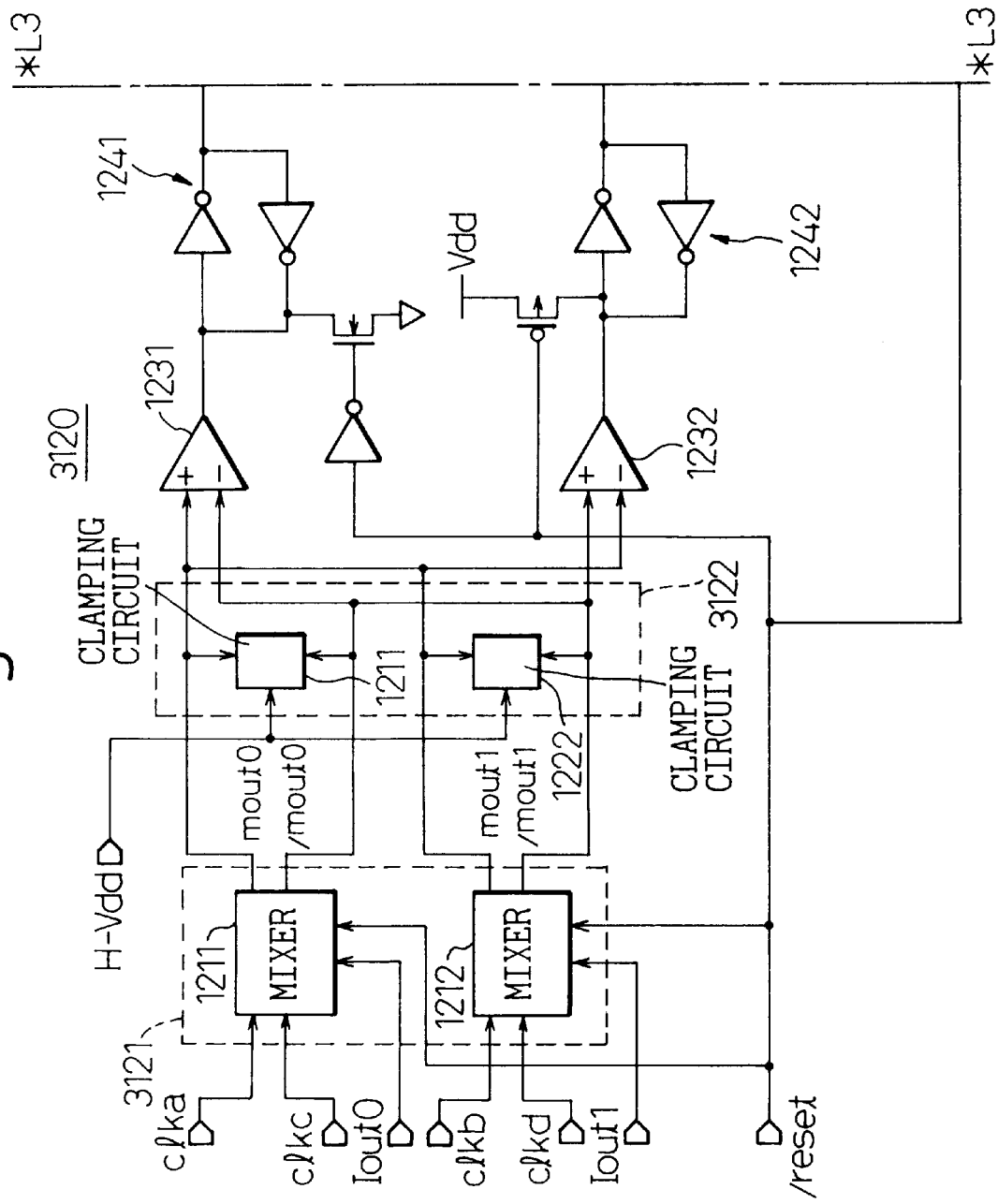
FIGS. 57A and 57B show a phase interpolator of the circuit of FIGS. 56A to 56C.
Figure 57B:
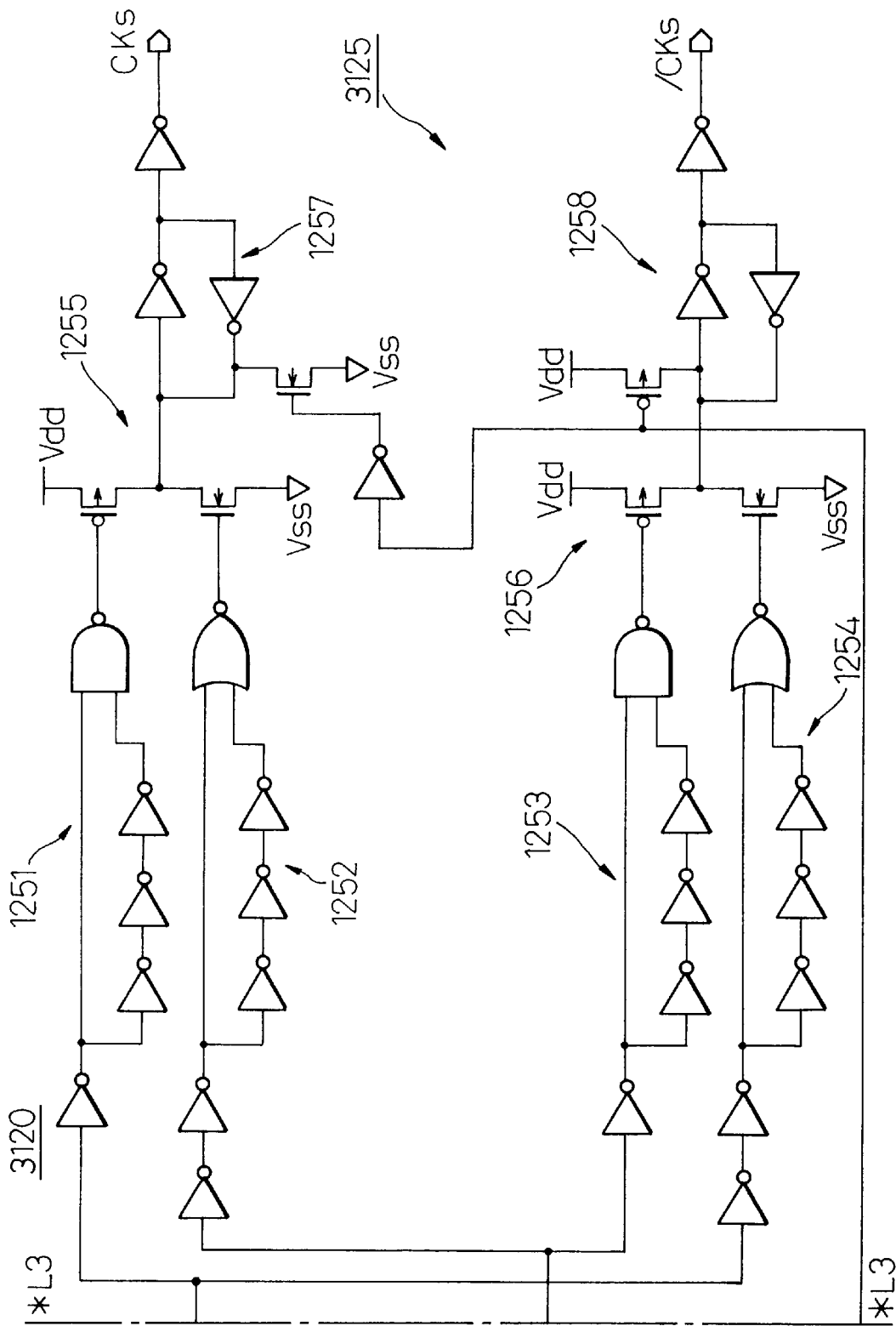

FIGS. 57A and 57B show the phase interpolator 3120 of FIG. 56A.

The phase interpolator 3120 has a quadrature mixer 3121, a clamp 3122, comparators 1231 and 1232, latches 1241 and 1242, and a duty factor adjuster 3125.

The quadrature mixer 3121 consists of mixers 1211 and 1212. The mixer 1211 receives the clock signals clka and clkc from the sign switching circuit 3110 and the output signal Iout0 from the D/A converter 3160. The mixer 1212 receives the clock signals clkb and clkd from the sign switching circuit 3110 and the output signal Iout1 from the D/A converter 3160. The clamp 3122 has clamp circuits 1221 and 1222 for clamping the complementary output signals mout0, /mout0, mout1, and /mout1 of the mixers 1211 and 1212, respectively. The clamp circuits 1221 and 1222 receive a voltage H-Vdd. The clamp circuits 1221 and 1222 are used to fix a common-mode voltage of the complementary output signals of the mixers 1211 and 1212 of the quadrature mixer 3121 and are replaceable with a general common-mode feedback circuit.

The positive logic output signals mout0 and mout1 of the mixers 1211 and 1212 are combined into a common signal, which is supplied to a positive input terminal of the first comparator 1231 and a negative input terminal of the second comparator 1232. The negative logic output signals /mout0 and /mout1 of the mixers 1211 and 1212 are combined into a common signal, which is supplied to a negative input terminal of the first comparator 1231 and a positive input terminal of the second comparator 1232. The outputs of the comparators 1231 and 1232 are passed through the latches 1241 and 1242 each of which is made of two inverters, to the duty factor adjuster 3125.

The duty factor adjuster 3125 is composed of pulse generators 1251 and 1253 each consisting of an odd number of inverters and a NAND gate, pulse generators 1252 and 1254 each consisting of an odd number of inverters and a NOR gate, signal generators 1255 and 1256 for receiving the outputs of the pulse generators 1251 and 1252 and 1253 and 1254, respectively, and latches 1257 and 1258. The outputs of the latches 1257 and 1258 are provided outside through inverters, to serve as the output signals CKs and /CKs of the phase interpolator 3120.

The mixers 1211 and 1212, latches 1241 and 1242, and latches 1257 and 1258 are reset in response to the reset signal /reset. The phase interpolator of FIG. 57A and 57B is only an example. Any other type of a phase interpolator may be employed in the present invention.

Figure 58:
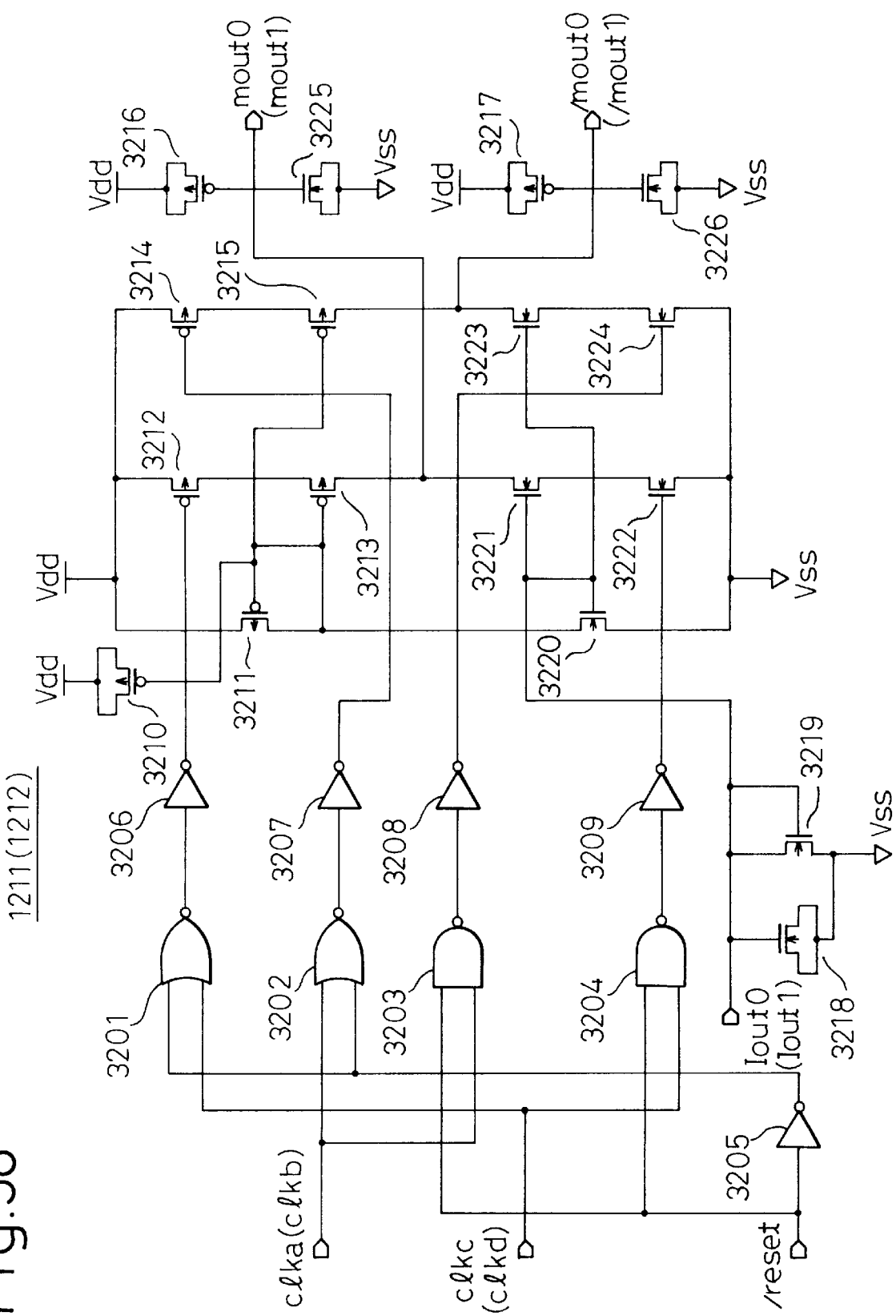
FIG. 58 shows a quadrature mixer of the phase interpolator of FIGS. 57A and 57B.

FIG. 58 shows an example of one of the mixers 1211 and 1212 in the quadrature mixer 3121 of the phase interpolator of FIGS. 57A and 57B.

The mixers 1211 and 1212 have a similar structure. Each has NOR gates 3201 and 3202, NAND gates 3203 and 3204, inverters 3205 to 3209, PMOS transistors 3210 to 3217, and NMOS transistors 3218 to 3226. The clock signal clka (clkb) is supplied to input terminals of the NOR gate 3202 and NAND gate 3203. The clock signal clkc (clkd) is supplied to input terminals of the NOR gate 3201 and NAND gate 3204. The reset signal /reset is supplied to the other input terminals of the NAND gates 3203 and 3204. A reset signal "reset" passed through the inverter 3205 is supplied to the other input terminals of the NOR gates 3201 and 3202.

Figure 59:
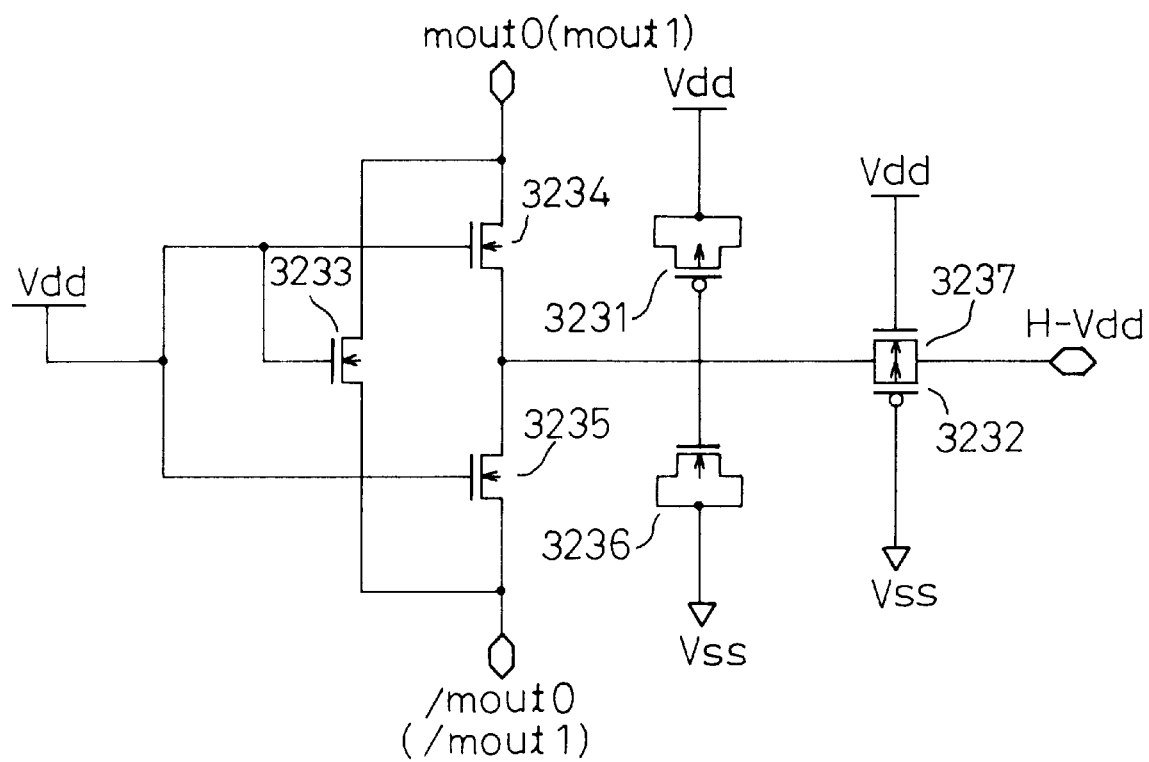
FIG. 59 shows a clamp of the phase interpolator of FIGS. 57A and 57B.

FIG. 59 shows an example of one of the clamp circuits 1221 and 1222 of the clamp 3122 of the phase interpolator 3120 of FIGS. 57A and 57B.

The clamp circuits 1221 and 1222 have a similar structure. Each has PMOS transistors 3231 and 3232 and NMOS transistors 3233 to 3237. The complementary signals mout0 and /mout0 (mout1 and /mout1) of the mixer 1211 (1212) are supplied to the sources (drains,, of the series-connected NMOS transistors 3234 and 3235 and to the source and drain of the NMOS transistor 3233 that is connected in parallel with the transistors 3234 and 3235. The gates of the transistors 3233 to 3235 are connected together to receive a source voltage Vdd. The clamp circuit of FIG. 59 may have any other optional structure.

Figure 60:
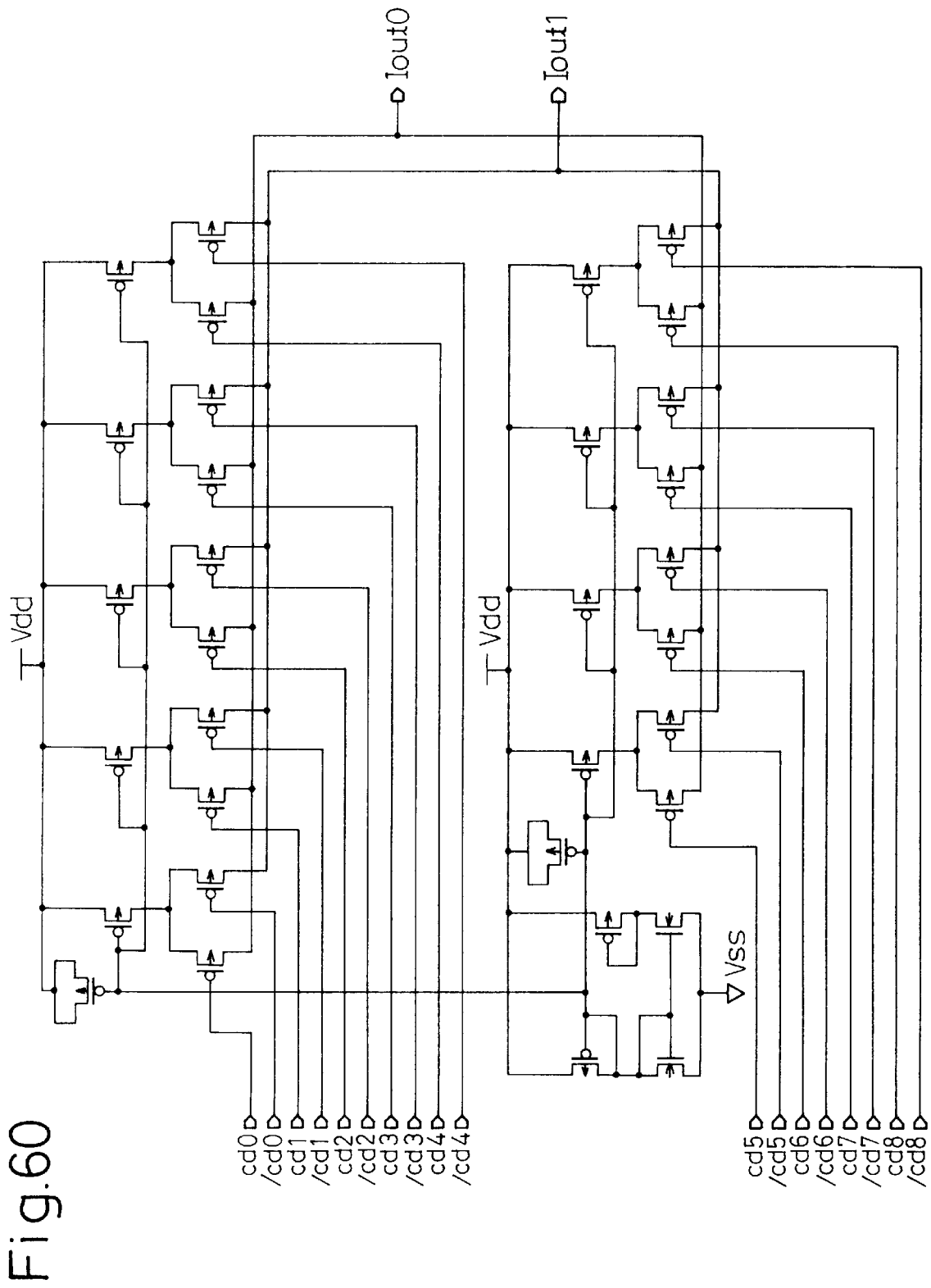
FIG. 60 shows a D/A converter of the circuit of FIGS. 56A to 56C.

FIG. 60 shows an example of the D/A converter 3160 of the timing signal generator circuit of FIGS. 56A to 56C.

The D/A converter 3160 consists of PMOS transistors. Each counter output of the up-down counter 3150 is supplied to the gate of a corresponding one of the PMOS transistors. The drains of the transistors whose gates receive the respective counter outputs are commonly connected for positive and negative logic signals, respectively, to provide the output signals Iout0 and Iout1 to the phase interpolator 3120.

The circuits shown in FIGS. 56A to 60 are only examples. Any other structure may be employed by the present invention.

As explained above in detail, the third aspect of the present invention provides the timing signal generator circuits of simple structure capable of correctly generating high-speed timing signals, securing a wide range of operation frequencies, and reducing jitter.

Figure 61:
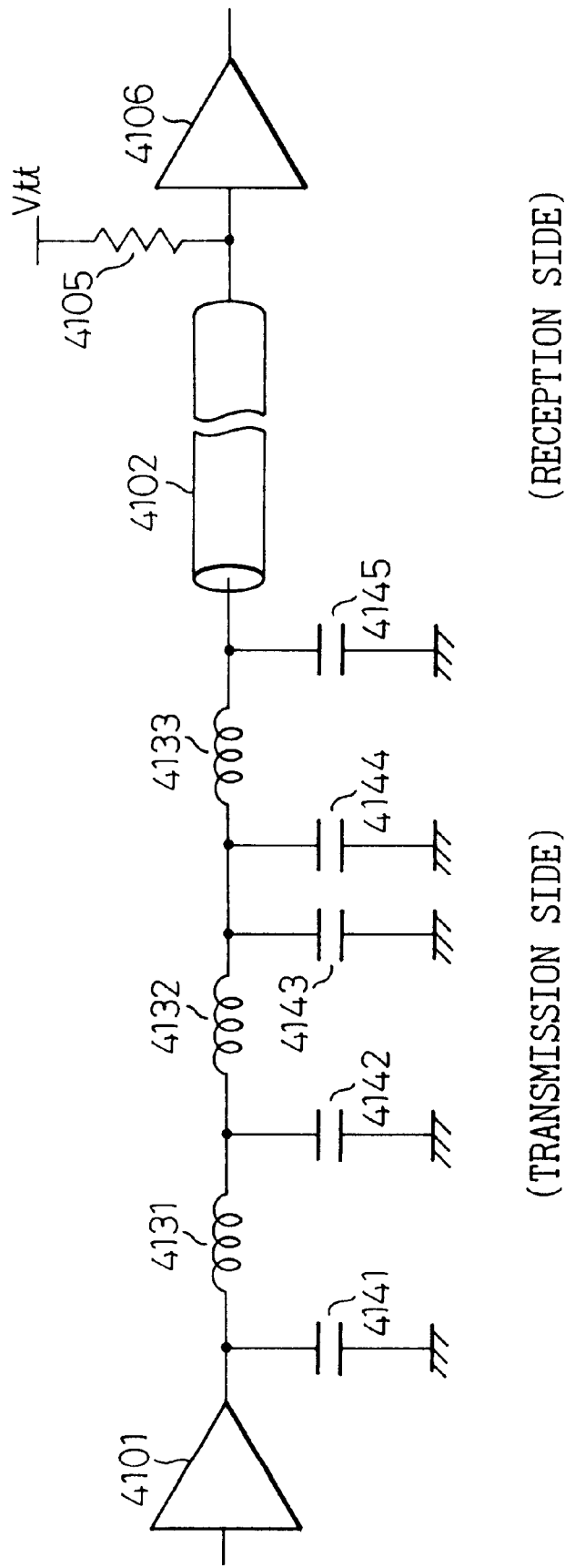
FIG. 61 shows a signal transmission system according to a prior art.

FIG. 61 shows a signal transmission system according to a prior art. This system is applicable to signal transmission between, for example LcIs. The system involves a driver circuit 4101, a signal transmission line (cable) 4102, parasitic inductance elements 4131 to 4133, parasitic capacitance elements 4141 to 4145, a terminating resistor 4105, and a receiver circuit 4106. The parasitic inductance element 4131 may be of bonding wires for connecting a semiconductor chip (driver circuit) to external pins, the parasitic inductance element 4132 of a package and lead wires, and the parasitic inductance element 4133 of connectors. The parasitic capacitance elements 4141 to 4145 correspond to parasitic capacitors formed at respective parts.

When the speed of signal transmission between the LSIs is increased, high-frequency components contained in transmitted signals increase.

In the signal transmission system of FIG. 61, such high-frequency components cause oscillation in the parasitic inductance elements 4131 to 4133 and parasitic capacitance elements 4141 to 4145.

This disturbs the waveform of the transmitted signals to hinder correct signal transmission. The signals containing such high-frequency components cause combinational noise such as crosstalk on other signal lines, thereby hindering correct, high-speed signal transmission. These problems occur in signal transmission not only between LSIs but also between a server and a main storage device, between servers connected to each other through a network, between apparatuses, between boards, and between elements and circuit blocks in a chip (LSI).

Now, driver circuits, receiver circuits, signal transmission systems, and signal transmission techniques according to embodiments of the fourth aspect of the present invention will be explained.

FIGS. 62A to 62D show the principle of the fourth aspect of the present invention. In each of these drawings, an ordinate represents a voltage V and an abscissa represents time t.

The quantity of high-frequency components contained in a signal is determined by the quantity of high-frequency components contained in a code waveform involving data 0 and 1 of the signal.

Figure 62A:
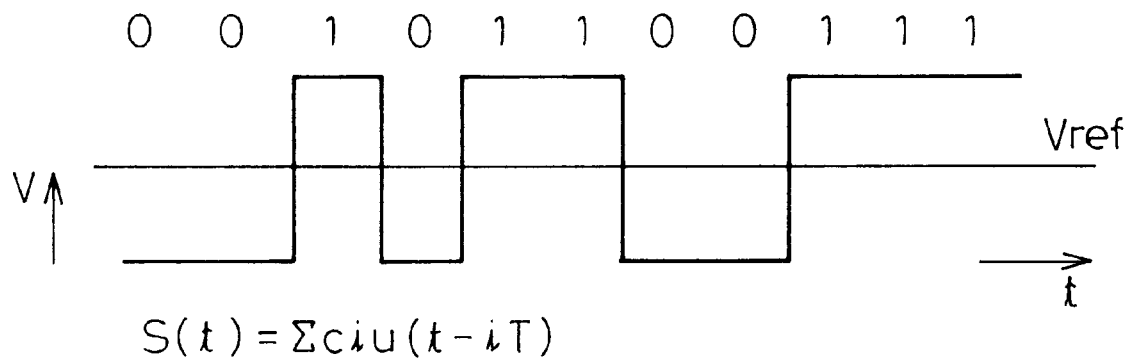
FIGS. 62A to 62D show the principle of the fourth aspect of the present invention.

A binary value b=0 or 1 is related to c=−1 or 1. In FIG. 62A, a transmission signal waveform corresponding to a given data sequence {bn} is expressed as follows with a data sequence {cn}:

$$s(t) = \Sigma c_i\, u(t-iT)$$

where s(t) is a value measured based on a reference potential Vref that is an intermediate value between low level L (0) and a high level H (1), and u(t) is a response to a virtual discrete pulse.

Figure 62B:
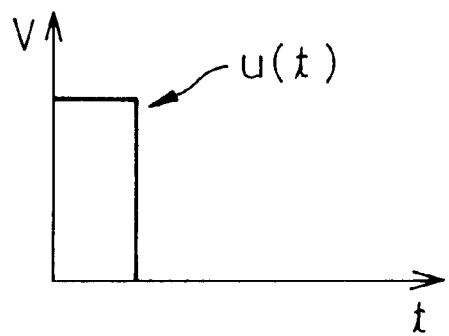
Figure 62C:
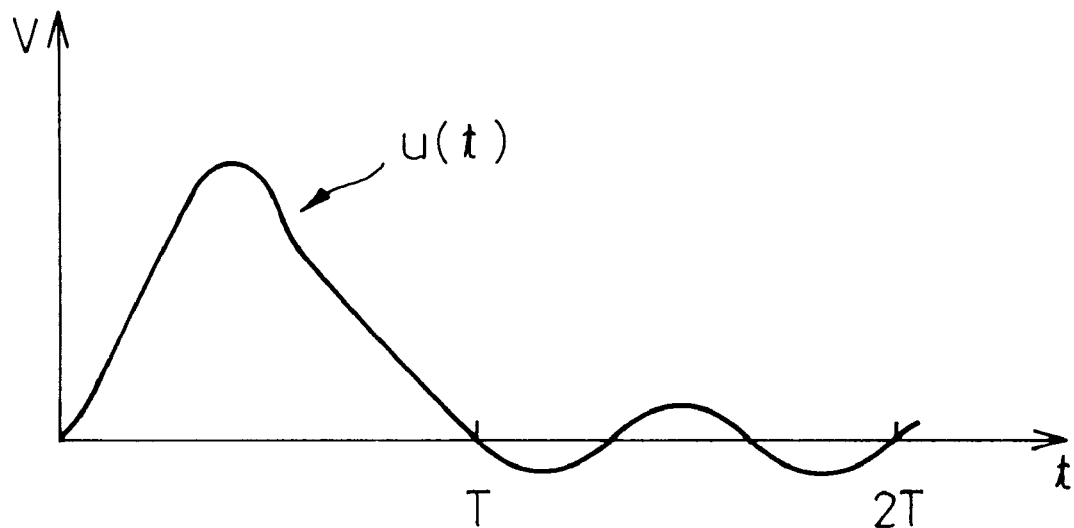

If an ideal transmission line is driven with a rise time of zero, the response u(t) will have a waveform of FIG. 62B. A rectangular wave contains many high-frequency components, and therefore, the signal s(t) contains many high-frequency components.

A technique of reducing the high-frequency components in the response u(t) is to increase the pulse width of the response u(t) as much as possible along the time t. Widening the pulse width reduces the high-frequency components.

Generally, a large pulse width increases interference between codes, and therefore, is not preferable. However, even if the pulse width of the response u(t) is increased to a maximum of 2T (T being a bit time, i.e., the length of a code), no interference will occur between adjacent bit periods if the values of u(t) at t=0 and t=2T are zeroed and if the determination of 0 or 1 is carried out at t=nT (n being an integer). Namely, to reduce high-frequency components, it is preferable to select the response u(t) as follows:

$$u(t) = 0\ (t=0,\ t=2T)$$
$$u(t) = U\max\ (t=T)$$

where Umax is a maximum value of u. A simplest example of this is a triangular wave shown in FIG. 62D.

Figure 62D:
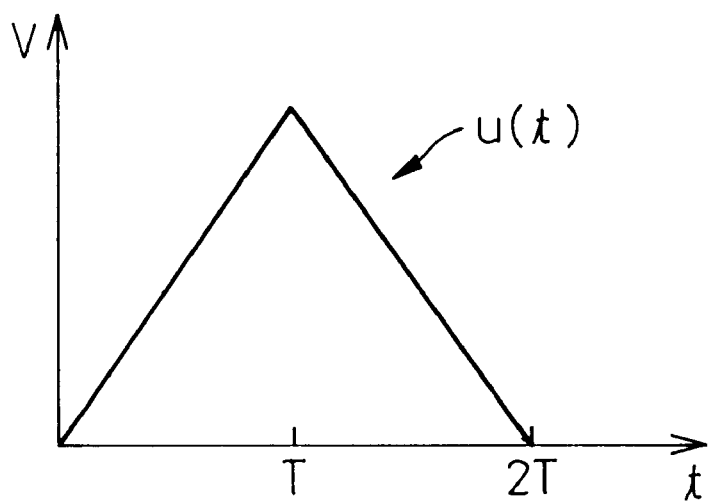

The triangular wave of FIG. 62D is obtained by integrating a given current. If a transmission signal represents 1 and if the value of the preceding bit time is 0, a positive current is integrated. If the is transmission signal represents 0 and if the value of the preceding bit time is 1, a negative current is integrated. If the transmission signal represents a value that is identical to the value of the preceding bit time, the current is zero.

Using such a waveform, the fourth aspect of the present invention increases a signal rise time to be equal to the bit time T. This minimizes an inductive voltage proportional to di/dt (current change ratio) and a capacitive current proportional to dv/dt (voltage change ratio), to prevent waveform disturbance and line-to-line interference due to high-frequency components contained in signals and to correctly transmit the signals at high speed.

The fourth aspect of the present invention sufficiently reduces inter-code interference, maximizes a signal rise time under a given bit time, minimizes high-frequency components contained in signals, prevents waveform disturbance or line-to-line interference due to parasitic inductance and capacitance, and Transmits the signals at high-speed.

Figure 63:
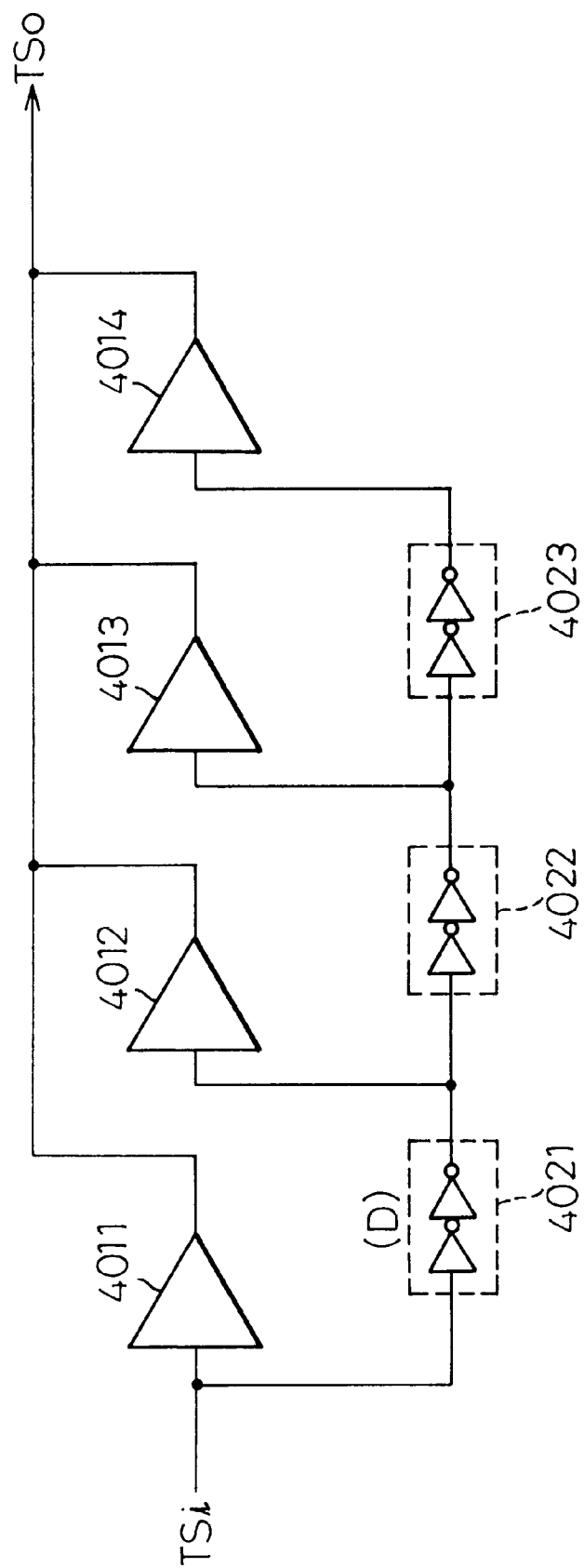
FIG. 63 shows a driver circuit according to a first embodiment of the fourth aspect of the present invention.

FIG. 63 shows a driver circuit according to the first embodiment of the fourth aspect of the present invention. The driver circuit has constant-current drivers 4011 to 4014 and delay stages (D) 4021 to 4023.

The driver 4011 directly receives an input signal TSi, the driver 4012 receives the signal TSi through the delay stage 4021, the driver 4013 receives the signal TSi through the delay stages 4021 and 4022, and the driver 4014 receives the signal TSi through the delay stages 4021 to 4023. Output terminals of the drivers 4011 to 4014 are connected together to provide an output signal TSo. Each of the delay stages 4021 to 4023 is made of, for example, an even number of series-connected inverters. The total delay time achieved by the delay stages 4021 to 4023 is set to be substantially equal to a bit time (the length of a code).

Figure 64:
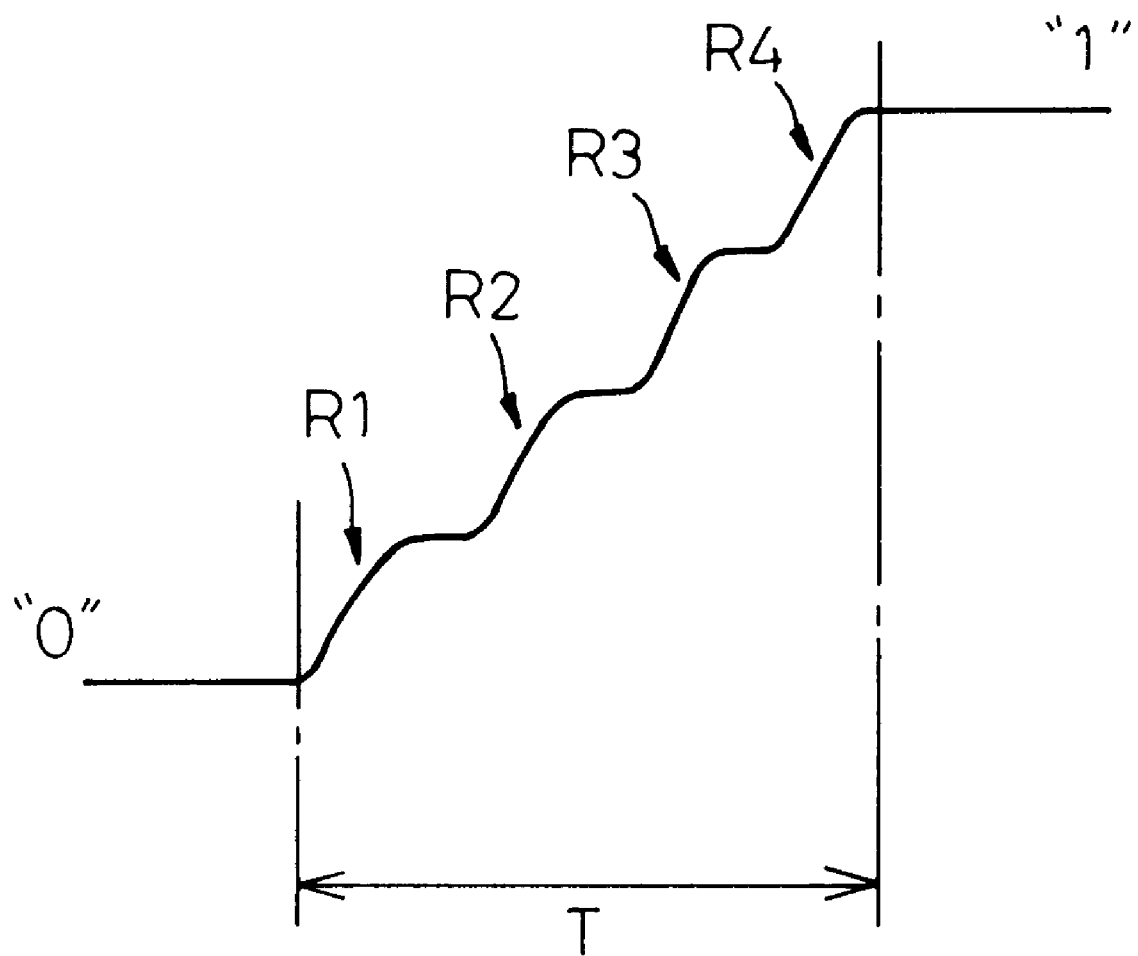
FIG. 64 shows the operation of the driver circuit of FIG. 63.

FIG. 64 shows the operation of the driver circuit of FIG. 63. R1 to R4 indicate rises in the waveform of the output signal TSo.

The rise R1 corresponds to a rise in the output of the driver 4011 that directly receives the input signal TSi. The rise R2 corresponds to a rise in the output of the driver 4012 that receives the signal TSi through the delay stage 4021. The rise R3 corresponds to a rise in the output of the driver 4013 that receives the signal TSi through the delay stages 4021 and 4022. The rise R4 corresponds to a rise in the output of the driver 4014 that receives the signal TSi through the delay stages 4021 to 4023. The total time the output signal TS0 needs when changing from 0 to 1 is substantially equal to a bit time T.

This drive circuit is capable of reducing high-frequency components from the signal TSo, thereby preventing waveform disturbance and line-to-line interference due to parasitic elements (such as the parasitic inductance elements 4131 to 4133 and parasitic capacitance elements 4141 to 4145 of FIG. 61).

Figure 65:
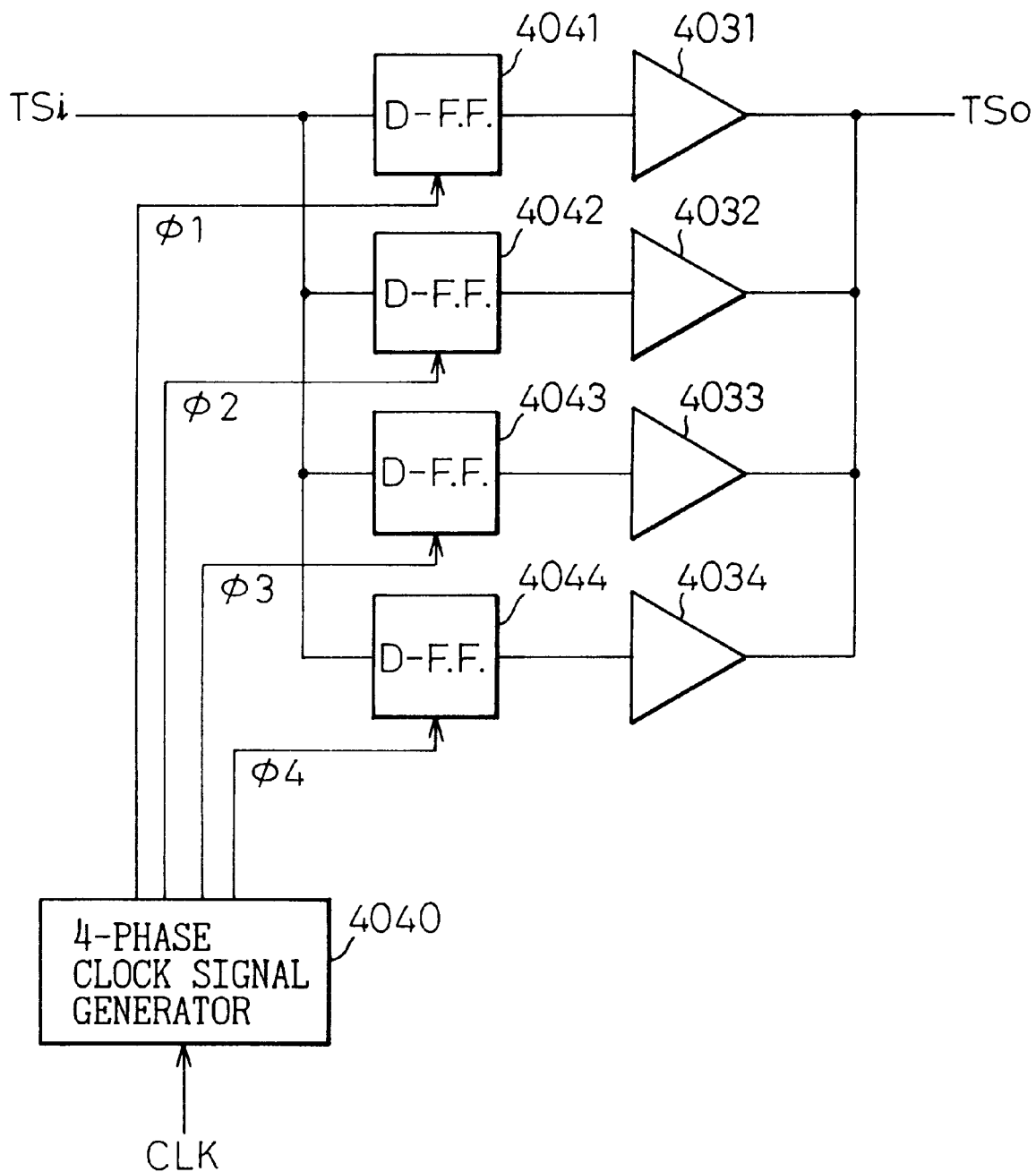
FIG. 65 shows a driver circuit according to a second embodiment of the fourth aspect of the present invention.
Figure 66:
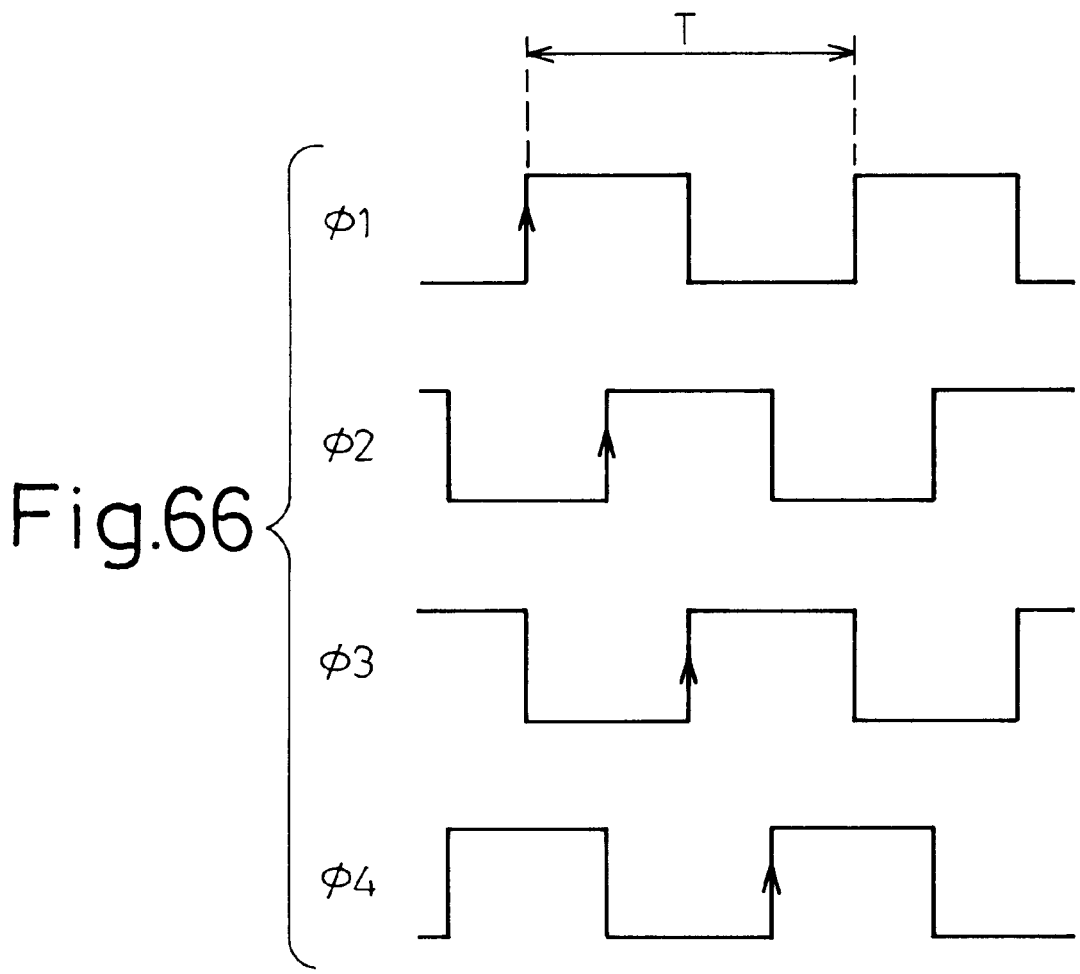
FIG. 66 shows the timing of four-phase clock signals used by the diver circuit of FIG. 65.

FIG. 65 shows a driver circuit according to the second embodiment of the fourth aspect of the present invention, and FIG. 66 shows examples of 4-phase clock signals used by the driver circuit of FIG. 65. The driver circuit has constant-current drivers; 4031 to 4034, a 4-phase clock generator 4040, and D-flip-flops 4041 to 4044.

In synchronization with a transmission clock signal CLK, the 4-phase clock generator 4040 generates clock signals $\phi 1$, $\phi 2$, $\phi 3$, and $\phi 4$ whose phases differ from one another by 90 degrees. These signals are supplied to the flip-flops 4041 to 4044, respectively, which fetch an input signal TSi in response to the timing (for example, rise timing) of the respective clock signals. The outputs of the flip-flops 4041 to 4044 are transferred to the drivers 4031 to 4034, respectively.

In place of the delay stages 4021 to 4023 of the first embodiment of FIG. 63, the second embodiment employs the 4-phase clock generator 4040 and controls the timing of fetching data (input signal TSi) by the flip-flops 4041 to 4044 according to the 4-phase clock signals that are synchronized with the clock signal CLK. The 4-phase clock generator 4040 may be formed with a known DLL circuit and be capable of correctly adjusting a delay time to a bit time (T) irrespective of manufacturing variations or chip temperatures. Here, the delay time controlled by the clock generator 4040 corresponds to the total delay time achieved by the delay units 4021 to 4023 of the first embodiment of FIG. 63. The second embodiment surely removes high-frequency components from signals irrespective of semiconductor manufacturing variations or chip temperature variations and prevents waveform disturbance or line-to-line interference due to parasitic elements. The number of the flip-flops 4041 to 4044 and the number of clock signals $\phi 1$ to $\phi 4$ for driving these flip-flops are not limited to each 4.

Figure 67:
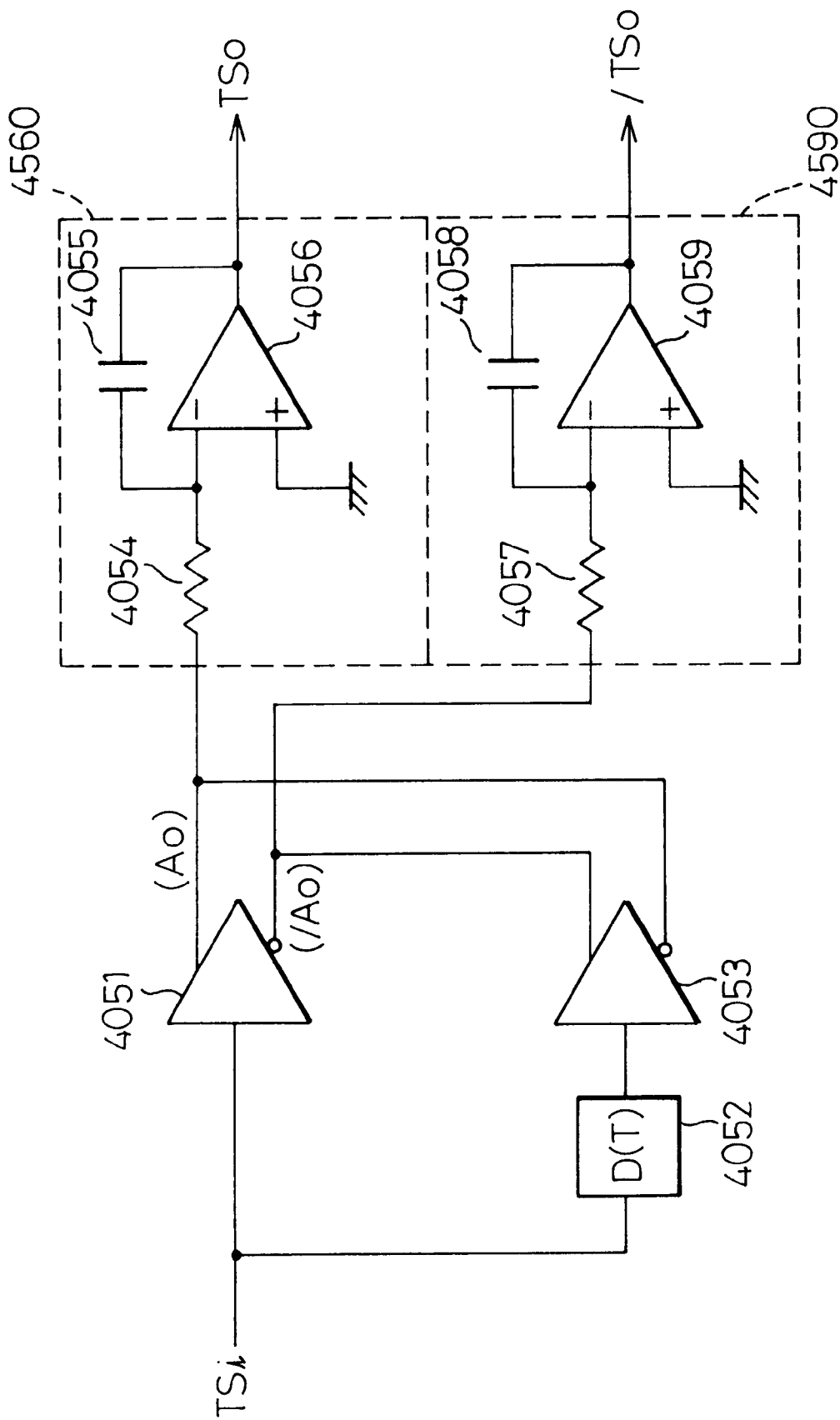
FIG. 67 shows a driver circuit according to a third embodiment of the fourth aspect of the present invention.

FIG. 67 shows a driver circuit according to the third embodiment of the fourth aspect of the present invention. The driver circuit consists of constant-current drivers (pre-drivers) 4051 and 4053 for providing complementary (differential) signals, a delay circuit 4052 for providing a delay of a bit time (I1), resistors 4054 and 4057, capacitors 4055 and 4058, and amplifiers 4056 and 4059. The resistor 4054, capacitor 4055, and amplifier 4056 form an integration circuit 4560, and the resistor 4057, capacitor 4058, and amplifier 4059 form an integration circuit 4590.

The driver circuit adds the complementary outputs of the pre-driver 4051 that directly receives an input signal TSi to the complementary outputs of the pre-driver 4053 that receives the input signal TSi delayed by 1-bit time T by the delay circuit 4052 in opposite polarities. The sums are integrated by the integration circuits 4560 and 4590, which provide complementary output signals TSo and /TSo to form a triangular unit pulse response.

The pre-drivers 4051 and 4053 provide constant net currents only when the code (0 or 1) of the preceding bit time and that of a present signal differ from each other. The pre-drivers 4051 and 4053 having opposite output polarities are used as a pair and are driven by first and second input data sequences, respectively, the second input data sequence being behind the first input data sequence by a bit time T.

The output impedance of the integration circuits 4560 and 4590 is adjusted to the characteristic impedance (for example, 50 ohms) of a signal transmission line, to reduce current consumption. Adjusting the output impedance of the integration circuits to the characteristic impedance of a signal transmission line is carried out by, for example, adjusting the sizes of transistors of the integration circuits.

Figure 68:
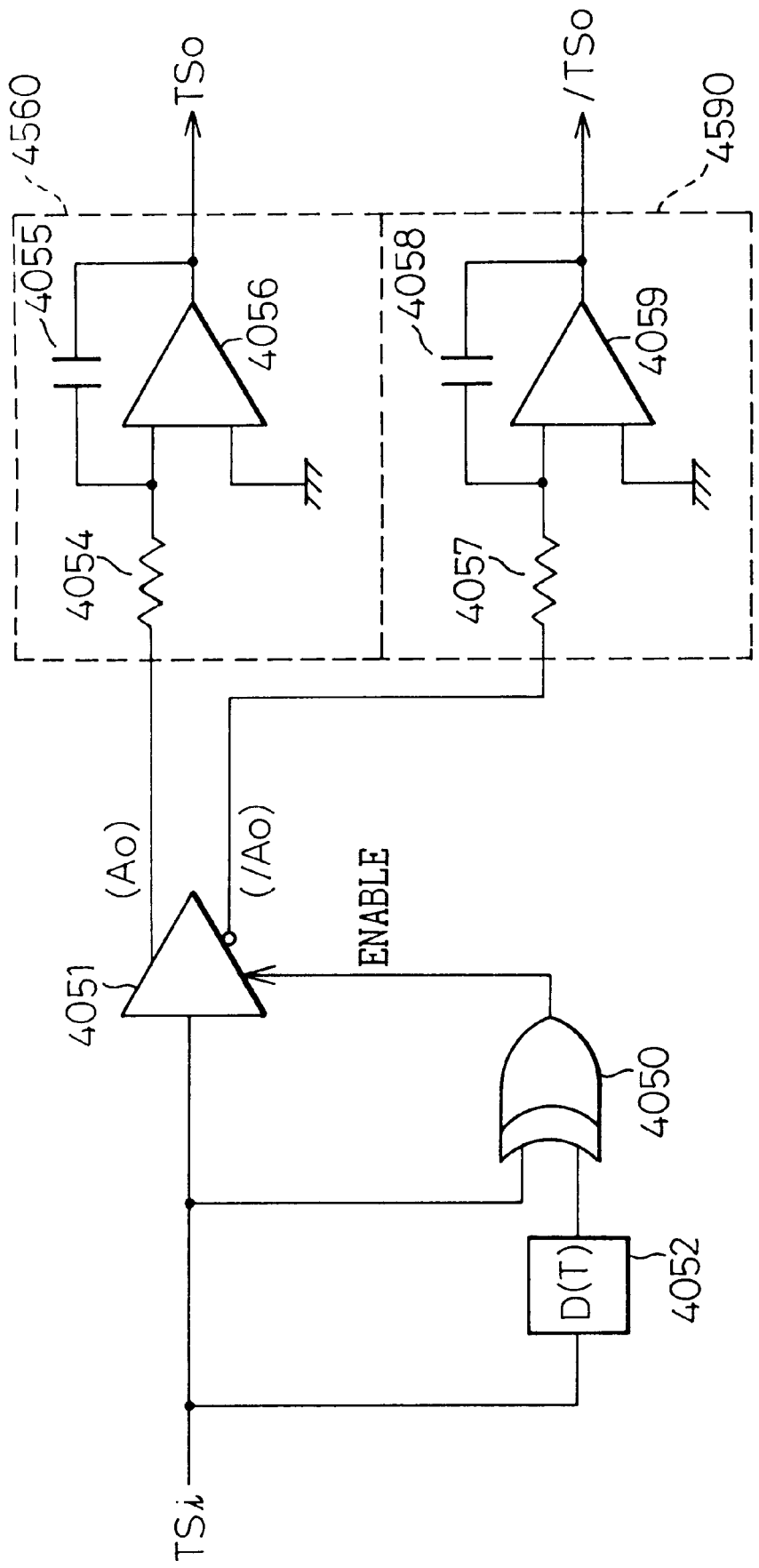
FIG. 68 shows a driver circuit according to a modification of the third embodiment of FIG. 67.

FIG. 68 shows a driver circuit according to a modification of the third embodiment of FIG. 67. In place of the pre-driver 4053 of FIG. 67, the modification employs an exclusive OR (EXOR) gate 4050 that receives an input signal TSi and the output of a delay circuit 4052 that delays the input signal TSi by a bit time T. The output of the EXOR gate 4050 enables or disables a pre-driver 4051.

The EXOR gate 4050 compares a present input data sequence with a preceding input data sequence that is behind the present input data sequence by a bit time T, and if they differ from each other, enables the pre-driver 4051 to pass a current. As a result, the modification lowers current consumption further than the third embodiment of FIG. 67.

Figure 69:
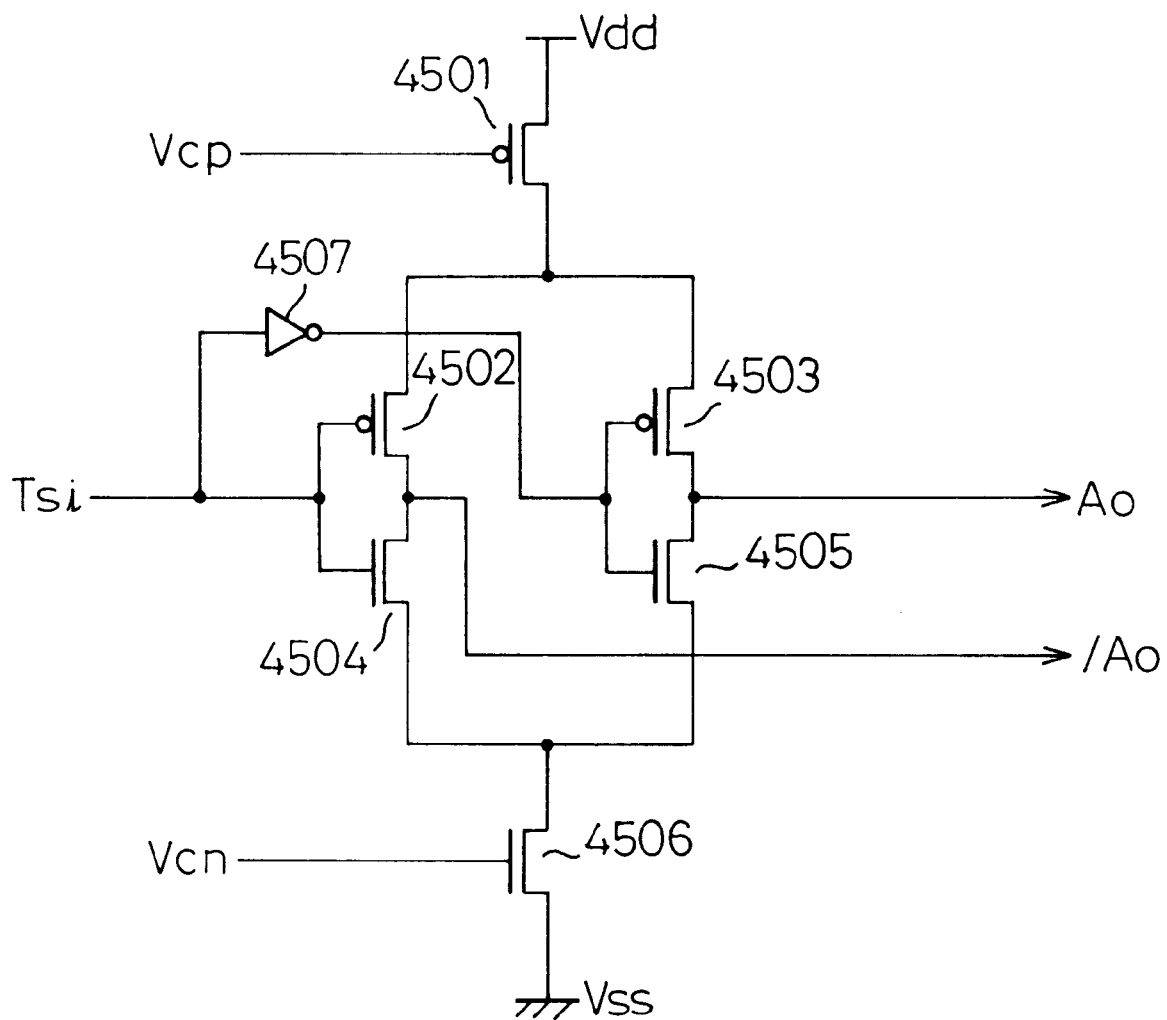
FIG. 69 shows a constant-current driver of the circuit of FIG. 68.

FIG. 69 shows an example of the constant-current driver 4051 (4053) of the driver circuits of FIGS. 67 and 68.

The constant-current driver (pre-driver) 4051 for generating complementary signals consists of PMOS transistors 4501 to 4503, NMOS transistors 4504 to 4506, and an inverter 4507. The transistors 4502 and 4504 form an inverter, and the transistors 4503 and 4505 form an inverter. These inverters receive an input signal TSi and an inversion thereof, respectively. The gates of the transistors 4501 and 4506 receive bias voltages Vcp and Vcn, respectively, and serve as current sources. The structure of the driver 4053 is the same as that of the driver 4051.

When the circuit of FIG. 69 is used as the pre-driver 4051 of FIG. 68, an enable signal from the EXOR gate 4050 is supplied to the gate of the transistor 4506 to activate the circuit if the enable signal is high. The structure of the pre-driver of FIG. 69 is only an example, and any other structure may be employable by the present invention.

Figure 70:
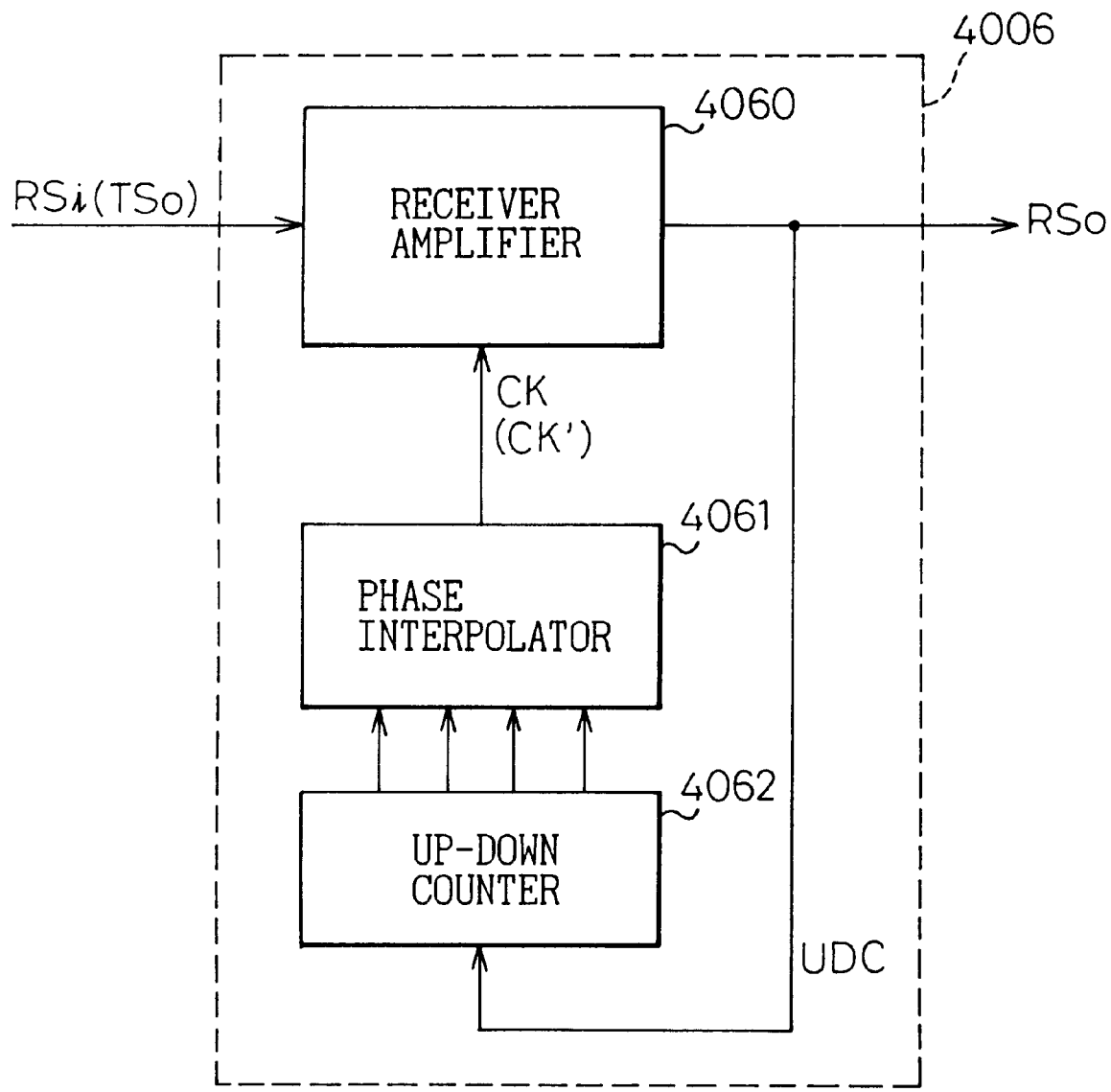
FIG. 70 shows a receiver circuit according to a fourth embodiment of the fourth aspect of the present invention.
Figure 71A:
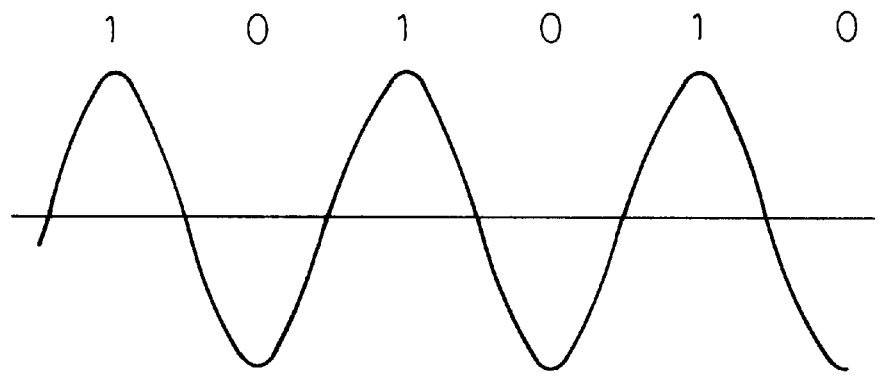
FIGS. 71A to 71C show the operation of the receiver circuit of FIG. 70.
Figure 71B:
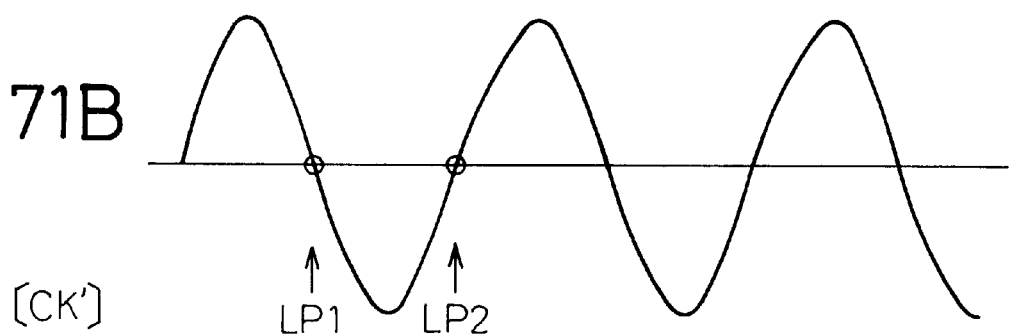
Figure 71C:
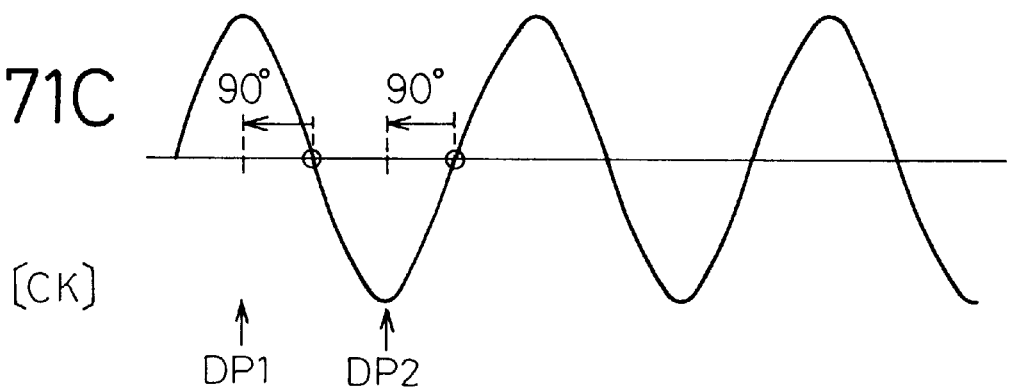

FIG. 70 shows a receiver circuit according to the fourth embodiment of the fourth aspect of the present invention, and FIGS. 71A to 71C explain the operation of the receiver circuit of FIG. 70. The receiver circuit 4006 has a receiver amplifier 4060, a phase interpolator 4061, and an up-down counter 4062.

The receiver amplifier 4060 receives, as an input signal RSi, an output signal TSo from a driver circuit through a signal transmission line. The input signal RSi is, at first, a data sequence consisting of alternating 0s and 1s as shown in FIG. 71A.

The receiver circuit 4006 receives the data sequence as a reference data sequence and locks timing LP1 at which the data changes from 1 to 0 and timing LP2 at which the data changes from 0 to 1 as shown in FIG. 71B. The receiver amplifier 4060 provides an up-down control signal UDC to the up-down counter 4062, and the output of the up-down counter 4062 controls the phase interpolator 4061. The phase interpolator 4061 provides a reception clock signal CK' synchronized with the timing of data change from 1 to 0 and 0 to 1. For example, the up-down control signal UDC delays the timing of the reception clock signal CK' if the signal received by the receiver amplifier 4060 is 0 to indicate that the reception timing is ahead, and advances the timing of the reception clock signal CK' if the signal received by the receiver amplifier 4060 is 1 to indicate that the reception timing is behind.

The above operation is repeated to provide the reception clock signal CK' of FIG. 71B to lock the reception timing (data fetching timing) of the receiver amplifier 4060 to the point LP1 where the received signal changes from 1 to 0 and to the point LP2 where the signal changes from 0 to 1. As shown in FIG. 71C, once the reception timing is locked, the phase of the reception clock signal CK' is shifted by about 90 degrees (for example, it is advanced by 90 degrees) to determine an actual reception clock signal CK. Reception timing DP1 and DP2 of the receiver circuit 4006 based on the reception clock signal CK correspond to the peak and bottom of a received signal, respectively.

Figure 72:
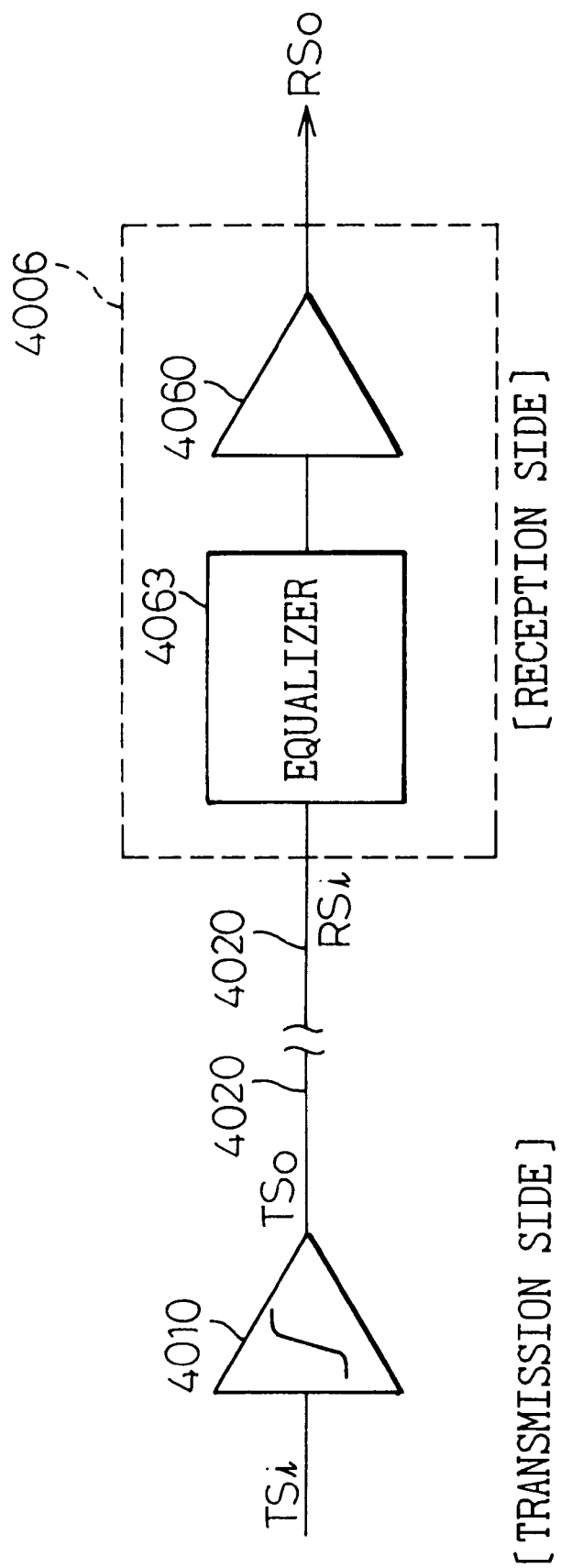
FIG. 72 shows a receiver circuit according to a fifth embodiment of the fourth aspect of the present invention.
Figure 73:
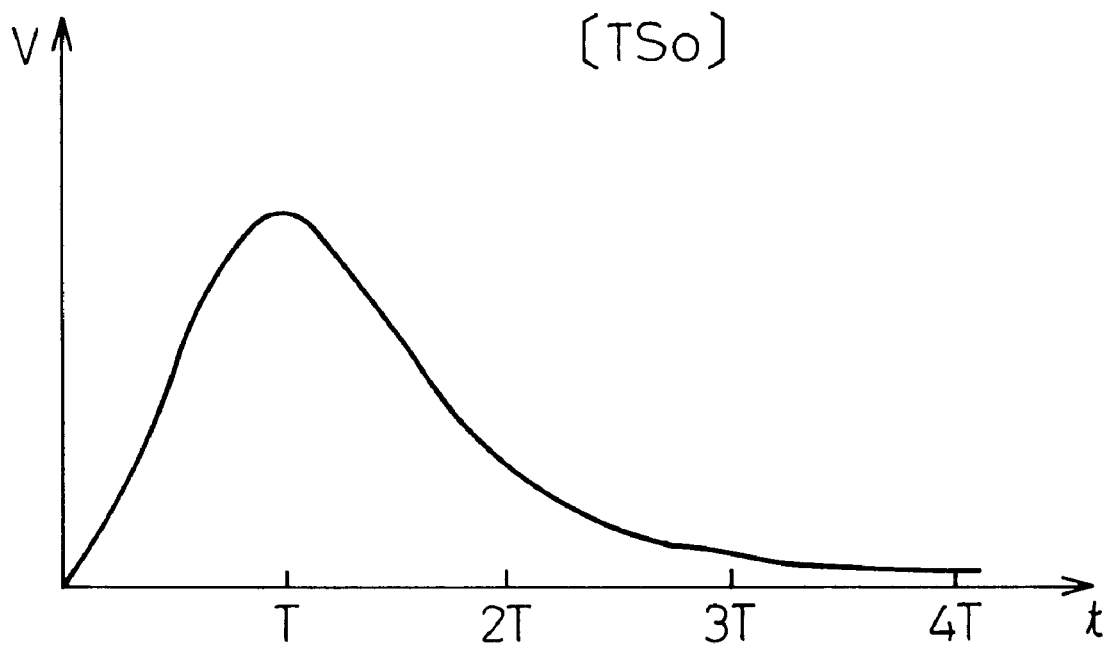
FIG. 73 shows the operation of the receiver circuit of FIG. 72.

In this way, the fourth embodiment is capable of determining optimum reception timing without regard to the delay characteristics of a signal transmission line or of a driver circuit, thereby transmitting signals at high speed and with a proper timing margin FIG. 72 shows a receiver circuit according to the fifth embodiment of the fourth aspect of the present invention, and FIG. 73 shows the operation thereof. The receiver circuit 4006 receives a signal from a waveform adjusting driver circuit 4010 through a signal transmission line (cable) 4020. The receiver circuit 4006 has an equalizer 4063 and a driver 4060.

The driver circuit 4010 controls an input signal TSi such that, for example, it rises to a maximum Amax within one bit time T and falls to about 30% of the maximum amplitude Amax within 2T, about 10% of the maximum amplitude Amax within 3T, and about 3% of the maximum amplitude Amax within 4T. The waveform adjusted signal TSo is supplied to the transmission line 4020 and to the receiver circuit 4006. The receiver circuit 4006 receives the transmitted signal RSi, and the equalizer 4063 compensates the characteristics such as attenuation characteristics of the transmission line 4020 for the signal RSi and supplies the compensated signal to the driver 4060. In this way, the fifth embodiment compensates high-frequency attenuation in the transmission line 4020 to realize long-distance transmission. The receiver circuit 4006 may be a PRD (partial response detector) circuit to be explained later.

Figure 74:
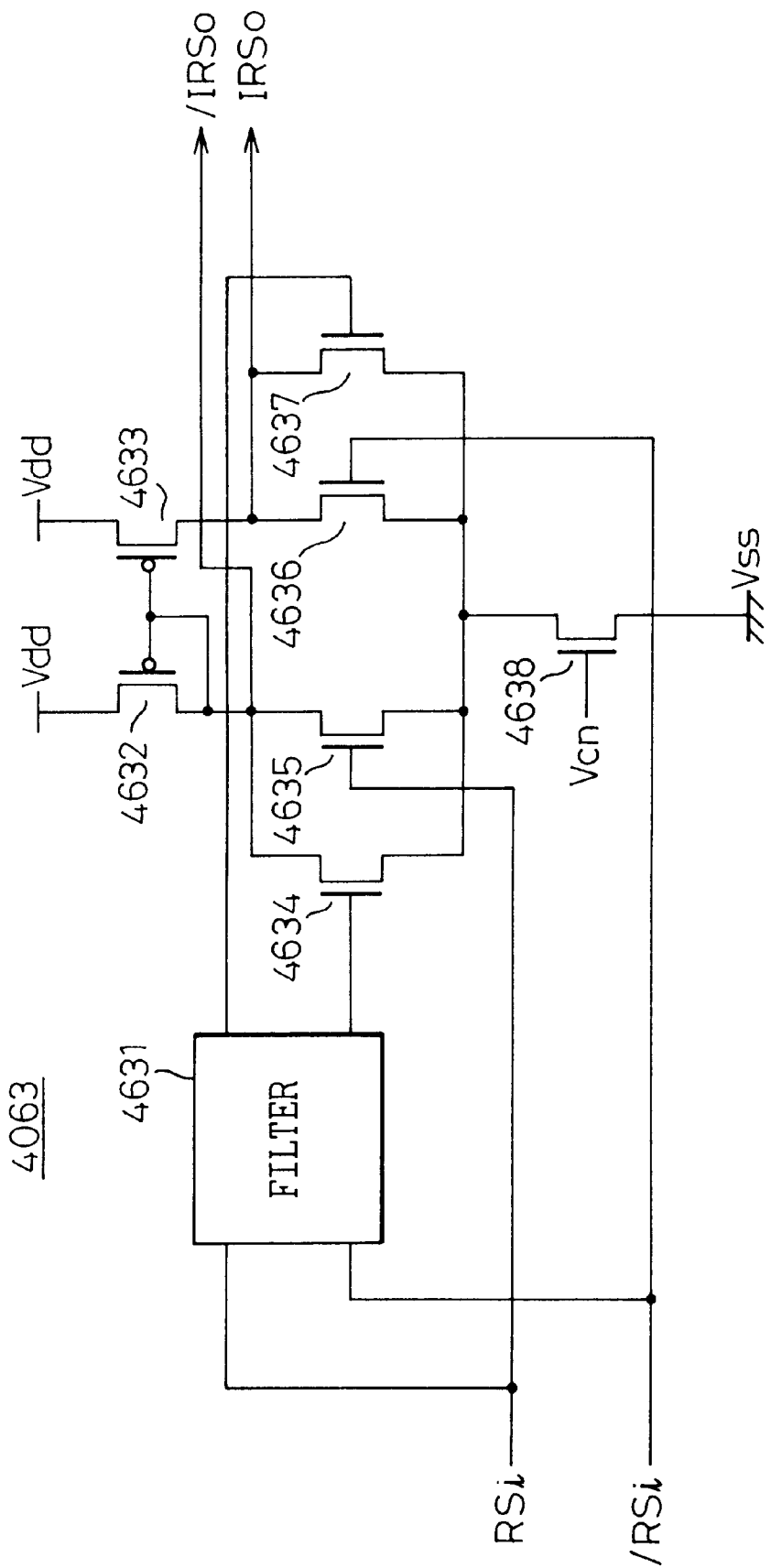
FIG. 74 shows an equalizer of the receiver circuit of FIG. 72.

FIG. 74 shows an example of the equalizer 4063 of FIG. 72. The equalizer 4063 receives differential input signals RSi and /RSi.

The equalizer 4063 consists of a filter 4631, PMOS transistors 4632 and 4633, and NMOS transistors 4634 to 4638. The differential signals (complementary signals) RSi and /RSi from the transmission line 4020 are directly supplied to the gates of the transistors 4635 and 4636 that form a first differential pair. At the same time, the signals RSi and /RSi are passed through the filter 4631 to the gates of the transistors 4634 and 4637 that form a second differential pair. The first and second differential pairs are in parallel with each-i other. The filter 4631 compensates for (emphasizes) the high-frequency components of the differential signals RSi and /RSi. Output signals IRSo and /IRSo from the equalizer 4063 are transferred to the amplifier 4060.

Figure 75:
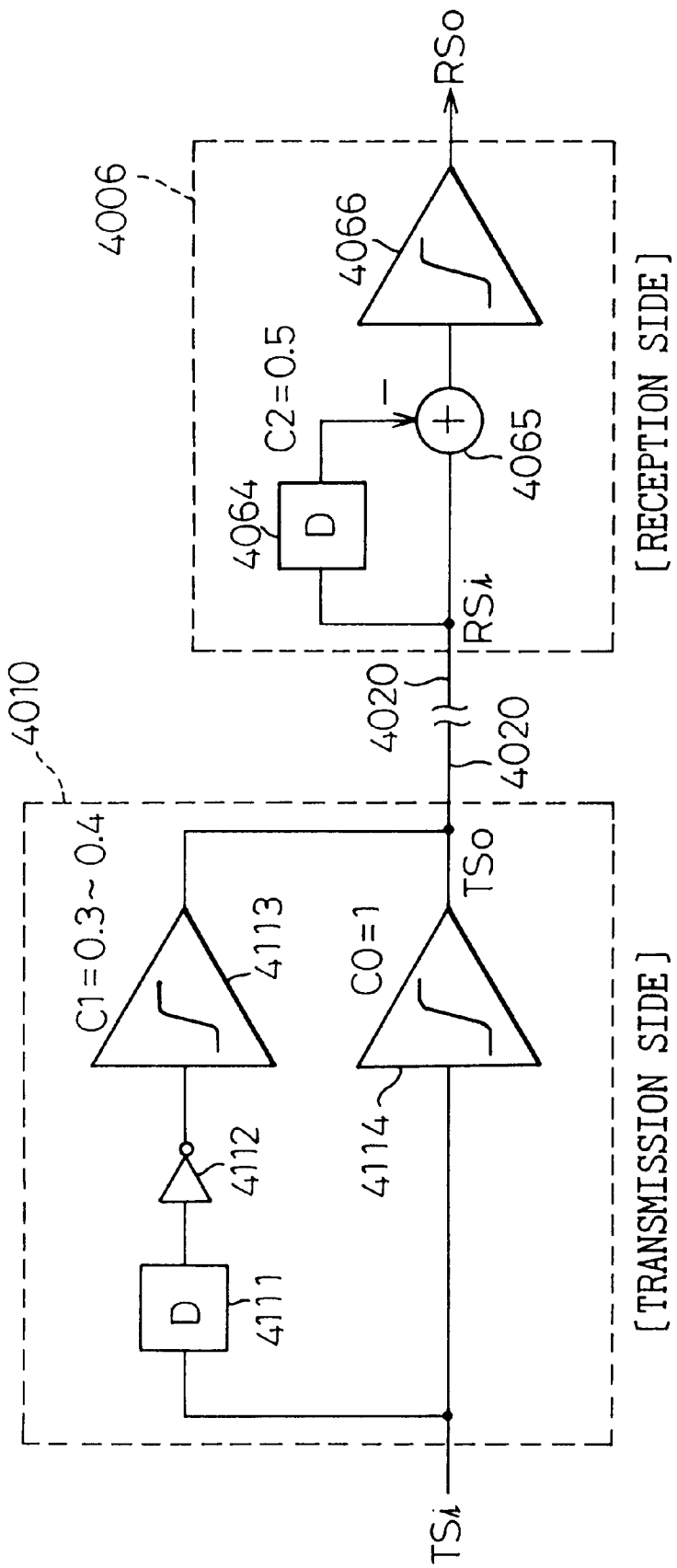
FIG. 75 shows a signal transmission system according to a sixth embodiment of the fourth aspect of the present invention.

FIG. 75 shows a signal transmission system according to the sixth embodiment of the fourth aspect of the present invention, and FIGS. 76A and 76B show the operation of a driver circuit of the system of FIG. 75.

The driver circuit 4010 consists of a delay circuit 4111, an inverter 4112, and driver amplifiers 4113 and 4114. A receiver circuit 4006 is a PRD consisting of a delay circuit 4064, an adder 4065, and a receiver amplifier 4066.

In the driver circuit 4010, an input signal TSi is directly supplied to the amplifier 4114 and is indirectly supplied to the amplifier 4113 through the delay circuit 4111, for providing a delay time of 1 bit time T and the inverter 4112. The amplifiers 4113 and 4114 have each a control circuit for controlling a rise time according to multiphase clock signals. The amplifier 4114 receives a normal sequence of signals, and the other amplifier 4113 receives a sequence of signals that has been delayed by 1 bit time T and inverted. The outputs of the amplifiers 4113 and 4114 are added to each other and the sum is supplied to a signal transmission line (cable) 4020.

The output of the amplifier 4113 is multiplied by C1 (for example, C1=0.3 to 0.4), and the output of the amplifier 4114 by C0 (C0=1). In FIG. 76A, the waveform of an output signal TSo of the driver circuit 4010 is emphasized in terms of amplitude at a position where a data sequence changes from 0 to 1, or from 1 to 0. When the signal TSo is transmitted to the receiver circuit 4006 through the transmission line 4020, the high-frequency components of the signal are attenuated due to the transmission characteristics of the transmission line 4020, and therefore, the transmitted signal shows an ideal waveform of FIG. 76B. The receiver circuit 4006 is a PRD that multiplies a signal voltage in a given bit time by C2 (for example, C2=0.5) and subtracts the product from a signal voltage received in the next bit time.

The value of C1 is adjusted so that no overshoot occurs on a received signal. The adjustment of C1 is carried out by sending a reference signal before actual signal transmission. The value of C2 is set, in advance, as large as the sensitivity of the reception circuit 4006 allows.

In this way, the sixth embodiment employs the transmission and reception equalizers to extend transmission distance.

An example employing a PRD complementary differential amplifier as the receiver circuit 4006 according to the sixth embodiment will be explained.

Figure 78:
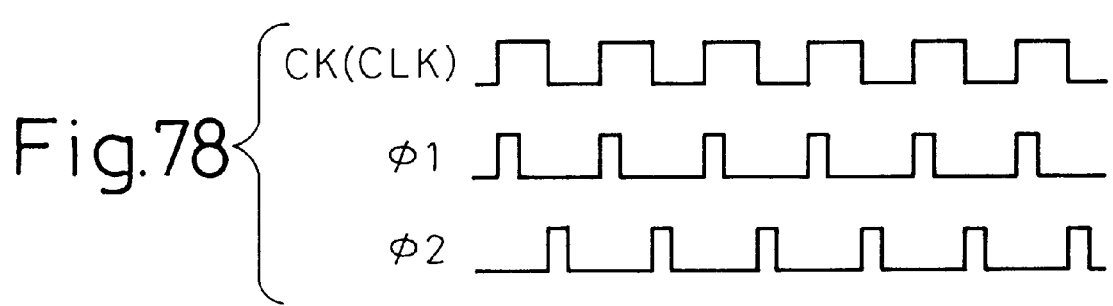
FIG. 78 shows the timing of control signals used by the receiver circuit of FIG. 77.

FIG. 77 shows the receiver circuit 41006 applicable to the signal transmission system of FIG. !5. The receiver circuit 4006 is the PRD complementary differential amplifier. FIG. 78 shows the timing of control signals used by the receiver circuit of FIG. 77.

The receiver circuit 4006 has a PRD function unit 4601 having capacitors C10$a$, C20$a$, C10$b$, and C20$b$ and transfer gates 4611 to 4614. The PRD function unit 4601 is connected to a precharge circuit 4602, which operates for a differential amplifier 4603. The switching of the transfer gates 4611 and 4614 is controlled by control signals $\phi 2$ and /$\phi 2$, and the switching of the transfer gates 4612 and 4613 is controlled by control signals $\phi 1$ and /$\phi 1$. Here, the signals /$\phi 1$ and /$\phi 2$ are logical inversions of the signals $\phi 1$ and $\phi 2$. The timing of the control signals $\phi 1$ and $\phi 2$ with respect to a clock signal CK (CLK) is shown in FIG. 78.

The capacitors C10$a$ and C10$b$ have each a capacitance of C10, and the capacitors C20$a$ and C20$b$ have each a capacitance of C20. Inter-code interference will be completely removed, in theory, if the capacitance values C10 and C20 satisfy the following:

$$C10/(C10+C20)=(1+\exp(-To/\tau))/2$$

where $\tau$ is the time constant of the transmission line 4020, etc., and To is a bit period in which data for one bit appears on a bus. This expression is, however, for ideal conditions. In practice, there are parasitic capacitance elements, and therefore, an approximate capacitance ratio is employed for the above expression.

Figure 79A:
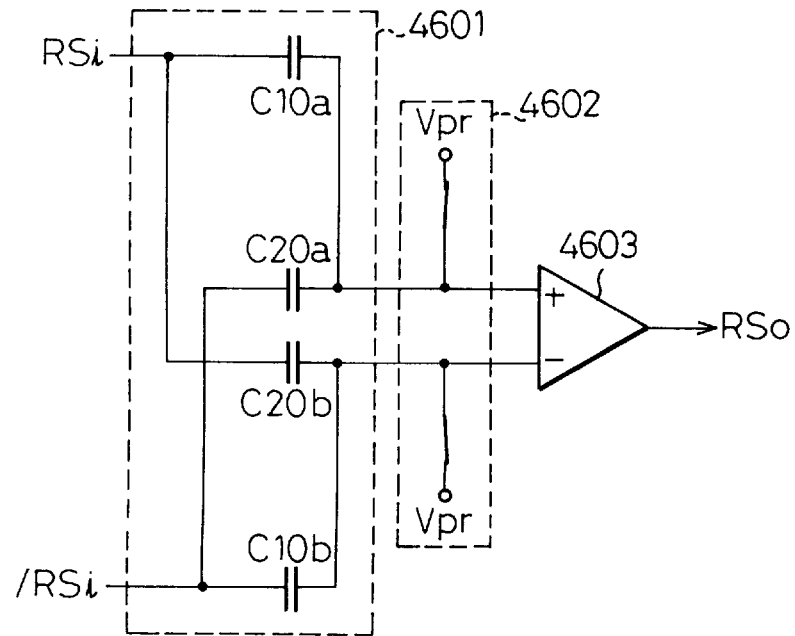
FIGS. 79A and 79B show the operation of the receiver circuit of FIG. 77.
Figure 79B:
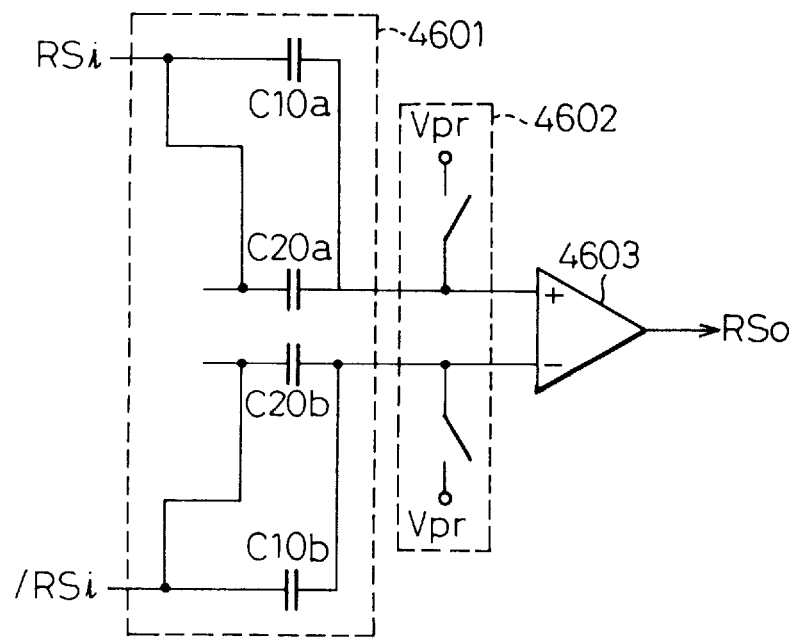

FIGS. 79A and 79B show the operator of the receiver circuit of FIG. 77.

The receiver circuit 4006 controls the control signals $\phi 1$ and $\phi 2$ to alternate the operations of FIGS. 79A and 79B.

If the control signal $\phi 1$ is high (/$\phi 1$ being low) and the control signal $\phi 2$ low (/$\phi 2$ being high), an operation of FIG. 79A for removing (estimating) inter-code-interference components is carried out. If the control signal $\phi 1$ is low and the control signal $\phi 2$ high, a signal determination operation of FIG. 79B is carried out. The precharge circuit 4602 precharges input nodes of the differential amplifier 4603 while the operation of FIG. 79A is being carried out.

In this way, the sixth embodiment carries out both the waveform adjusting operation on the transmission side and the PRD operation on the reception side, to remove (estimate) inter-code interference from a transmission line. The sixth embodiment is capable of transmitting signals at high speed even through a cable with thin core wires, or a long cable.

As explained above, the fourth aspect of the present invention is capable of minimizing high-frequency components in signals, to minimize waveform disturbance due to parasitic elements and line-to-line interference, thereby realizing high-speed signal transmission.

The driver circuits, receiver circuits, signal transmission systems, and signal transmission techniques of the fourth aspect of the present invention are applicable to signal transmission not only between a server and a main storage device, between servers connected to each other through a network, between apparatuses, and between circuit boards but also between chips and between elements and circuit blocks in a chip.

As explained above in detail, the fourth aspect of the present invention prevents waveform disturbance and line-to-line interference due to high-frequency components contained in signals and realizes high-precision, high-speed signal transmission.

Many different embodiments of the present invention may be constructed without departing from the spirit and scope of the present invention and it should be understood that the present invention is not limited to the specific embodiments described in this specification, except as defined in the appended claims.

What is claimed is:

1. A driver circuit for transmitting digital signals, comprising:

an output driver;

a front driver for driving said output driver; and a level adjuster for adjusting the output level of said front driver, so that said output driver outputs a signal having a specific level varied in response to an output level of said front driver.

2. A driver circuit as claimed in claim 1, wherein said output driver includes a drain-grounded push-pull structure employing p-channel and n-channel MOS transistors.

3. A driver circuit as claimed in claim 1, wherein said output driver is a voltage amplifier circuit whose output level is varied by adjusting an output voltage level of said front driver.

4. A driver circuit as claimed in claim 1, wherein said output driver is a current-voltage converter circuit whose output voltage level is varied by adjusting an output current level of said front driver.

5. A driver circuit as claimed in claim 1, wherein said output driver includes a feedback circuit for dropping output impedance.

6. A driver circuit as claimed in claim 1, wherein said front driver includes:

a variable gain unit cooperating with said level adjuster, to adjust a level of an input signal level; and an amplifier for amplifying the level-adjusted input signal.

7. A driver circuit as claimed in claim 1, wherein said front driver is a current limiting inverter for receiving an input signal, an output level of said current limiting inverter being adjusted by controlling a current passed thereto by said level adjuster.

8. A driver circuit as claimed in claim 1, wherein an output of said output driver is changed in response to a sequence of past digital values, to equalize characteristics of a transmission line.

9. A driver circuit as claimed in claim 8, wherein the characteristics of said transmission line are equalized by compensating attenuation in high-frequency components in signals that are provided by said output driver and are transmitted through said transmission line.

10. A driver circuit as claimed in claim 1, wherein said front driver comprises a plurality of drivers that are commonly connected to said output driver, the drivers of said front driver receiving data generated from a sequence of past digital data provided by said output driver and equalizing characteristics of a transmission line.

11. A driver circuit as claimed in claim 10, wherein the drivers of said front driver have respective coefficients, multiply received data by the coefficients, and supply products to said output driver.

12. A driver circuit as claimed in claim 10, wherein the characteristics of said transmission line are equalized by compensating attenuation in high-frequency components in signals that are provided by said output driver and are transmitted through said transmission line.

13. A driver circuit as claimed in claim 1, wherein said front driver comprises first and second drivers, a digital input signal to the driver circuit being directly supplied to the first driver of said front driver, and at the same time, being delayed by a bit time, inverted, and supplied to the second driver of said front driver, thereby equalizing characteristics of a transmission line.

14. A driver circuit as claimed in claim 13, wherein:
   the first and second drivers of said front driver are arranged in parallel with each other;
   the second driver of said front driver multiplies the delayed and inverted signal by a coefficient; and
   the outputs of the first and second drivers of said front driver are added to each other to drive said output driver.

15. A driver circuit as claimed in claim 13, wherein the characteristics of said transmission line are equalized by compensating for attenuation in high-frequency components in signals that are provided by said output driver and are transmitted through said transmission line.

16. A driver circuit as claimed in claim 1, wherein said front driver comprises a plurality of driver pairs, said driver pairs of said front driver being interleaved to carry out parallel-to-serial conversion.

17. A driver circuit as claimed in claim 1, wherein said output driver includes a source-grounded push-pull structure employing p-channel and n-channel MOS transistors.

18. A driver circuit as claimed in claim 17, wherein a gate voltage of the p-channel MO3 transistor of said output driver is set above an intermediate voltage, which is between a high source voltage and a low source voltage, and a gate voltage of the n-channel MOS transistor of said output driver is set below the intermediate voltage when said output driver provides the intermediate voltage.

19. A driver circuit as claimed in claim 17, wherein the gate of said n-channel MOS transistor is driven by a drain-grounded n-channel MOS circuit and the gate of said p-channel MOS transistor is driven by a drain-grounded p-channel MOS circuit.

20. A driver circuit as claimed in claim 17, wherein said output driver is driven by a voltage that is lower than the high source voltage by a predetermined value and a voltage that is higher than the low source voltage by a predetermined value.

21. A driver circuit as claimed in claim 20, wherein said output driver includes a replica driver that equalizes an intermediate voltage between voltages for driving said output driver to an intermediate voltage between the high source voltage and the low source voltage.

22. A driver circuit for transmitting a signal, comprising:
   a code length controller for making a sum of a rise time and a fall time of each code contained in a signal to be transmitted equal to or longer than a bit time.

23. A driver circuit as claimed in claim 22, wherein said code length controller includes:
   a multiphase clock generator for generating multiphase clock signals that are synchronized with a transmission clock signal; and
   a plurality of unit drivers sequentially driven in response to the multiphase clock signals.

24. A driver circuit as claimed in claim 22, wherein said code length controller includes:
   a plurality of constant-current output drivers driven by a first binary signal to be transmitted and a second binary signal formed by delaying the first binary signal by a bit time or an integer multiple of the bit time;
   a current sum generator for combining outputs of said constant-current drivers to provide a current sum of said constant-current drivers; and
   an integration circuit for integrating the current sum to provide a voltage.

* * * * *

UNITED STATES PATENT AND TRADEMARK OFFICE
CERTIFICATE OF CORRECTION

PATENT NO. : 6,166,971
DATED : December 26, 2000
INVENTOR(S) : Tamura et al.

It is certified that error appears in the above-identified patent and that said Letters Patent is hereby corrected as shown below:

Column 38,
Line 23, please amend claim 1 as follows: after "a" insert -- digital --.

Signed and Sealed this

Fifth Day of July, 2005

JON W. DUDAS
*Director of the United States Patent and Trademark Office*